United States Patent
Far

(10) Patent No.: US 10,819,283 B1
(45) Date of Patent: Oct. 27, 2020

(54) CURRENT-MODE ANALOG MULTIPLIERS USING SUBSTRATE BIPOLAR TRANSISTORS IN CMOS FOR ARTIFICIAL INTELLIGENCE

(71) Applicant: Ali Tasdighi Far, San Jose, CA (US)

(72) Inventor: Ali Tasdighi Far, San Jose, CA (US)

( * ) Notice: Subject to any disclaimer, the term of this patent is extended or adjusted under 35 U.S.C. 154(b) by 0 days.

(21) Appl. No.: 16/730,214

(22) Filed: Dec. 30, 2019

Related U.S. Application Data

(60) Provisional application No. 62/862,772, filed on Jun. 18, 2019, provisional application No. 62/856,889, filed on Jun. 4, 2019, provisional application No. 62/880,885, filed on Jul. 31, 2019, provisional application No. 62/912,407, filed on Oct. 8, 2019, provisional application No. 62/865,845, filed on Jun. 24, 2019.

(51) Int. Cl.
*H03M 1/00* (2006.01)
*H03D 7/14* (2006.01)

(52) U.S. Cl.
CPC ......... *H03D 7/1441* (2013.01); *H03D 7/1458* (2013.01); *H03D 7/1491* (2013.01); *H03D 2200/007* (2013.01)

(58) Field of Classification Search
CPC .. H03D 7/1441; H03D 7/1458; H03D 7/1491; H03D 2200/007; H03M 1/66; H03M 1/68; H03M 2201/814
USPC ......................................................... 341/136
See application file for complete search history.

(56) References Cited

U.S. PATENT DOCUMENTS

| | | |
|---|---|---|
| 3,013,724 A | 12/1961 | Thompson et al. |
| 3,084,862 A | 4/1963 | Nathan |
| 3,102,951 A | 9/1963 | Nathan |
| 3,106,639 A | 10/1963 | Nathan |
| 3,120,605 A | 2/1964 | Nathan et al. |
| 3,197,626 A | 7/1965 | Platzer et al. |
| 3,261,971 A | 7/1966 | Nathan |
| 3,296,429 A | 1/1967 | Nathan |
| 3,304,419 A | 2/1967 | Huntley, Jr. et al. |
| 3,536,904 A | 10/1970 | Jordan, Jr. et al. |
| 3,562,553 A | 2/1971 | Roth |
| 3,621,226 A | 11/1971 | Wittlinger |

(Continued)

OTHER PUBLICATIONS

A. Far, "Small size class AB amplifier for energy harvesting with ultra low power, high gain, and high CMRR," 2016 IEEE International Autumn Meeting on Power, Electronics and Computing (ROPEC), Ixtapa, 2016, pp. 1-5.

(Continued)

*Primary Examiner* — Jean B Jeanglaude

(57) ABSTRACT

Analog multipliers can perform signal processing with approximate precision asynchronously (clock free) and with low power consumptions, which can be advantageous including in emerging mobile and portable artificial intelligence (AI) and machine learning (ML) applications near or at the edge and or near sensors. Based on low cost, mainstream, and purely digital Complementary-Metal-Oxide-Semiconductor (CMOS) manufacturing process, the present invention discloses embodiments of current-mode analog multipliers that can be utilized in multiply-accumulate (MAC) signal processing in end-application that require low cost, low power consumption, (clock free) and asynchronous operations.

10 Claims, 22 Drawing Sheets

(56) References Cited

U.S. PATENT DOCUMENTS

| | | | |
|---|---|---|---|
| 3,633,005 A | 1/1972 | Leighton | |
| 3,683,165 A | 8/1972 | Grobert et al. | |
| 3,689,752 A | 9/1972 | Gilbert | |
| 3,838,262 A | 9/1974 | Van De Plassche | |
| 3,956,643 A | 5/1976 | Hite | |
| 4,001,602 A | 1/1977 | Birchenough | |
| 4,004,141 A | 1/1977 | Curtis | |
| 4,071,777 A | 1/1978 | Herrmann | |
| 4,156,283 A | 5/1979 | Gilbert | |
| 4,308,471 A | 12/1981 | Misawa | |
| 4,353,000 A | 10/1982 | Noda | |
| 4,387,439 A | 6/1983 | Lin | |
| 4,482,977 A | 11/1984 | Ross | |
| 4,546,275 A | 10/1985 | Pena-Finol et al. | |
| 4,572,975 A | 2/1986 | Bowers | |
| 4,586,155 A | 4/1986 | Gilbert | |
| 4,677,369 A | 6/1987 | Bowers et al. | |
| 4,827,260 A | 5/1989 | Sugawa et al. | |
| 4,999,521 A | 3/1991 | Rusznyak | |
| 5,107,150 A | 4/1992 | Kimura | |
| 5,122,687 A | 6/1992 | Schmidt | |
| 5,157,350 A | 10/1992 | Rubens | |
| 5,254,889 A | 10/1993 | Han | |
| 5,283,579 A | 2/1994 | Tasdighi | |
| 5,294,927 A | 3/1994 | Levinson et al. | |
| 5,381,352 A | 1/1995 | Shou et al. | |
| 5,389,840 A | 2/1995 | Dow | |
| 5,495,245 A | 2/1996 | Ashe | |
| 5,619,444 A | 4/1997 | Agranat et al. | |
| 5,640,084 A | 6/1997 | Tero et al. | |
| 5,668,710 A | 9/1997 | Caliboso et al. | |
| 5,703,588 A | 12/1997 | Rivoir et al. | |
| 5,734,260 A | 3/1998 | Tasdighi et al. | |
| 5,734,291 A | 3/1998 | Tasdighi et al. | |
| 5,760,726 A | 6/1998 | Koifman et al. | |
| 5,801,655 A | 9/1998 | Imamura | |
| 5,805,007 A | 9/1998 | Colli | |
| 5,814,995 A | 9/1998 | Tasdighi | |
| 5,831,566 A | 11/1998 | Ginetti | |
| 5,870,049 A | 2/1999 | Huang et al. | |
| 5,912,834 A | 6/1999 | Kimura | |
| 5,923,208 A | 7/1999 | Tasdighi et al. | |
| 5,969,658 A | 10/1999 | Naylor | |
| 6,005,374 A | 12/1999 | Tasdighi | |
| 6,052,074 A | 4/2000 | Iida | |
| 6,054,823 A | 4/2000 | Collings et al. | |
| 6,072,415 A | 6/2000 | Cheng | |
| 6,122,284 A | 9/2000 | Tasdighi et al. | |
| 6,225,929 B1 | 5/2001 | Beck | |
| 6,243,033 B1 | 6/2001 | Mizuno | |
| 6,384,763 B1 | 5/2002 | Leung et al. | |
| 6,392,574 B1 | 5/2002 | Toosky | |
| 6,424,283 B2 | 7/2002 | Bugeja et al. | |
| 6,489,905 B1 | 12/2002 | Lee et al. | |
| 6,507,304 B1 | 1/2003 | Lorenz | |
| 6,542,098 B1 | 4/2003 | Casper et al. | |
| 6,583,744 B2 | 6/2003 | Bright | |
| 6,982,588 B1 | 1/2006 | Lin et al. | |
| 7,024,448 B2 | 4/2006 | Matsugaki et al. | |
| 7,136,002 B2 | 11/2006 | Dempsey et al. | |
| 7,197,292 B1 | 3/2007 | Kouwenhoven et al. | |
| 7,312,740 B2 | 12/2007 | Chou | |
| 7,702,716 B2 | 4/2010 | Rösener | |
| 8,610,486 B1 | 12/2013 | Al-Absi et al. | |
| 9,069,995 B1 | 6/2015 | Cronie | |
| 9,519,304 B1* | 12/2016 | Far | G05F 3/262 |
| 9,780,652 B1 | 10/2017 | Far | |
| 9,793,912 B1 | 10/2017 | Ferris et al. | |
| 9,921,600 B1 | 3/2018 | Far | |
| 10,177,713 B1 | 1/2019 | Far | |
| 10,198,022 B1 | 2/2019 | Far | |
| 10,411,597 B1* | 9/2019 | Far | H02M 3/158 |
| 10,423,175 B2* | 9/2019 | Chang | G05F 3/242 |
| 10,491,167 B1 | 11/2019 | Far | |
| 10,536,117 B1 | 1/2020 | Far | |
| 2001/0026236 A1 | 10/2001 | Toda | |
| 2003/0184338 A1 | 10/2003 | Comer et al. | |
| 2004/0183706 A1 | 9/2004 | Brauns et al. | |
| 2006/0170580 A1 | 8/2006 | Lauritzen et al. | |
| 2008/0036523 A1 | 2/2008 | Nijrolder | |
| 2009/0045993 A1 | 2/2009 | Tokumaru et al. | |
| 2009/0184855 A1 | 7/2009 | Tokumaru et al. | |
| 2010/0072821 A1 | 3/2010 | Ramaguchi et al. | |
| 2010/0283642 A1 | 11/2010 | Lai et al. | |
| 2014/0043087 A1 | 2/2014 | Li et al. | |
| 2015/0091784 A1 | 4/2015 | Kwon et al. | |
| 2015/0123724 A1 | 5/2015 | Al-Absi et al. | |
| 2016/0238464 A1* | 8/2016 | Eberlein | G01K 15/005 |
| 2016/0248437 A1 | 8/2016 | Zhang et al. | |

OTHER PUBLICATIONS

A. Far, "Compact ultra low power class AB buffer amplifier," 2017 IEEE International Autumn Meeting on Power, Electronics and Computing (ROPEC), Ixtapa, 2017, pp. 1-6.

A. Far, "Subthreshold current reference suitable for energy harvesting: 20ppm/C and 0.1%/V at 140nW," 2015 IEEE International Autumn Meeting on Power, Electronics and Computing (ROPEC), Ixtapa, 2015, pp. 1-4.

A. Far, "Amplifier for energy harvesting: Low voltage, ultra low current, rail-to-rail input-output, high speed," 2016 IEEE International Autumn Meeting on Power, Electronics and Computing (ROPEC), Ixtapa, 2016, pp. 1-6.

A. Far, "Class AB amplifier with noise reduction, speed boost, gain enhancement, and ultra low power," 2018 IEEE 9th Latin American Symposium on Circuits & Systems (LASCAS), Puerto Vallarta, Mexico, 2018, pp. 1-4.

A. Far, "Low noise rail-to-rail amplifier runs fast at ultra low currents and targets energy harvesting," 2017 IEEE International Autumn Meeting on Power, Electronics and Computing (ROPEC), Ixtapa, 2017, pp. 1-6.

A. Far, "A 5 µW fractional CMOS bandgap voltage and current reference," 2013 IEEE Global High Tech Congress on Electronics, Shenzhen, 2013, pp. 7-11.

A. Far, "A 400nW CMOS bandgap voltage reference," 2013 International Conference on Electrical, Electronics and System Engineering (ICEESE), Kuala Lumpur, 2013, pp. 15-20.

A. Far, "Enhanced gain, low voltage, rail-to-rail buffer amplifier suitable for energy harvesting," 2017 IEEE International Autumn Meeting on Power, Electronics and Computing (ROPEC), Ixtapa, 2017, pp. 1-6.

A. Far, "Subthreshold bandgap voltage reference aiming for energy harvesting: 100na, 5 ppm/c, 40 ppm/v, psrr-88db," 2015 IEEE 5th International Conference on Consumer Electronics—Berlin (ICCE—Berlin), Berlin, 2015, pp. 310-313.

A. Far, "A 220nA bandgap reference with 80dB PSRR targeting energy harvesting," 2016 IEEE Canadian Conference on Electrical and Computer Engineering (CCECE), Vancouver, BC, 2016, pp. 1-4.

A. Far, "Sub-1 volt class AB amplifier with low noise, ultra low power, high-speed, using winner-take-all," 2018 IEEE 9th Latin American Symposium on Circuits & Systems (LASCAS), Puerto Vallarta, Mexico, 2018, pp. 1-4.

A. Far, "A low supply voltage 2 µW half bandgap reference in standard sub-µ CMOS," 2014 IEEE International Conference on Electronics, Computing and Communication Technologies (CONECCT), Bangalore, 2014, pp. 1-5.

A. Far, "Current reference for energy harvesting: 50um per side, At 70 nW, regulating to 125C," 2014 IEEE International Autumn Meeting on Power, Electronics and Computing (ROPEC), Ixtapa, 2014, pp. 1-5.

\* cited by examiner

CURRENT-MODE ANALOG MULTIPLIERS USING SUBSTRATE BIPOLAR TRANSISTORS IN CMOS FOR ARTIFICIAL INTELLIGENCE

CROSS-REFERENCE TO RELATED PATENT APPLICATIONS

The present disclosure claims priority from U.S. Provisional Patent Application Ser. No. 62/862,772 filed Jun. 18, 2019 and which is herein specifically incorporated by reference in its entirety. Furthermore, the present disclosure claims priority from U.S. Provisional Patent Application Ser. No. 62/856,889 filed Jun. 4, 2019 and which is herein specifically incorporated by reference in its entirety. Furthermore, the present disclosure claims priority from U.S. Provisional Patent Application Ser. No. 62/880,885 filed Jul. 31, 2019 and which is herein specifically incorporated by reference in its entirety. Furthermore, the present disclosure claims priority from U.S. Provisional Patent Application Ser. No. 62/912,407 filed Oct. 8, 2019 and which is herein specifically incorporated by reference in its entirety. Furthermore, the present disclosure claims priority from U.S. Provisional Patent Application Ser. No. 62/865,845 filed Jun. 24, 2019 and which is herein specifically incorporated by reference in its entirety.

FIELD OF DISCLOSURE

This disclosure relates to improvements in analog current-mode multipliers (iMULT) and analog current-mode multiply-accumulate (iMAC) circuits for use in integrated circuits (ICs) in general, and more specifically for use in emerging machine artificial intelligence and machine learning (AI & ML) applications.

BACKGROUND

Multipliers and multiply-accumulate functions are fundamental in signal processing, including in AI & ML signal conditioning. Approximate computing, performed in the analog domain can provide asynchronous computing that is free of memory at low power consumption, lower cost with smaller die size, which can be beneficial in some portable and mobile AI & ML applications where high-volumes, low cost, low, power consumption is required.

An objective of the present disclosure is to provide iMULT and iMAC circuits that are small and low cost. Small size and low cost are especially important in AI & ML applications that may require a plurality of multipliers and multiply-accumulate functions on the same IC.

Another objective of the present disclosure is to provide iMULT and iMAC circuits that have low current consumption. As stated earlier, low current consumption is critical in AI & ML applications that may require numerous multiply-accumulate functions on a chip near or at sensors that run on battery.

Another objective of the present disclosure is to provide iMULT and iMAC circuits asynchronously, which frees signal processing from noisy clocks and related digital dynamic power consumption, and noise related to free running clocks.

Another objective of the present disclosure is to provide iMULT and iMAC circuits that free signal processing from (substantial) memory, considering that one of the reasons that digital computation is power hungry is due to memory read-and-write cycles.

Another objective of the present disclosure is to provide iMULT and iMAC circuits that can be manufactured in main-stream Complementary-Metal-Oxide-Semiconductor (CMOS) fabrication that is low cost, readily available, with proven and rugged manufacturing quality.

Another objective of the present disclosure is to provide iMULT and iMAC circuits, which facilitates zero-scale and full-scale signal spans in moderate to high-speed while internal nodes' voltage swings are kept to a minimum, which enables the chip to operate with low power supplies voltages needed in some battery powered and portable applications.

Another objective of the present disclosure is to provide iMULT and iMAC circuits that can be operate with low power supplies voltages which helps lowering the power consumption further.

Another objective of the present disclosure is to provide iMULT and iMAC circuits in CMOS where the CMOS transistors operate in the subthreshold regions which further reduces the power consumption, and lowers the operating power supply voltage.

Another objective of the present disclosure is to provide iMULT and iMAC circuits that utilize substrate vertical Bipolar-Junction-Transistors (vBJT) that are available parasitically and at no extra cost in digital CMOS manufacturing. Further objective of the present disclosure is to utilize such vBJT in order to operate a iMULT at high-to-low input currents, and to remove the subthreshold (ultra-low current) restriction from the iMULT and iMAC.

Another objective of the present disclosure is to provide iMULT and iMAC circuits wherein post or pre multiplication functions such as addition or subtraction can occupy small areas (e.g., addition of two current signals requires the coupling of two wires) and be inherently fast.

Another objective of the present disclosure is to provide iMULT and iMAC circuits without using any resistors or capacitors, which reduces manufacturing size and cost for signal processing in AI & ML end-applications.

Another objective of the present disclosure is to provide iMULT and iMAC circuits which are symmetric, matched, and scaled. Such arrangement facilitates device parameters to track each other over process, temperature, and operating conditions variations. Accordingly, temperature coefficient, power supply coefficient, and AC power supply rejection performance of iMULT and iMAC circuits for AI & ML applications can be improved.

Another objective of the present disclosure is to provide iMULT and iMAC circuits that facilitates approximate computation that is asynchronous, consumes low power, and has small size. Moreover, the objective here is to leverage the trade off in analog processing between low power and analog errors in form of accuracy degradation, but not total failures. This trait can provide the AI & ML end-application with approximate results to work with instead of experiencing failed results.

Another objective of the present disclosure is to provide iMULT and iMAC circuits that take advantage of attenuated contribution of component's random errors in a summation node. Plurality of analog signals that are summed at input or output nodes of an iMULT and iMAC would attenuate the statistical contribution of such cumulative analog signal random errors (such as random noise, offset, mismatches, linearity, gain, drift, etc.) at the summing nodes where plurality of analog iMULT's currents are coupled. The statistical contribution of such cumulative analog signal

SUMMARY OF THE DISCLOSURE

Figure 1A:
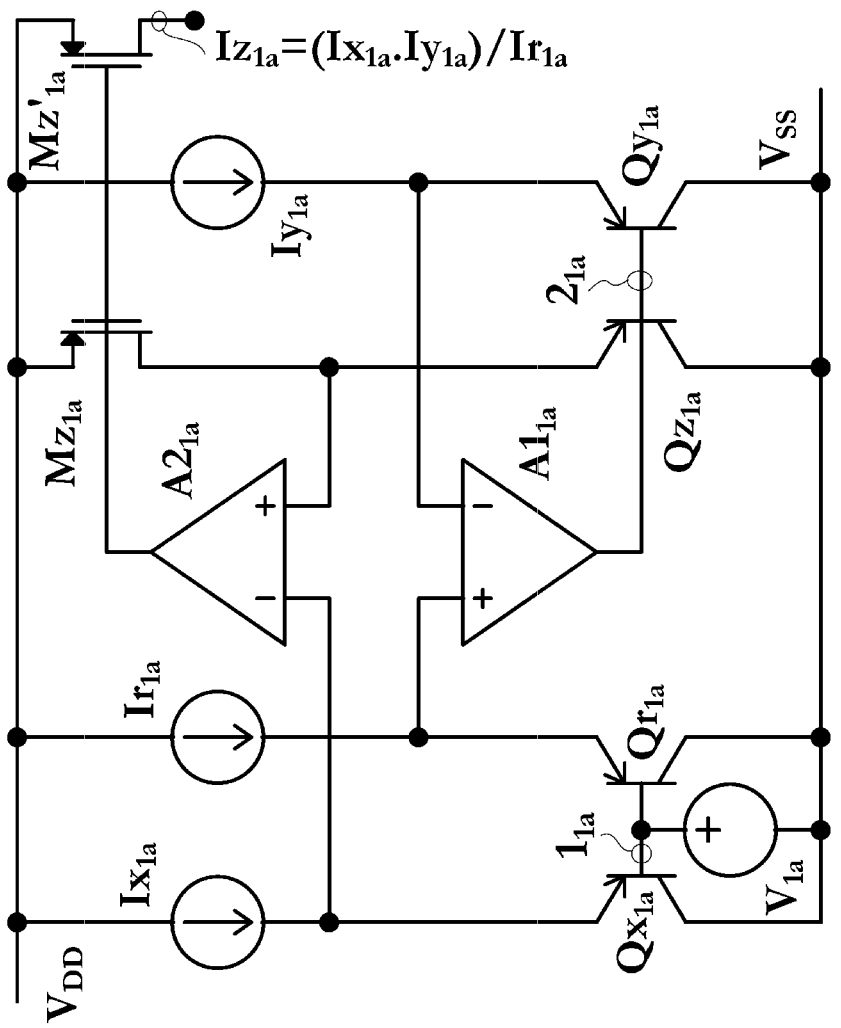
FIG. 1A is a simplified circuit schematic illustrating an analog current-input to current-output multiplier (iMULT) method.

An aspect of the present disclosure is a multiplication (iMULT) method in an integrated circuit, the iMULT method comprising: operating four transistors x-T, r-T, y-T, and z-T, wherein each transistor is a substrate parasitic Bipolar Junction Transistor (T) available in a Complementary Metal Oxide Semiconductor (CMOS), wherein each of a plurality of the Ts has a collector, base, and emitter port, and wherein the T's collector port is a CMOS substrate coupled to a power supply; supplying the x-T's emitter port with a x-input current (Ix); supplying the r-T's emitter port with a r-input current (Ir); supplying the y-T's emitter port with a y-input current (Iy); generating a z-output current (Iz) through the z-T's emitter port, coupling together a voltage source ($V_1$), and the base ports of the x-T and r-T; coupling the base ports of the z-T and y-T together at a first node; regulating the first node voltage to substantially equalize the emitter port voltages of the r-T and the y-T; and regulating the Iz to substantially equalize the emitter port voltages of the x-T and z-T, wherein Iz is substantially equal to Ix×Iy/Ir. The multiplication (iMULT) method further comprising: generating at least one of the Ix, Iy and Ir utilizing at least one current-mode digital-to-analog-converter (iDAC).

Another aspect of the present disclosure is a multiplication (iMULT) method in an integrated circuit, the iMULT method comprising: operating four transistors x-T, r-T, y-T, and z-T transistors, wherein each transistor is a substrate parasitic Bipolar Junction Transistor (T) available in a Complementary Metal Oxide Semiconductor (CMOS), wherein each of a plurality of the Ts has a collector, base, and emitter port, and wherein the T's collector port is a CMOS substrate coupled to a power supply; supplying the x-T's emitter port with a x-input current (Ix); supplying the r-T's emitter port with a r-input current (Ir); supplying the y-T's emitter port with a y-input current (Iy); generating a z-output current (Iz) through the z-T's emitter port, coupling together a voltage source ($V_1$), and the base ports of the y-T and r-T; regulating the base port of the x-T to substantially equalize the emitter port voltages of the r-T and x-T; regulating the base port voltage of the z-T to substantially equalize the emitter port voltages of the y-T and z-T; and regulating the Iz to substantially equalize the base port voltages of the x-T and z-T, wherein Iz is substantially equal to Ix×Iy/Ir. The multiplication (iMULT) method further comprising generating at least one of the Ix, Iy and Ir utilizing at least one current-mode digital-to-analog-converter (iDAC).

Another aspect of the present disclosure is a multiplication (iMULT) method in an integrated circuit, the iMULT method comprising: operating four transistors x-T, r-T, y-T, and z-T transistors, wherein each transistor is a substrate parasitic Bipolar Junction Transistor (T) available in a Complementary Metal Oxide Semiconductor (CMOS), wherein each of a plurality of the Ts has a collector, base, and emitter port, and wherein the T's collector port is a CMOS substrate coupled to a power supply; supplying the x-T's emitter port with a x-input current (Ix); supplying the r-T's emitter port with a r-input current (Ir); supplying the y-T's emitter port with a y-input current (Iy); generating a z-output current (Iz) through the z-T's emitter port, coupling together a voltage source ($V_1$) and the base ports of the x-T, y-T, r-T, and z-T; amplifying the voltage difference between the x-T and r-T emitter ports by a factor G to generate a differential output signal (xr); amplifying the voltage difference between the z-T and y-T emitter ports by a factor G1 to generate a differential output signal (yz), wherein the factor G1 is substantially equal to the factor G; summing the xr and yz differential output signals to generate a combined differential signal; and regulating the Iz to sustainably balance the combined differential signal, wherein Iz is substantially equal to Ix×Iy/Ir. The multiplication (iMULT) method further comprising: summing a plurality of input currents, wherein the plurality of input currents are coupled together at the emitter port of the x-T to generate the Ix. The multiplication (iMULT) method further comprising: generating at least one of the pluralities of input currents, Iy, and Ir utilizing at least one current-mode digital-to-analog-converter (iDAC).

Another aspect of the present disclosure is a multiplication (iMULT) method in an integrated circuit, the iMULT method comprising: operating four transistors x-T, r-T, y-T, and z-T transistors, wherein each transistor is a substrate parasitic Bipolar Junction Transistor (T) available in a Complementary Metal Oxide Semiconductor (CMOS), wherein each of a plurality of Ts has a collector, base, and emitter port, and wherein the T's collector port is a CMOS substrate coupled to a power supply; supplying the x-T's emitter port with a x-input current (Ix); supplying the r-T's emitter port with a r-input current (Ir); supplying the y-T's emitter port with a y-input current (Iy); generating a z-output current (Iz) through the z-T's emitter port, coupling a voltage source ($V_1$) to the base ports x-T, y-T, r-T, and z-T; amplifying the voltage difference between the x-T and z-T emitter ports by a factor G to generate an output signal (xz); amplifying the voltage difference between the y-T and r-T emitter ports by a factor G1 to generate an output signal (yr), wherein the factor G1 is substantially equal to the factor G; regulating the Iz is to substantially balance the xz-gained signal to the yr-gained signal, wherein Iz is substantially equal to Ix×Iy/Ir. The multiplication (iMULT) method further comprising: summing a plurality of input currents, wherein the plurality of input currents are coupled together at the emitter of x-T to generate the Ix. The multiplication (iMULT) method further comprising: generating at least one of the pluralities of input currents, Iy, and Ir utilizing at least one current-mode digital-to-analog-converter (iDAC).

Another aspect of the present disclosure is a multiplication (iMULT) method in an integrated circuit, the iMULT method comprising: operating four diode connected transistors y-M, r-M, x-M, and z-M transistors, wherein each transistor is Metal-Oxide-Field-Effect-Transistor (M) in the subthreshold operating region, wherein the M has a drain, gate, and source port, and wherein each of the M's drain and gate ports are coupled together; generating a x-voltage (Vx) across the x-M by supplying the x-M with a x-current (Ix), wherein the Vx is added a negative power supply voltage ($V_{SS}$); generating a y-voltage (Vy) across the x-M by supplying the y-M with a y-current (Iy), wherein the Vx is subtracted from a positive power supply voltage ($V_{DD}$); generating a r-voltage (Vr) across the r-M by supplying the r-M with a r-current (Ir), wherein the Vr is added to the negative power supply voltage ($V_{SS}$); generating a z-voltage (Vz) across the x-M by generating through the z-M, a z-output current (Iz), wherein the Vz is subtracted from the positive power supply voltage ($V_{DD}$); amplifying the difference between Vy and Vz signals (Vy−Vz) by a first gain factor (G1) to generate a $G1_{y-z}$ signal; amplifying the difference between Vr and Vx signals (Vr−Vx) by a second gain factor (G2) to generate a $G2_{r-x}$ signal, wherein the gain factor G1 is substantially equal to the gain factor G2; regulating the Iz by substantially balancing the $G1_{y-z}$ signal with the $G1_{r-x}$ signal, wherein Iz is substantially equal to Ix×Iy/Ir. The multiplication (iMULT) method further comprising: swapping the x-current (Ix) with the y-current (Iy).

Another aspect of the present disclosure is a multiplication (iMULT) method in an integrated circuit, the iMULT method comprising: operating four transistors y-M, r-M, x-M, and z-M transistors, wherein each transistor is a Metal-Oxide-Field-Effect-Transistor (M) operating in the subthreshold region, wherein the M has a drain, gate, and source port; coupling the y-M's gate and drain ports to a negative power supply voltage ($V_{SS}$); coupling the x-M's gate to y-M's source, and coupling the x-M's drain to the $V_{SS}$; coupling the z-M's gate and drain ports to a negative power supply voltage ($V_{SS}$); coupling the r-M's gate to z-M's source, and coupling the x-M's drain to the $V_{SS}$; supplying the x-M's source port with a x-input current (Ix); supplying the r-M's source port with a r-input current (Ir); supplying the y-M's source port with a y-input current (Iy); generating a z-output current (Iz) through the z-M's source port; and regulating the Iz by substantially equalizing the source port voltages of the x-M and r-M, wherein Iz is substantially equal to Ix×Iy/Ir.

Another aspect of the present disclosure is a multiplication (iMULT) method in an integrated circuit, the iMULT method comprising: operating four transistors y-M, r-M, x-M, and z-M transistors, wherein each transistor is a Metal-Oxide-Field-Effect-Transistor (M) operating in the subthreshold region, wherein the M has a drain, gate, and source port, and where in all the Ms are at least one of P-type and N-type; coupling the r-M's gate and drain ports to a negative power supply voltage ($V_{SS}$); coupling the z-M's gate port to r-M's source port; coupling the x-M's gate and drain ports to a negative power supply voltage ($V_{SS}$); coupling the y-M's gate port to x-M's source port; coupling the source port of y-M to a source port of a z-M; supplying the x-M's source port with a x-input current (Ix); supplying the r-M's source port with a r-input current (Ir); supplying the y-M's source port with a y-input current (Iy); generating a z-output current (Iz) through the z-M's source port; and regulating a current supplied to the source ports of y-P and z-P by equalizing the drain port voltages of the y-P and z-P, wherein Iz is substantially equal to Ix×Iy/Ir.

Another aspect of the present disclosure is a multiplication (iMULT) method in an integrated circuit, the iMULT method comprising: operating four transistors y-P, r-P, x-P, and z-P transistors, wherein each transistor is a P-type Metal-Oxide-Field-Effect-Transistor (P) operating in the subthreshold region, and wherein the P has a drain, gate, and source port; coupling the x-P's gate port to y-P's drain port; coupling the x-P's source port to y-P's gate port; coupling the r-P's gate port to z-P's source port; coupling the z-P's gate to y-P's drain port; coupling a positive power supply ($V_{DD}$) to the source ports of the r-P and y-P; supplying the x-P's drain port with a x-input current (Ix); supplying the r-P's drain port with a r-input current (Ir); supplying the y-P's drain port with a y-input current (Iy); generating a z-output current (Iz) through the z-M's source port, and regulating the x-P's drain port voltage to substantially equalize the x-P's drain port current with the x-P's source port current; regulating the r-P's drain port voltage to substantially equalize the r-P's drain port current and source port current; and summing of the gate-to-source port voltages the x-P (Vgs$_x$) to the gate-to-source port voltages the y-P (Vgs$_y$) to generate Vgs$_x$+Vgs$_y$; summing of the gate-to-source port voltages the r-P (Vgs$_r$) to the gate-to-source port voltages the z-P (Vgs$_z$) to generate Vgs$_r$+Vgs$_z$; equalizing Vgs$_x$+Vgs$_y$ to Vgs$_r$+Vgs$_z$, by regulating the z-P's drain port current Iz, wherein Iz is substantially equal to Ix×Iy/Ir.

Another aspect of the present disclosure is a multiplication (iMULT) method in an integrated circuit, the iMULT method comprising: operating four transistors y-P, r-P, x-P, and z-P transistors, wherein each transistor is a P-type Metal-Oxide-Field-Effect-Transistor (P) operating in the subthreshold region, wherein the P has a drain, gate, and source port; coupling the source ports of diode connected y-M and r-M to a voltage source; coupling source ports of x-M and z-M together; coupling r-M's gate and drain port to x-M's gate; coupling y-M's gate and drain port to z-M's gate; supplying the x-P's drain port with a x-input current (Ix); supplying the r-P's drain port with a r-input current (Ir); supplying the y-P's drain port with a y-input current (Iy); generating a z-output current (Iz) through the z-M's source port, and subtracting a gate-to-source voltages of r-M (Vgs$_r$) from a gate-to-source voltages of x-M (Vgs$_r$) to generate a difference voltage (ΔVgs$_{xr}$); subtracting a gate-to-source voltages of y-M (Vgs$_y$) from a gate-to-source voltages of z-M (Vgs$_z$) to generate a difference voltage (ΔVgs$_{zy}$); equaling ΔVgs$_{xr}$ to ΔVgs$_{zy}$, to regulate a current supplied to the source ports of x-M and z-M, wherein Iz is substantially equal to Ix×Iy/Ir. The multiplication (iMULT) method further comprising: cascading at least one of x-M, y-M, r-M, and z-M to increase their output impedance; and biasing the cascade with at least one of (1) a first voltage source above the negative power supply potential voltage V$_{SS}$, (2) a second voltage source above the source ports of x-M and z-M potential voltage, (3) a third voltage source above at least one of diode connected x-M and z-M potential voltage, and (4) a fourth voltage source above the Iy input port voltage potential.

Another aspect of the present disclosure is a scalar multiplication (siMULT) method in an integrated circuit, the siMULT method comprising: arranging a logarithmic relationship between two voltage ports and two current ports of a block (B); supplying a reference current (Ir) to a first current port and a y-current (Iy) to a second current port of the first B; supplying a plurality of x-currents (Ix) respectively to a first current port of each of a plurality of successive Bs; coupling a first voltage port of each of a plurality of Bs to a first voltage port of the first B; coupling a second voltage port of each of the plurality of successive Bs to a second voltage port of the first B; generating a plurality of z-currents (Iz) respectively from a second current port of each B of the plurality of successive Bs, each z-current substantially equal to the product of each respective x-current multiplied by the Iy and divided by the Ir. The scalar multiplication (siMULT) method further comprising: coupling the plurality of Iz together to generate a multiply-accumulate current signal (I$_{siMAC}$), wherein the I$_{siMAC}$ is a summation of the plurality of I$_z$s. The scalar multiplication (siMULT) method further comprising: coupling a bias current (I$_B$) to I$_{siMAC}$ to generate a biased multiply-accumulate current signal (I$_{bsiMAC}$), wherein the I$_{bsiMAC}$ is substantially equal to I$_B$ I$_{siMAC}$. The scalar multiplication (siMULT) method further comprising: digitizing the I$_{bsiMAC}$ by at least one current-mode analog-to-digital converter (iADC). The scalar multiplication (siMULT) method further comprising: combining a plurality of I$_{bsiMAC}$s to arrange at least one current-mode artificial neural network (iANN).

DETAILED DESCRIPTION

Numerous embodiments are described in the present application and are presented for illustrative purposes only and is not intended to be exhaustive. The embodiments were chosen and described to explain principles of operation and their practical applications. The present disclosure is not a literal description of all embodiments of the disclosure(s). The described embodiments also are not, and are not intended to be, limiting in any sense. One of ordinary skill in the art will recognize that the disclosed embodiment(s) may be practiced with various modifications and alterations, such as structural, logical, and electrical modifications. For example, the present disclosure is not a listing of features which must necessarily be present in all embodiments. On the contrary, a variety of components are described to illustrate the wide variety of possible embodiments of the present disclosure(s). Although particular features of the disclosed embodiments may be described with reference to one or more particular embodiments and/or drawings, it should be understood that such features are not limited to usage in the one or more particular embodiments or drawings with reference to which they are described, unless expressly specified otherwise. The scope of the disclosure is to be defined by the claims.

Although process (or method) steps may be described or claimed in a particular sequential order, such processes may be configured to work in different orders. In other words, any sequence or order of steps that may be explicitly described or claimed does not necessarily indicate a requirement that the steps be performed in that order. The steps of processes described herein may be performed in any order possible. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to the embodiment(s). In addition, although a process may be described as including a plurality of steps, that does not imply that all or any of the steps are essential or required. Various other embodiments within the scope of the described disclosure(s) include other processes that omit some or all of the described steps. In addition, although a circuit may be described as including a plurality of components, aspects, steps, qualities, characteristics and/or features, that does not indicate that any or all of the plurality are essential or required. Various other embodiments may include other circuit elements or limitations that omit some or all of the described plurality.

Be mindful that all the figures comprised of circuits, blocks, or systems illustrated in this disclosure are powered up by positive power supply V$_{DD}$ and negative power supply V$_{SS}$, wherein V$_{SS}$ can be connected to the ground potential or zero volts. Terms FET is Field-Effect-Transistor; MOS is Metal-Oxide-Semiconductor; MOSFET is MOS FET; PMOS is p-channel or p-type MOS; NMOS is n-channel or n-type MOS; BiCMOS is Bipolar CMOS. The term BJT is Bipolar-Junction Transistor. The terms 'port' or 'terminal' or 'node' are used interchangeably throughout this disclosure. The terms 'power supply voltage' or 'supply voltage' are used interchangeably throughout this disclosure. The body terminal of NMOSFET can be connected to its source terminal of NMOSFET or to $V_{SS}$, throughout this disclosure. Also, the body terminal of PMOSFET can be connected to the source terminal of PMOSFET or to $V_{DD}$, throughout this disclosure. The term $V_{GS}$ or $v_{GS}$ are gate-to-source voltage for a MOSFET. The term $V_{DS}$ is drain-to-source voltage for a MOSFET. The term $I_{DS}$ or $I_D$ is drain current of a MOSFET (e.g., also $I_{M1}$ or $Id_{M1}$ or $I_{DM_1}$ is drain current of $M_1$ that is a MOSFET). The term $V_{BE}$ or $v_{BE}$ is base-to-emitter voltage of a BJT. The term $I_C$ is collector current of a BJT and $I_E$ Is emitter current of a BJT (e.g., also $Ie_{Q1}$ or $Ic_{q1}$ or $I_{CE_{Q1}}$ is a current of $Q_1$ that is a BJT). Channel width over channel length is W/L which is the size of a MOSFET. This disclosure utilizes transistors (T) whose input-voltage ($v_I$) to output-current ($i_O$) transfer function approximately follows an exponential profile.

The CMOSFETs that operate in the subthreshold region follow an approximate exponential $v_I$ to $i_O$ transfer function that can approximately be represented as follows:

$$i_D \approx I_{DO} \times \frac{W}{L} \times e^{\frac{v_{GS}-V_{TH}}{n \times V_t}}$$

or $$v_{GS} - V_{TH} \approx n \times V_t \times \ln\left[\frac{i_D}{I_{DO} \times \frac{W}{L}}\right]$$

where for a MOSFET, the $V_{TH}$ is threshold voltage, $v_{GS}$ is voltage between gate-terminal to source-terminal, $i_D$ is current through the drain terminal, W/L is a channel-width over channel-length ratio, $V_t$ is thermal voltage, n is slope factor, $I_{DO}$ is the characteristics current when $v_{GS} \approx V_{TH}$. Note that in the case of a MOSFET operating in subthreshold, $v_I$ corresponds to $v_{GS}$ and $i_O$ corresponds to $i_D$ or $i_{DS}$. Moreover, note that for two equally sized and same type subthreshold MOSFET the approximate relationship $$v_{GS1} - v_{GS2} \approx n \times V_t \times \ln\left[\frac{i_{D1}}{i_{D2}}\right]$$

hold, wherein $v_{GS1}$ and $v_{GS2}$ are the first and second MOSFET's $v_{GS}$s or $v_I$s, and $i_{D1}$, $i_{D2}$ are the first and second MOSFET's $i_D$s or $i_O$s. Note that throughout this disclosure, MOSFETs that operate in subthreshold (which are utilized as the core four MOSFETs in current multipliers) have equal W/L, unless otherwise specified.

A bipolar-junction-transistor (BJT) follows an approximate exponential $v_I$ to $i_O$ transfer function that can be represented as follows:

$$i_E \approx I_{ES} \times \left[e^{\frac{v_{BE}}{V_t}} - 1\right] \text{ or } v_{BE} \approx V_t \times \ln\left[\frac{i_E}{I_{ES}}\right]$$

where for a BJT, $i_E$ is the emitter current, $v_{BE}$ is the base-emitter voltage, $V_t$ is thermal voltage, $I_{ES}$ is the reverse saturation current of the base-emitter diode. In the case of a BJT, $v_I$ corresponds to $v_{BE}$ and $i_O$ corresponds to $i_E$ or $i_C$. Moreover, keep in mind that for two equally sized emitter area and same type BJTs $$v_{BE1} - v_{BE2} \approx V_t \times \ln\left[\frac{i_{E1}}{i_{E2}}\right]$$

where $v_{BE1}$, $v_{BE2}$ are the first and second BJT's $v_{BE}$ s or $v_I$s, and $i_{E1}$, $i_{E2}$ are the first and second BJT's $i_E$s or $i_O$s. Be mindful that throughout this disclosure, BJTs (which are utilized as the core four BJTs in current multipliers) have equal emitter area, unless otherwise specified.

Keep in mind that other manufacturing technologies, such as Bipolar, BiCMOS, and others can utilize this disclosure in whole or part.

Throughout this disclosure, analog multipliers (iMULT) and analog multiply-accumulate (iMAC) circuits operate in current-mode and generally have the following benefits:

First, analog iMULT and analog iMAC circuits in this disclosure can operate at higher speeds because they operate in current-mode, which is inherently fast.

Second, current signal processing, that occurs within the nodes of analog iMULT and analog iMAC circuits in current mode, have small voltage swings (while retaining their speed and dynamic range benefits) which also enables operating the current-mode with lower power supply voltages.

Third, operating at low supply voltage reduces power consumption of analog iMULT and analog iMAC circuits.

Fourth, the disclosed analog iMULT and analog iMAC circuits operating in current mode, facilitates simple, low cost, and fast summation and or subtraction functions. For example, summation of plurality of analog currents could be accomplished by coupling the current signals. Depending on accuracy and speed requirements, subtraction of analog current signals could be accomplished by utilizing a current mirror where the two analog current signals are applied to the opposite side of the current mirror, for example.

Fifth, majority of analog iMULT and analog iMAC circuits, disclosed here, can operate with low power supply voltages since their operating headroom can be generally limited to a FET's $V_{GS}+V_{DS}$, which enables them to operate at low power supply voltages which reduces power consumption.

Sixth, operating the CMOSFETs in subthreshold enables analog iMULT and analog iMAC circuits to operate with ultra-low currents, even lower power supplies, and ultra-low power consumption suitable for mobile applications, especially in mobile and portable AI & ML applications that may require numerous ultra-low current and low voltage supply analog iMULT and analog iMAC circuits for computation.

Seventh, iMULT can be arranged to generate non-linear outputs such as in square input-output transfer function or inverse input-output transfer functions. For example, by applying the same input to the two inputs of a multiplier, a square of the input can be generated at the output of the multiplier.

Eight, the disclosed analog iMULT and analog iMAC circuits not requiring any capacitors nor any resistors, which reduces die size and die cost, and facilitates fabricating analog iMULT and analog iMAC circuits in standard digital CMOS manufacturing that is not only low cost, but also main-stream and readily available for high-volume mass production applications, and proven for being rugged and having high quality.

Ninth, the disclosed analog iMULT and analog iMAC circuits are free of clock, suitable for asynchronous (clock free) computation. As such, there is no clock related noise on power supplies and there is no dynamic power consumption due to a digital logic.

Tenth, some of the disclosed analog iMULT and analog iMAC circuits are arranged in a symmetric, matched, and scaled manner. This trait facilitates devices parameters to track each other over process, temperature, and operating condition variations. Accordingly, the disclosed analog iMULT and analog iMAC circuit's temperature coefficient and power supply rejection performance can be enhanced.

Eleventh, some of the disclosed analog iMULT and analog iMAC circuits utilize substrate vertical BJT that are available parasitically and at no extra cost in main-stream digital CMOS processes fabrications. Utilizing BJT in the manners disclosed would facilitate the analog iMULT to operate with a wider range of high-to-low input currents, which removes the subthreshold (ultra-low current) limit on the analog iMULT's input current span, and accordingly enables more flexibility for utilizing larger plurality of input signals into the analog iMULT to arrange an analog siMAC.

Twelves, while digital computation is generally accurate but it may be excessively power hungry. Current-mode analog and mixed-signal computation that is disclosed here leverage the trade off in analog signal processing between low power and analog accuracy in form of signal degradation, but not total failures. This trait can provide the AI & ML end-application with approximate results to work with instead of experiencing failed results.

Thirteenth, utilizing plurality of analog inputs that are summed at an plurality of inputs or outputs of iMULTs (to arrange an analog siMAC) would attenuate the statistical contribution of such cumulative analog random errors (such as random noise, offset, mismatches, linearity, gain, drift, etc.) at the summing nodes where plurality of analog iMULT currents are coupled (which are generated via the iDACs). The statistical contribution of such cumulative analog random errors, at the summing node, is the square root of the sum of the squares of such random error terms.

Fourteenth, voltage mode multiplier's full-scale input and output voltage signal swings are restricted by power supply voltage levels. However, so long as operational transistor headroom is complied with, the disclosed analog current-mode iMULT and siMAC input and output current signals can span between zero and full scale, generally independent of the power supply voltage level.

Section 1A—Description of FIG. 1A

FIG. 1A is a simplified circuit schematic illustrating an analog current-input to current-output multiplier (iMULT) method.

The disclosed analog iMULT embodiment illustrated in FIG. 1A utilizes the parasitic substrate vertical BJT that's available on digital CMOS process.

The circuit of FIG. 1A is comprising of four BJTs that are $Qx_{1a}$, $Qr_{1a}$, $Qz_{1a}$, and $Qy_{1a}$ wherein each BJT has a collector, base, and emitter ports, and wherein the base ports of $Qz_{1a}$ and $Qy_{1a}$ are coupled together at node $2_{1a}$, and the base ports of $Qx_{1a}$ and $Qr_{1a}$ are coupled together at node $1_{1a}$ and coupled with a voltage source ($V_{1a}$). The emitters ports of $Qx_{1a}$, $Qr_{1a}$, and $Qy_{1a}$ are the current input terminals of the disclosed analog iMULT, and $Qz_{1a}$'s emitter port carries the output current of the disclosed analog iMULT. The $Qx_{1a}$'s emitter port is supplied with $Ix_{1a}$, the $Qr_{1a}$'s emitter port is supplied with $Ir_{1a}$, the $Qy_{1a}$'s emitter port is supplied with $Iy_{1a}$, and the $Qz_{1a}$'s emitter port is supplied with $Iz_{1a}$. The voltage at the $Qr_{1a}$'s emitter port is substantially equalized with the voltage at the $Qy_{1a}$'s emitter port by regulating the voltage at node $2_{1a}$. The voltage at the $Qx_{1a}$'s emitter port is substantially equalized with the voltage at the $Qz_{1a}$'s emitter port by regulating the current ($Iz_{1a}$) through $Qz_{1a}$'s emitter port.

In FIG. 1A, the z-output current of the disclosed analog iMULT is $Iz_{1a}$, which is a product of the x-input current multiplied by the y-input current (i.e., $Ix_{1a} \times Iy_{1a}$) and scaled by the r-input reference current (i.e., divided by $Ir_{1a}$), wherein the disclosed multiplier's transfer function is derived as follows: Assuming ideal amplifiers, $A1_{1a}$'s output regulates the base port of $Qz_{1a}$ and $Qy_{1a}$ until $A1_{1a}$'s two inputs are substantially equalized. Concurrently, $A2_{1a}$'s output regulates the gate ports of $Mz_{1a}$ which supplies a current through $Qz_{1a}$'s emitter port until $A2_{1a}$'s two inputs are substantially equalized.

Accordingly for the loop comprising of $Qx_{1a}$, $Qr_{1a}$, $A1_{1a}$, $Qy_{1a}$, $Qz_{1a}$, and $A2_{1a}$, by the operation of the Kirchhoff Voltage Law (KVL):

$$v_{BE_{Qx_{1a}}} - v_{BE_{Qr_{1a}}} = v_{BE_{Qz_{1a}}} - v_{BE_{Qy_{1a}}} \approx V_t \times \ln\left[\frac{Ix_{1a}}{Ir_{1a}}\right] \approx V_t \times \ln\left[\frac{Iz_{1a}}{Iy_{1a}}\right].$$

Therefore, $Iz_{1a} \approx (Ix_{1a} \times Iy_{1a})/Ir_{1a}$.

Notice that $Mz'_{1a}$ replicates the z-output current of the analog iMULT by mirroring $Mz_{1a}$'s current, wherein the $Mz_{1a}$–$Mz'_{1a}$ current mirror can be cascaded for improved accuracy and higher output impedance. The bias voltage $V_{1a}$ can be zero or a positive or a negative voltage (to lower the operating voltage supply head-room) depending on end-application requirements. Given the low current-gain (beta) of the parasitic substrate vertical BJT (e.g., $Qx_{1a}$, $Qr_{1a}$, $Qy_{1a}$, $Qz_{1a}$) that elevates BJT's base current, the amplifier $A1_{1a}$ can have current sink capability.

In addition to the analog iMULT benefits outlined in this disclosure's introduction section titled DETAILED DESCRIPTION, the disclosed analog iMULT illustrated in FIG. 1A has the following benefits:

First, utilizing (a main-stream digital CMOS process that contains) the parasitic BJT that is available at no extra manufacturing cost, enables the disclosed analog iMULT to operate with a wider range of input current signals and or for the iMULT (utilized in a siMAC) to receive larger plurality of input current signals.

Second, the disclosed analog iMULT circuit is arranged in a symmetric, matched, and scaled manner. This trait facilitates devices parameters to track each other over process, temperature, and operating condition variations. Accordingly, the disclosed analog iMULT circuit's temperature coefficient and power supply rejection performance can be enhanced.

Third, operating the CMOSFET portion of the circuit in subthreshold enables the disclosed circuits to operate with ultra-low currents, even lower power supplies, and ultra-low power consumption suitable for mobile applications, especially in AI & ML applications near the edge or sensors that run on battery and may require numerous ultra-low current and low voltage supply signal conditioning circuits for computation.

Figure 1B:
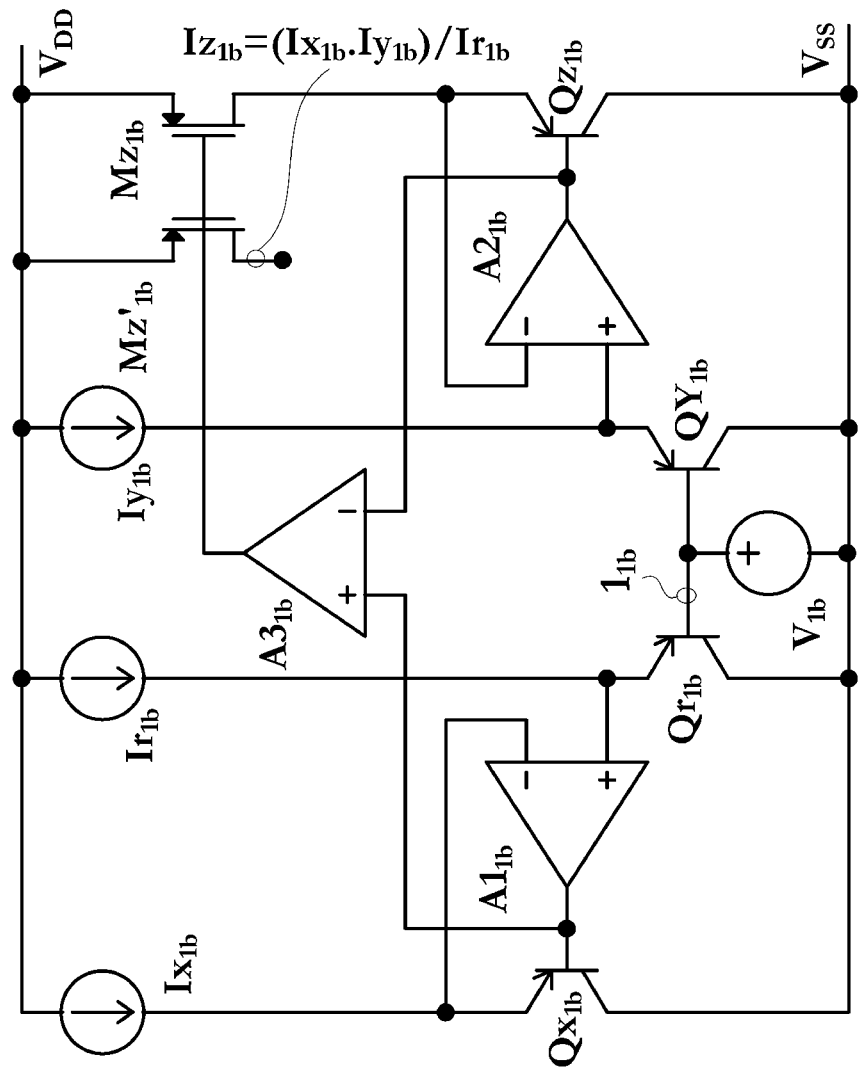
FIG. 1B is a simplified circuit schematic illustrating another analog current-input to current-output multiplier (iMULT) method.

Section 1B—Description of FIG. 1B

FIG. 1B is a simplified circuit schematic illustrating another analog current-input to current-output multiplier (iMULT) method.

The disclosed analog iMULT embodiment illustrated in FIG. 1B also utilizes the parasitic substrate vertical BJT that's available on digital CMOS process.

The circuit of FIG. 1B is comprising of four BJTs that are $Qx_{1b}$, $Qr_{1b}$, $Qz_{1b}$, and $Qy_{1b}$ wherein each BJT has a collector, base, and emitter ports, and wherein the base ports of $Qy_{1b}$ and $Qr_{1b}$ are coupled together at node $1_b$ and coupled with a voltage source $V_{1b}$. The emitters ports of $Qx_{1b}$, $Qr_{1b}$, and $Qy_{1b}$ are the current input terminals of the disclosed analog iMULT, and $Qz_{1b}$'s emitter port carries the output current of the disclosed analog iMULT. The $Qx_{1b}$'s emitter port is supplied with $Ix_{1b}$, the $Qr_{1b}$'s emitter port is supplied with $Ir_{1b}$ as a r-input reference current, the $Qy_{1b}$'s emitter port is supplied $Iy_{1b}$, and the $Qz_{1b}$'s emitter port is supplied with $Iz_{1b}$, which as noted represents the output current of the analog iMULT. The voltage at the $Qr_{1b}$'s emitter port is substantially equalized with the voltage at the $Qx_{1b}$'s emitter port by regulating the voltage at the $Qx_{1b}$'s base port. The voltage at the $Qy_{1b}$'s emitter port is substantially equalized with the voltage at the $Qz_{1b}$'s emitter port by regulating the voltage at the $Qz_{1b}$'s base port. The voltage at the $Qx_{1b}$'s base port is substantially equalized with the voltage at the $Qz_{1b}$'s base port by regulating the current ($Iz_{1b}$) through $Qz_{1b}$'s emitter port.

The z-output current of the disclosed analog iMULT is $Iz_{1b}$, which is a product of the x-input current multiplied by the y-input current (i.e., $Ix_{1b} \times Iy_{1b}$) and scaled by the r-input reference current (i.e., divided by $Ir_{1b}$), wherein the disclosed multiplier's transfer function is derived as follows: Assuming ideal amplifiers, $A1_{1b}$'s output regulates the base port of $Qx_{1b}$ until $A1_{1b}$' s two inputs (that are coupled with the emitter ports of $Qx_{1b}$ and $Qr_{1b}$) are substantially equalized. Moreover, $A2_{1b}$'s output regulates the base port of $Qz_{1b}$ until $A2_{1b}$'s two inputs (that are coupled with the emitter ports of $Qy_{1b}$ and $Qz_{1b}$) are substantially equalized. Concurrently, $A3_{1b}$'s output regulates the gate port of $Mz_{1b}$ which supplies a current through $Qz_{1b}$'s emitter port until $A2_{1b}$'s two inputs (that are coupled with the base ports of $Qx_{1b}$ and $Qz_{1b}$) are substantially equalized.

Accordingly for the loop comprising of $Qr_{1b}$, $A1_{1b}$, $Qx_{1a}$, $A3_{1b}$, $Qz_{1a}$, $A2_{1b}$, and $Qy_{1b}$, by the operation of the Kirchhoff Voltage Law (KVL):

$$v_{BE_{Qx_{1b}}} - v_{BE_{Qr_{1b}}} = v_{BE_{Qz_{1b}}} - v_{BE_{Qy_{1b}}} \approx V_t \times \ln\left[\frac{Ix_{1b}}{Ir_{1b}}\right] \approx V_t \times \ln\left[\frac{Iz_{1b}}{Iy_{1b}}\right].$$

Therefore, $Iz_{1b} \approx (Ix_{1b} \times Iy_{1b})/Ir_{1b}$.

Note that $Mz'_{1b}$ replicates the z-output current of the analog iMULT by mirroring $Mz_{1b}$'s current, wherein the $Mz_{1b}$–$Mz'_{1b}$ current mirror can be cascaded for improved accuracy and higher output impedance. The bias voltage $V_{1b}$ can be zero or a positive or a negative voltage (to lower the operating voltage supply head-room) depending on end-application requirements. Given the low current-gain (beta) of the parasitic substrate vertical BJT (e.g., $Qx_{1b}$, $Qr_{1b}$, $Qy_{1b}$, $Qz_{1b}$) that elevates BJT's base current, the amplifiers $A1_{1b}$ and $A2_{1b}$ can have current sink capability.

In addition to the analog iMULT benefits outlined in this disclosure's introduction section titled DETAILED DESCRIPTION, the disclosed analog iMULT illustrated in FIG. 1B has the following benefits:

First, utilizing (a main-stream digital CMOS process that contains) the parasitic BJT at no extra manufacturing cost, enables the disclosed analog iMULT to operate with a wider range of high-to-low input currents, which accordingly enables more flexibility in supplying the analog iMULT (that is utilized in a siMAC) with a larger plurality of input current signals.

Second, the disclosed analog iMULT circuit is arranged in a symmetric, matched, and scaled manner. This trait facilitates devices parameters to track each other over process, temperature, and operating condition variations. Accordingly, the disclosed analog iMULT circuit's temperature coefficient and power supply rejection performance can be enhanced.

Third, operating the CMOSFET portion of the circuit in subthreshold enables the disclosed circuits to operate with ultra-low currents, even lower power supplies, and ultra-low power consumption suitable for mobile applications, especially in AI & ML applications near the edge or sensors that operate with battery and may require numerous ultra-low current and low voltage supply signal conditioning circuits for computation.

Figure 2A:
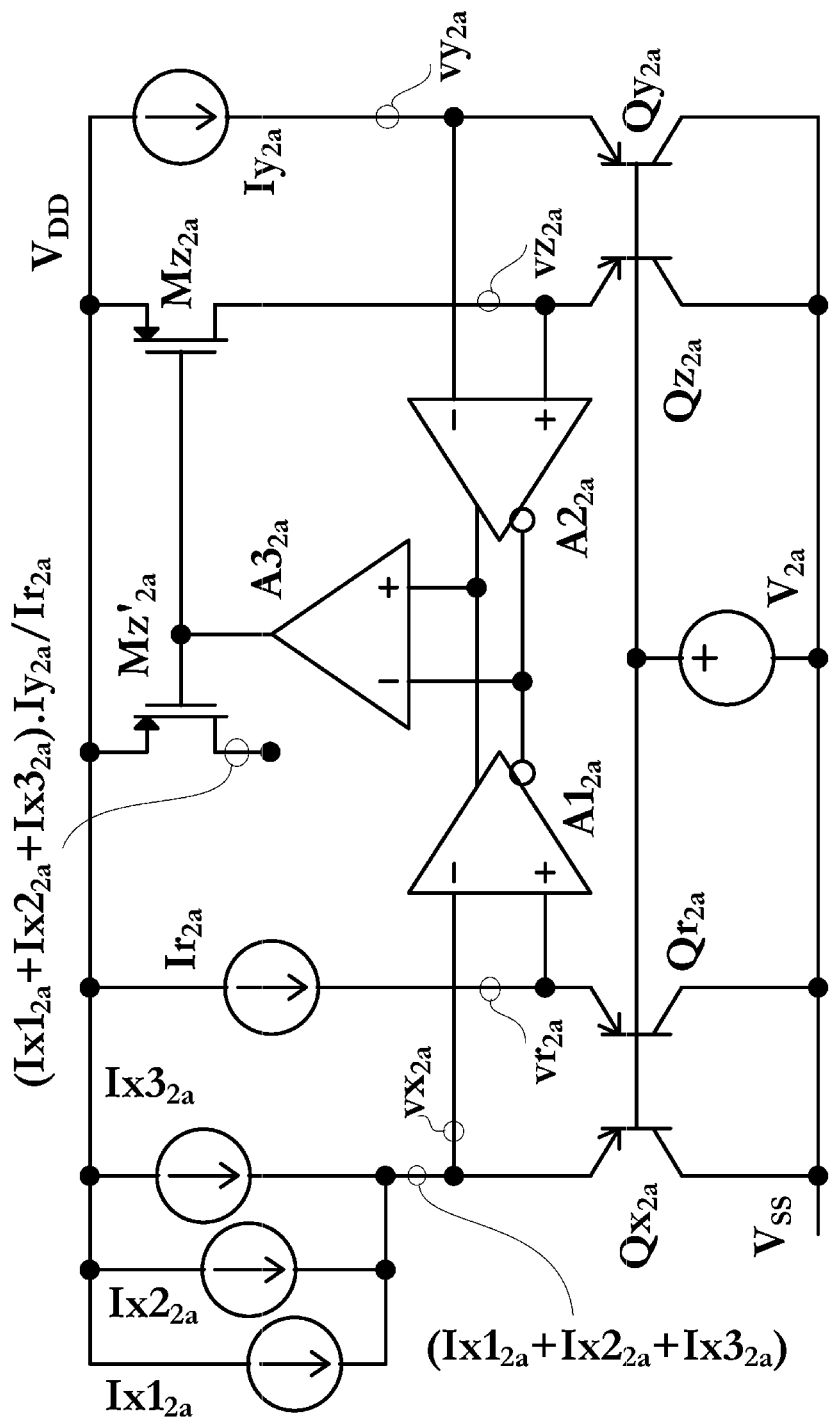
FIG. 2A is a simplified circuit schematic illustrating an analog scalar current-input to current-output multiply-accumulate (siMAC) method.

Section 2A—Description of FIG. 2A

FIG. 2A is a simplified circuit schematic illustrating an analog scalar current-input to current-output multiply-accumulate (siMAC) method.

The disclosed analog siMAC embodiment illustrated in FIG. 2A utilizes the parasitic substrate vertical BJT that's available on digital CMOS process.

The circuit of FIG. 2A is comprising of four BJTs that are $Qx_{2a}$, $Qr_{2a}$, $Qz_{2a}$, and $Qy_{2a}$ wherein each BJT has a collector, base, and emitter ports. The emitters ports of $Qx_{2a}$, $Qr_{2a}$, and $Qy_{2a}$ are the current input terminals of the disclosed analog siMAC, and $Qz_{2a}$'s emitter port carries the output current of the disclosed analog siMAC. The base ports $Qx_{2a}$, $Qr_{2a}$, $Qz_{2a}$, and $Qy_{2a}$ are coupled together and coupled with a voltage source $V_{2a}$.

The $Qx_{2a}$'s emitter port is supplied with a plurality of x-input currents $Ix1_{2a}$, $Ix2_{2a}$, and $Ix3_{2a}$ of analog siMAC. The sum of the plurality of x-input currents supplied to the $Qx_{2a}$'s emitter is ($Ix1_{2a}+Ix2_{2a}+Ix3_{2a}$). Be mindful that plurality is 3 inputs for clarity of description in FIG. 2A, but there can be more channel depending on end-application requirement. The $Qr_{2a}$'s emitter port is supplied with a r-input reference current ($Ir_{2a}$), the $Qy_{2a}$'s emitter port is supplied with a y-input current ($Iy_{2a}$), and the $Qz_{2a}$'s emitter port is supplied with a z-output current ($Iz_{2a}$).

Programming equal input-output gains of $g'_{2a}$ for $A1_{2a}$ and $A2_{2a}$, the difference between $Qr_{2a}$'s emitter voltage ($vr_{2a}$) and $Qx_{2a}$'s emitter voltage ($vx_{2a}$) is gained by $A1_{2a}$ which generates $g'_{2a} \times (vx_{2a}-vr_{2a})$ as differential signals at its outputs. Concurrently, the difference between $Qz_{2a}$'s emitter voltage ($vz_{2a}$) and $Qy_{2a}$'s emitter voltage ($vy_{2a}$) is gained by $A2_{2a}$ that generates $g'_{2a} \times (vy_{2a}-vz_{2a})$ as differential signals at its outputs. Output signals of amplifiers $A1_{2a}$ and $A2_{2a}$ are combined to generates $g''_{2a} \times [(vy_{2a}-vz_{2a})+(vx_{2a}-vr_{2a})]$ differential signals that are coupled to the inputs of amplifier $A3_{2a}$. Until the combined differential output signals of $A1_{2a}$ and $A2_{2a}$ are substantially equalized, the amplifier $A3_{2a}$ regulates $Mz_{2a}$'s gate voltage to generate the $Iz_{2a}$, which is the $Qz_{2a}$'s emitter current, until the $A3_{2a}$'s input signals.

As such, $g_{2a} \times [(vy_{2a}-vz_{2a})+(vx_{2a}-vr_{2a})] \approx vz_{2a}$. Thus, $(vy_{2a}+vx_{2a}-vr_{2a}) \approx vz_{2a}$ $(1+1/g_{2a})$. Assuming that $g_{2a} \gg 1$ (which represents a combined signal gain through $A1_{2a}$, $A2_{2a}$, $A3_{2a}$, and $Mz_{2a}$), then $(vy_{2a}+vx_{2a}-vr_{2a}) \approx vz_{2a}$. Substituting for $vy_{2a} = v_{BE_{Qy_{2a}}}$, $vz_{2a} = v_{BE_{Qz_{2a}}}$, $vx_{2a} = v_{BE_{Qx_{2a}}}$, and $vr_{2a} = v_{BE_{Qr_{2a}}}$ results in the following:

$$v_{BE_{Qx_{2a}}} - v_{BE_{Qr_{2a}}} - v_{BE_{Qz_{2a}}} - v_{BE_{Qy_{2a}}} \approx$$
$$V_t \times \ln\left[\frac{Ix1_{2a} + Ix2_{2a} + Ix3_{2a}}{Ir_{2a}}\right] \approx V_t \times \ln\left[\frac{Iz_{2a}}{Iy_{2a}}\right].$$

Accordingly, the output of siMAC represented by $Iz_{2a} \approx (Ix1_{2a}+Ix2_{2a}+Ix3_{2a}) \times Iy_{2a}/Ir_{2a}$.

Notice that $Mz'_{2a}$ replicates the z-output current of the analog siMAC by mirroring $Mz_{2a}$'s current, wherein the $Mz_{2a}$–$Mz'_{2a}$ current mirror can be cascaded for improved accuracy and higher output impedance. The bias voltage $V_{2a}$ can be zero or a positive or a negative voltage (to lower the operating voltage supply head-room) depending on end-application requirements.

In addition to the analog siMAC benefits outlined in this disclosure's introduction section titled DETAILED DESCRIPTION, the disclosed analog iMULT illustrated in FIG. 2A has the following benefits:

First, utilizing (a main-stream digital CMOS process that contains) the parasitic BJT is available at no extra manufacturing cost, enables the disclosed analog iMULT to operate with a wider range of input current signals and or for the iMULT (utilized in the siMAC) to receive larger plurality of input current signals.

Second, the disclosed analog siMAC circuit is arranged in a symmetric, matched, and scaled manner. This trait facilitates devices parameters to track each other over process, temperature, and operating condition variations. Accordingly, the disclosed analog siMAC circuit's temperature coefficient and power supply rejection performance can be enhanced.

Third, the disclosed analog siMAC circuit utilizes simple, low cost, and fast summation of the analog iMULT input currents, wherein summation of plurality of analog currents is accomplished by coupling of the analog iMULT input currents.

Fourth, utilizing plurality of analog inputs that are summed at an input of iMULT (to arrange an analog siMAC) would attenuate the statistical contribution of such cumulative analog input's random errors (such as random noise, offset, mismatches, linearity, gain, drift, etc.) at the summing node where plurality of analog iMULT's input currents are coupled (which are generated via the iDACs). The statistical contribution of such cumulative analog input's random errors, at the summing node, is the square root of the sum of the squares of such random error terms.

Fifth, operating the CMOSFET portion of the circuit in subthreshold enables the disclosed circuits to operate with ultra-low currents, even lower power supplies, and ultra-low power consumption suitable for mobile applications, especially in AI & ML applications near the edge or sensors that run on battery and may require numerous ultra-low current and low voltage supply signal conditioning circuits for computation.

Figure 2B:
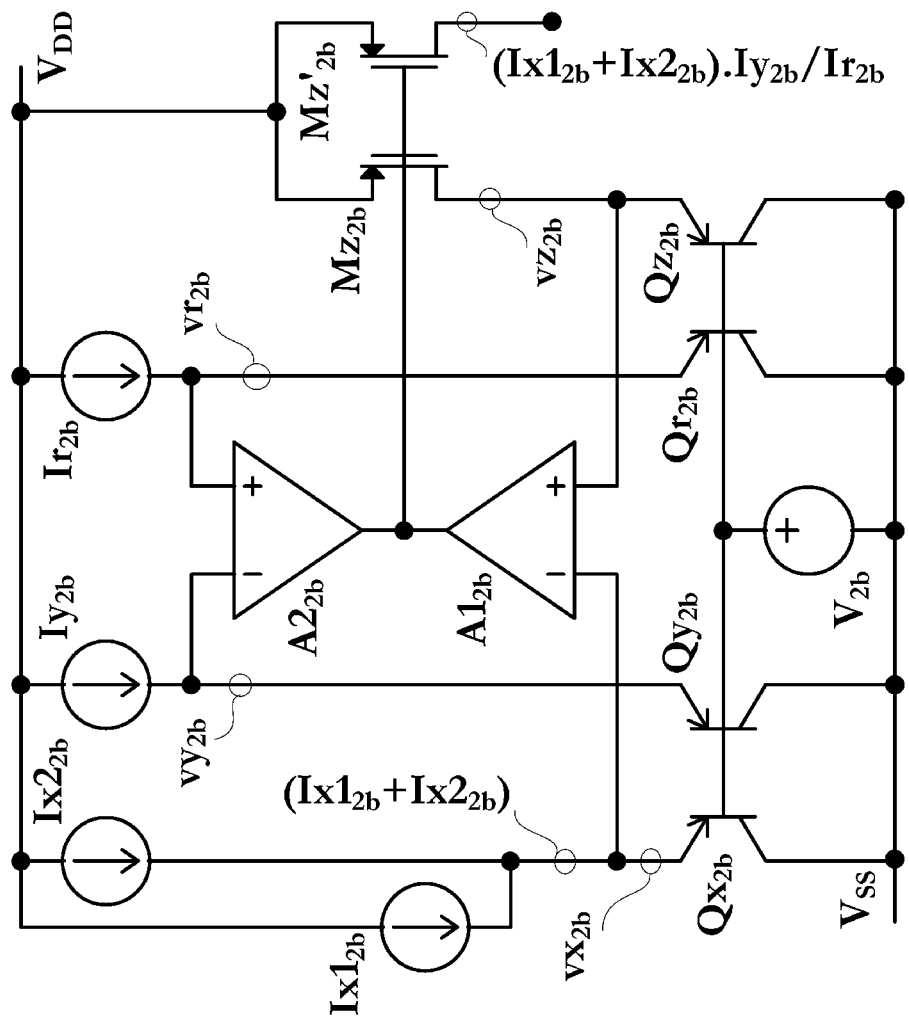
FIG. 2B is a simplified circuit schematic illustrating another analog scalar current-input to current-output multiply-accumulate (siMAC) method.

Section 2B—Description of FIG. 2B

FIG. 2B is a simplified circuit schematic illustrating another analog scalar current-input to current-output multiply-accumulate (siMAC) method.

The disclosed analog siMAC embodiment illustrated in FIG. 2B utilizes the parasitic substrate vertical BJT that's available on digital CMOS process.

The circuit of FIG. 2B is comprising of four BJTs that are $Qx_{2b}$, $Qr_{2b}$, $Qz_{2b}$, and $Qy_{2b}$ wherein each BJT has a collector, base, and emitter ports. The emitters ports of $Qx_{2b}$, $Qr_{2b}$, and $Qy_{2b}$ are the current input terminals of the disclosed analog siMAC, and $Qz_{2b}$'s emitter port carries the output current of the disclosed analog siMAC. The base ports $Qx_{2b}$, $Qr_{2b}$, $Qz_{2b}$, and $Qy_{2b}$ are coupled together and coupled with a voltage source $V_{2b}$.

The $Qx_{2b}$'s emitter port is supplied with a plurality of x-input currents $Ix1_{2b}$, and $Ix2_{2b}$. The sum of the plurality of x-input currents supplied to the $Qx_{2b}$'s emitter is ($Ix1_{2b}$+$Ix2_{2b}$). Be mindful that plurality is 2 inputs for clarity of description in FIG. 2B, but there can be more channel depending on end-application requirement. The $Qr_{2b}$'s emitter port is supplied with a r-input reference current ($Ir_{2b}$), the $Qy_{2b}$'s emitter port is supplied with a y-input current ($Iy_{2b}$), and the $Qz_{2b}$'s emitter port is supplied with a z-output current ($Iz_{2b}$).

Programming equal input-output gains of $g_{2b}$ for $A1_{2b}$ and $A2_{2b}$, the difference between $Qx_{2b}$'s emitter voltage ($vx_{2b}$) and $Qz_{2b}$'s emitter voltage ($vz_{2b}$) is gained by $A1_{2b}$ which generates a $g_{2b} \times (vx_{2b} - vz_{2b})$ signals at its output. Concurrently, the difference between $Qr_{2b}$'s emitter voltage ($vr_{2b}$) and $Qy_{2b}$'s emitter voltage ($vy_{2b}$) is gained by $A2_{2b}$ that generates $g_{2b} \times (vy_{2b} - vr_{2b})$ signal at its output. Combining the output signals of amplifiers $A1_{2b}$ and $A2_{2b}$ generates $g_{2b} \times [(vx_{2b} - vz_{2b}) + (vy_{2b} - vr_{2b})]$ which drives the $Mz_{2b}$'s gate voltage which regulates $Iz_{2b}$, which is the $Qz_{2b}$'s emitter current. The $Iz_{2b}$ regulates $Qz_{2b}$'s emitter, until the combined output signal of amplifiers $A1_{2b}$ and $A2_{2b}$ is balanced.

As such, $g'_{2b} \times [(vx_{2b} - vz_{2b}) + (vy_{2b} - vr_{2b})] \approx vz_{2b}$. Thus, $(vy_{2b} + vx_{2b} - vr_{2b}) \approx vz_{2b}(1 + 1/g'_{2b})$. Assuming that $g'_{2b} \gg 1$ (which represents a combined signal gain through $A1_{2b}$, $A2_{2b}$ and $Mz_{2b}$), then $(vy_{2b} + vx_{2b} - vr_{2b}) \approx vz_{2b}$. Substituting for $vy_{2b} = v_{BE_{Qy_{2b}}}$, $vz_{2b} = v_{BE_{Qz_{2b}}}$, $vx_{2b} = v_{BE_{Qx_{2b}}}$, and $vr_{2b} = v_{BE_{Qr_{2b}}}$ results in the following $$v_{BE_{Qx_{2b}}} - v_{BE_{Qr_{2b}}} =$$
$$v_{BE_{Qz_{2b}}} - v_{BE_{Qy_{2b}}} \approx V_t \times \ln\left[\frac{Ix1_{2b} + Ix2_{2b}}{Ir_{2b}}\right] \approx V_t \times \ln\left[\frac{Iz_{2b}}{Iy_{2b}}\right].$$

Accordingly, the output of siMAC represented by $Iz_{2b} \approx (Ix1_{2b}+Ix2_{2b}) \times Iy_{2b}/Ir_{2b}$.

Note that $Mz'_{2b}$ replicates the z-output current of the analog siMAC by mirroring $Mz_{2b}$'s current, wherein the $Mz_{2b}$–$Mz'_{2b}$ current mirror can be cascaded for improved accuracy and higher output impedance. The bias voltage $V_{2b}$ can be zero or a positive or a negative voltage (to lower the operating voltage supply head-room) depending on end-application requirements.

In addition to the analog siMAC benefits outlined in this disclosure's introduction section titled DETAILED DESCRIPTION, the disclosed analog siMAC illustrated in FIG. 2B has the following benefits:

First, utilizing (a main-stream digital CMOS process that contains) the parasitic BJT is available at no extra manufacturing cost, enables the disclosed analog iMULT to operate with a wider range of input current signals and or for the iMULT (utilized in an siMAC) to receive larger plurality of input current signals.

Second, the disclosed analog siMAC circuit is arranged in a symmetric, matched, and scaled manner. This trait facilitates devices parameters to track each other over process, temperature, and operating condition variations. Accordingly, the disclosed analog siMAC circuit's temperature coefficient and power supply rejection performance can be enhanced.

Third, the disclosed analog siMAC circuit utilizes simple, low cost, and fast summation of the analog iMULT input currents, wherein summation of plurality of analog currents is accomplished by coupling of the analog iMULT input currents.

Fourth, utilizing plurality of analog inputs that are summed at an input of iMULT (to arrange an analog siMAC) would attenuate the statistical contribution of such cumulative analog input's random errors (such as random noise, offset, mismatches, linearity, gain, drift, etc.) at the summing node where plurality of analog iMULT's input currents are coupled (which are generated via the iDACs). The statistical contribution of such cumulative analog input's random errors, at the summing node, is the square root of the sum of the squares of such random error terms.

Fifth, operating the CMOSFET portion of the circuit in subthreshold enables the disclosed circuits to operate with ultra-low currents, even lower power supplies, and ultra-low power consumption suitable for mobile applications, especially in AI & ML applications near the edge or sensor that run on battery and may require numerous ultra-low current and low voltage supply signal conditioning circuits for computation.

Figure 2C:
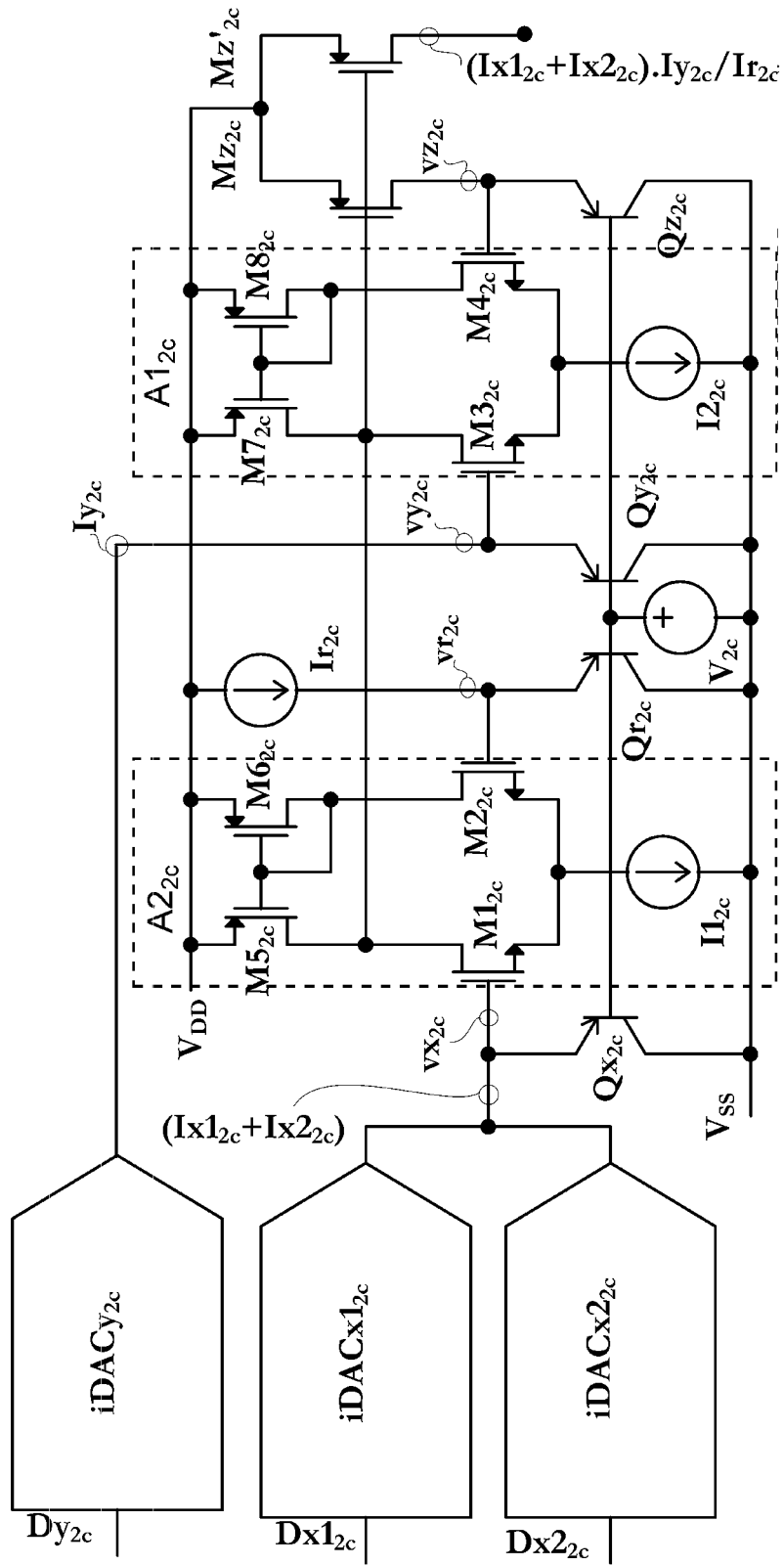
FIG. 2C is a simplified circuit schematic illustrating a current-mode scalar digital-input to current-output multiply-accumulate (siMAC) method.

Section 2C—Description of FIG. 2C

FIG. 2C is a simplified circuit schematic illustrating a current-mode scalar digital-input to current-output multiply-accumulate (siMAC) method.

The disclosed siMAC embodiment illustrated in FIG. 2C utilizes the parasitic substrate vertical BJT that's available on digital CMOS process.

The circuit of FIG. 2C is similar to embodiment disclosed in FIG. 2B, but instead the siMAC of FIG. 2C utilizes current-mode digital-to-analog-converters (iDAC)s generate the siMAC's input currents. Moreover, FIG. 2C's siMAC illustrates transistor level amplifier embodiments to that of FIG. 2B's $A1_{2b}$ and $A2_{2b}$.

The circuit of FIG. 2C is comprising of four BJTs that are $Qx_{2c}$, $Qr_{2c}$, $Qz_{2c}$, and $Qy_{2c}$ wherein each BJT has a collector, base, and emitter ports. The emitters ports of $Qx_{2c}$, $Qr_{2c}$, and $Qy_{2c}$ are the current input terminals of the disclosed siMAC, and $Qz_{2c}$'s emitter port carries the output current of the disclosed siMAC. The base ports $Qx_{2c}$, $Qr_{2c}$, $Qz_{2c}$, and $Qy_{2c}$ are coupled together and coupled with a voltage source $V_{2c}$.

The $Qx_{2c}$'s emitter port is supplied with a plurality of x-input currents (e.g., $Ix1_{2c}$, and $Ix2_{2c}$), which are generated via plurality of iDACs (e.g., $iDACx1_{2c}$, and $iDACx2_{2c}$, respectively). The sum of the plurality of x-input currents is supplied to the $Qx_{2c}$'s emitter is ($Ix1_{2c}+Ix2_{2c}$). Notice that plurality here is 2 inputs (e.g., two iDACs) for clarity of description in FIG. 2C, but there can be more channel depending on end-application requirement. The $Qr_{2c}$'s emitter port is supplied with a r-input reference current ($Ir_{2c}$) which could also be generate via a reference iDAC, the $Qy_{2c}$'s emitter port is supplied with a y-input current ($Iy_{2c}$), and the $Qz_{2c}$'s emitter port is supplied with a z-output current ($Iz_{2c}$).

Be mindful that because of the commutative property of multiplication, the Ix and Iy inputs are interchangeable, which is illustrated in the embodiment of FIG. 2B versus FIG. 2C. An embodiment of FIG. 2B's $A1_{2b}$ is illustrated in FIG. 2C's amplifier $A1_{2c}$ as comprising of FETs $M3_{2c}$, $M4_{2c}$, $M7_{2c}$, $M8_{2c}$ and a current source $I2_{2c}$. Similarly, an embodiment of FIG. 2B's $A2_{2b}$ is illustrated in FIG. 2C's amplifier $A1_{2c}$ as comprising of FETs $M1_{2c}$, $M2_{2c}$, $M5_{2c}$, $M6_{2c}$ and a current source $I1_{2c}$.

Setting aside non-idealities, keep in mind that input-output gain ($g_{2c}$) of $A1_{2c}$ can be designed equal to that of $A2_{2c}$ by programming $A1_{2c}$ and $A2_{2c}$ with identical respective sized FETs and respective current biasing, wherein output ports of the $A1_{2c}$ and $A2_{2c}$ are coupled together.

Programming equal input-output gains of $g_{2c}$ for $A1_{2c}$ and $A2_{2c}$, the difference between $Qy_{2c}$'s emitter voltage ($vy_{2c}$) and $Qz_{2c}$'s emitter voltage ($vz_{2c}$) is gained by $A1_{2c}$ which generates a $g_{2c} \times (vy_{2c}-vz_{2c})$ signals at its output. Concurrently, the difference between $Qr_{2c}$'s emitter voltage ($vr_{2c}$) and $Qx_{2c}$'s emitter voltage ($vx_{2c}$) is gained by $A2_{2c}$ that generates $g_{2c} \times (vx_{2c}-vr_{2c})$ signal at its output. The $Iz_{2c}$, which is the $Qz_{2c}$'s emitter current, is regulated until the combined (coupled) output signals of amplifiers $A1_{2c}$ and $A2_{2c}$ are balanced. The combined (coupled) output signals of amplifiers $A1_{2c}$ and $A2_{2c}$ generate $g_{2c} \times [(vx_{2c}-vr_{2c})+(vy_{2c}-vz_{2c})]$ which drive $Mz_{2c}$'s gate voltage.

As such, $g'_{2c} \times [(vx_{2c}-vr_{2c})+(vy_{2c}-vz_{2c})] \approx vz_{2c}$. Thus, $(vy_{2c}+vx_{2c}-vr_{2c}) \approx vz_{2c} (1+1/g'_{2c})$. Assuming that $g'_{2c} \gg 1$ (which represents a combined signal gain through $A1_{2c}$, $A2_{2c}$ and $Mz_{2c}$), then $(vy_{2c}+vx_{2c}-vr_{2c}) \approx vz_{2c}$. Substituting for $$vy_{2c} = v_{BE_{Qy_{2c}}}, vz_{2c} = v_{BE_{Qz_{2c}}}, vx_{2c} = v_{BE_{Qx_{2c}}}, \text{ and}$$

$$vr_{2c} = v_{BE_{Qr_{2c}}}$$

results in the following:

$$v_{BE_{Qx_{2c}}} - v_{BE_{Qr_{2c}}} =$$
$$v_{BE_{Qz_{2c}}} - v_{BE_{Qy_{2c}}} \approx V_t \times \ln\left[\frac{Ix1_{2c}+Ix2_{2c}}{Ir_{2c}}\right] \approx V_t \times \ln\left[\frac{Iz_{2c}}{Iy_{2c}}\right].$$

Accordingly, the output of the siMAC represented by $Iz_{2c}$ $(Ix1_{2c}+Ix2_{2c}) \times Iy_{2c}/Ir_{2c}$.

Note that $Mz'_{2c}$ replicates the z-output current of the analog siMAC by mirroring $Mz_{2c}$'s current, wherein the $Mz_{2c}$-$Mz'_{2c}$ current mirror can be cascaded for improved accuracy and higher output impedance. The bias voltage $V_{2c}$ can be zero or a positive or a negative voltage (to lower the operating voltage supply head-room) depending on end-application requirements.

In addition to the analog siMAC benefits outlined in this disclosure's introduction section titled DETAILED DESCRIPTION, the disclosed analog iMULT illustrated in FIG. 2C has the following benefits:

First, utilizing (a main-stream digital CMOS process that contains) the parasitic BJT that are available at no extra manufacturing cost, enables the disclosed analog iMULT to operate with a wider range of input current signals and or for the iMULT (utilized in an siMAC) to receive larger plurality of input current signals.

Second, amplifiers $A1_{2c}$ and $A2_{2c}$ can each be arranged with equal gains utilizing two identical and simple 5 FETs (including the current source) transconductance amplifiers whose outputs are coupled together. As such, $A1_{2c}$ and $A2_{2c}$ occupy a small die area.

Third, input currents to the siMAC can be generated by iDACs, which would retain similar benefits to that of the current mode iMULT and siMAC outlined in this disclosure's introduction section titled DETAILED DESCRIPTION. Moreover, utilizing iDAC would enable inputting digital codes into the siMAC to facilitate seamless interface with digital-signal-processing for hybrid analog-digital AI & ML applications, amongst others.

Fourth, the disclosed analog siMAC circuit is arranged in a symmetric, matched, and scaled manner. This trait facilitates devices parameters to track each other over process, temperature, and operating condition variations. Accordingly, the disclosed analog siMAC circuit's temperature coefficient and power supply rejection performance can be enhanced.

Fifth, the disclosed analog siMAC circuit utilizes simple, low cost, and fast summation of the analog iMULT input currents, wherein summation of plurality of analog currents is accomplished by coupling of the analog iMULT input currents, which are generated via the iDACs.

Sixth, utilizing plurality of analog inputs that are summed at an input of iMULT (to arrange an analog siMAC) would attenuate the statistical contribution of such cumulative analog input's random errors (such as random noise, offset, mismatches, linearity, gain, drift, etc.) at the summing node where plurality of analog iMULT's input currents are coupled (which are generated via the iDACs). The statistical contribution of such cumulative analog input's random errors, at the summing node, is the square root of the sum of the squares of such random error terms.

Sixth, operating the CMOSFET portion of the circuit in subthreshold enables the disclosed circuits to operate with ultra-low currents, even lower power supplies, and ultra-low power consumption suitable for mobile applications, especially in AI & ML applications near the edge or sensors that operate with battery and may require numerous ultra-low current and low voltage supply signal conditioning circuits for computation.

Figure 2D:
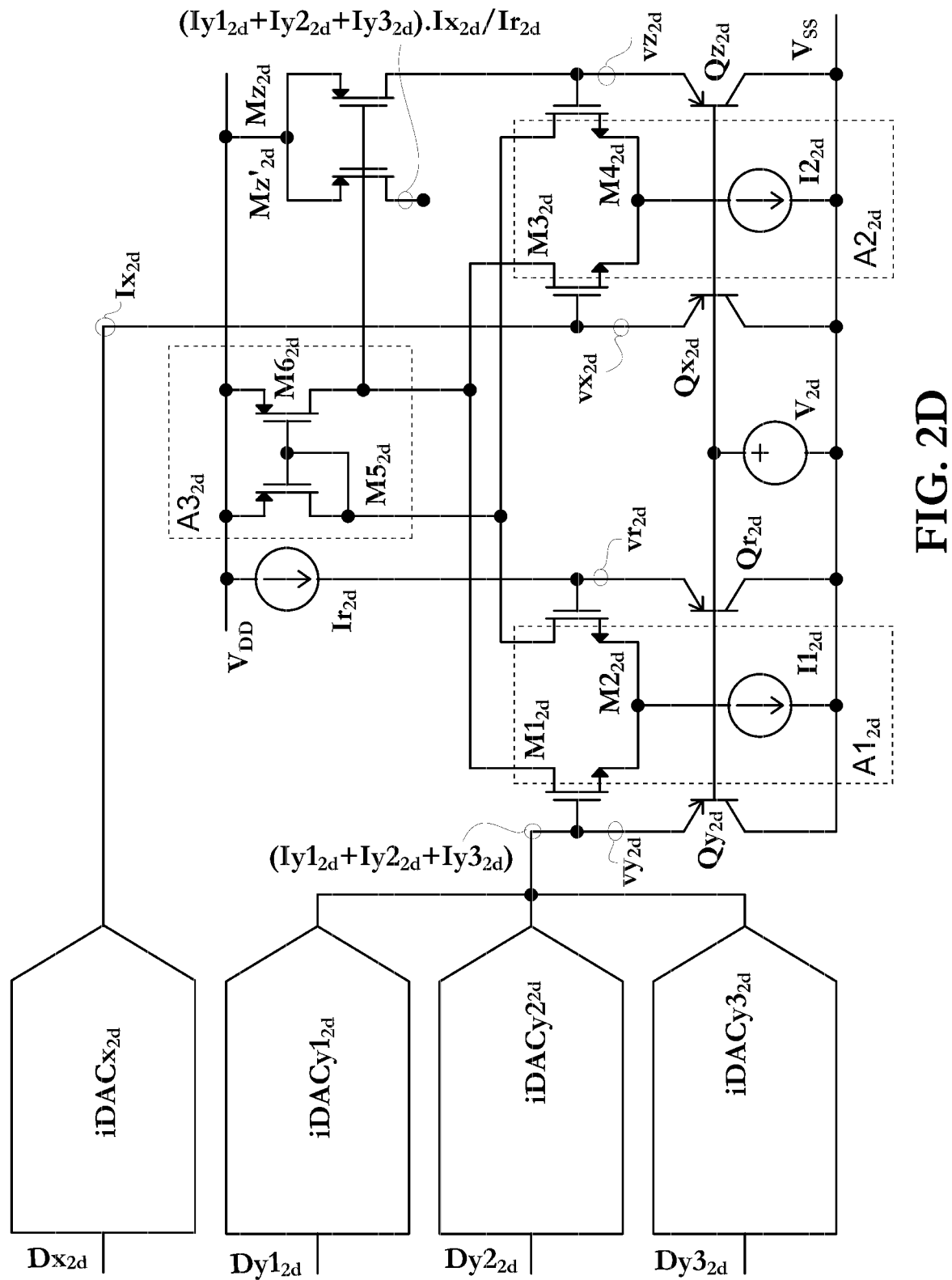
FIG. 2D is a simplified circuit schematic illustrating another current-mode scalar digital-input to current-output multiply-accumulate (siMAC) method.

Section 2D—Description of FIG. 2D

FIG. 2D is a simplified circuit schematic illustrating another current-mode scalar digital-input to current-output multiply-accumulate (siMAC) method.

The disclosed siMAC embodiment illustrated in FIG. 2D utilizes the parasitic substrate vertical BJT that's available on digital CMOS process.

The circuit of FIG. 2D is similar to embodiment disclosed in FIG. 2A, but instead the siMAC of FIG. 2D utilizes current-mode digital-to-analog-converters (iDAC)s generate the siMAC's input currents. Moreover, FIG. 2D's siMAC illustrates transistor level amplifier embodiments to that of FIG. 2A's $A1_{2a}$, $A2_{2a}$, and $A3_{2a}$.

The circuit of FIG. 2D is comprising of four BJTs that are $Qx_{2d}$, $Qr_{2d}$, $Qz_{2d}$, and $Qy_{2d}$ wherein each BJT has a collector, base, and emitter ports. The emitters ports of $Qx_{2d}$, $Qr_{2d}$, and $Qy_{2d}$ are the current input terminals of the disclosed siMAC, and $Qz_{2e}$'s emitter port carries the output current of the disclosed siMAC. The base ports $Qx_{2d}$, $Qr_{2d}$, $Qz_{2d}$, and $Qy_{2d}$ are coupled together and coupled with a voltage source $V_{2d}$. The $Qy_{2d}$'s emitter port is supplied with a plurality of y-input currents $Iy1_{2d}$ (generated via $iDACy1_{2d}$), $Iy2_{2d}$ (generated via $iDACy2_{2d}$), and $Iy3_{2d}$ (generated via $iDACy3_{2d}$). The sum of the plurality of y-input currents generated via the three iDACs to the $Qy_{2d}$'s emitter is $(Iy1_{2d}+Iy2_{2d}+Iy3_{2d})$.

Be mindful that plurality is 3 inputs for clarity of description in FIG. 2D, but there can be more channel depending on end-application requirement.

The $Qr_{2d}$'s emitter port is supplied with a r-input reference current $(Ir_{2d})$, which can be also be supplied by a reference iDAC. The $Qx_{2d}$'s emitter port is supplied with a x-input current $(Ix_{2d})$, which can be also be supplied by a reference iDAC. The $Qz_{2d}$'s emitter port is supplied with a z-output current $(Iz_{2d})$.

Be mindful that because of the commutative property of multiplication, the Ix and Iy inputs are interchangeable, which is illustrated in the embodiment of FIG. 2A versus FIG. 2D. An embodiment of FIG. 2A's $A1_{2a}$ is illustrated in FIG. 2D's amplifier $(A1_{2d})$ comprising of FETs $M1_{2d}$, $M2_{2d}$ and a current source $I1_{2d}$. An embodiment of FIG. 2A's $A2_{2a}$ is illustrated in FIG. 2D's amplifier $(A2_{2d})$ comprising of FETs $M3_{2d}$, $M4_{2d}$ and a current source $I2_{2d}$. An embodiment of FIG. 2A's $A3_{2a}$ is illustrated in FIG. 2D's amplifier $(A3_{2d})$ comprising of FETs $M5_{2d}$ and $M6_{2d}$.

Setting aside non-idealities, keep in mind that input-output gain $(g_{2d})$ of $A1_{2d}$ can be designed equal to that of $A2_{2d}$ by programming $A1_{2d}$ and $A2_{2d}$ with identical respective size of FETs and respective current biasing, wherein the respective differential output ports of the $A1_{2d}$ and $A2_{2d}$ are coupled together. Accordingly, a summed differential signal (generated the $A1_{2d}$ and $A2_{2d}$) is fed onto the inputs of amplifier $A3_{2d}$ (comprising of $M5_{2d}$ and $M6_{2d}$) whose output drives the gate ports of $Mz_{2d}$, and $Mz'_{2d}$.

Programming equal input-output gains of $g'_{2d}$ for $A1_{2d}$, $A2_{2d}$, and $A3_{2d}$, the difference between $Qr_{2d}$'s emitter voltage $(vr_{2d})$ and $Qy_{2d}$'s emitter voltage $(vy_{2d})$ is gained by $A1_{2d}$ which generates $g'_{2d} \times (vy_{2d}-vr_{2d})$ as differential signals at its outputs. Concurrently, the difference between $Qz_{2d}$'s emitter voltage $(vz_{2d})$ and $Qx_{2d}$'s emitter voltage $(vx_{2d})$ is gained by $A2_{2d}$ that generates $g'_{2d} \times (vx_{2d}-vz_{2d})$ as differential signals at its outputs. The differential output signals of amplifiers $A1_{2d}$ and $A2_{2d}$ are combined to generates $g''_{2d} \times [(vy_{2d}-vr_{2d})+(vx_{2d}-vz_{2d})]$ differential signals, which are coupled to the inputs of the amplifier $A3_{2d}$ (comprising of $M5_{2d}$ and $M6_{2d}$). The output port of $A3_{2d}$ drives $Mz_{2d}$'s gate voltage which generates enough $Iz_{2d}$ to regulate $Qz_{2d}$'s emitter port, until the $A3_{2d}$'s inputs are substantially balanced.

As such, $g_{2d} \times [(vx_{2d}-vz_{2d})+(vy_{2d}-vr_{2d})] \approx vz_{2d}$. Thus, $(vy_{2d}+vx_{2d}-vr_{2d}) \approx vz_{2d} (1+1/g_{2d})$. Assuming that $g_{2d} \gg 1$ (which represents a combined signal gain through $A1_{2d}$, $A2_{2d}$, $A3_{2d}$ and $Mz_{2d}$), then $(vy_{2d}+vx_{2d}-vr_{2d}) \approx vz_{2d}$. Substituting for $$vy_{2d} = v_{BE_{Qy_{2d}}}, vz_{2d} = v_{BE_{Qz_{2d}}}, vx_{2d} = v_{BE_{Qx_{2d}}}, \text{and}$$

$$vr_{2d} = v_{BE_{Qr_{2d}}}$$

results in the following:

$$v_{BE_{Qx_{2d}}} - v_{BE_{Qr_{2d}}} =$$
$$v_{BE_{Qz_{2d}}} - v_{BE_{Qy_{2d}}} \approx V_t \times \ln\left[\frac{Iy1_{2d} + Iy2_{2d} + Iy3_{2d}}{Ir_{2d}}\right] \approx V_t \times \ln\left[\frac{Iz_{2d}}{Ix_{2d}}\right].$$

Accordingly, the output of siMAC represented by $Iz_{2d} \approx (Iy1_{2d}+Iy2_{2d}+Iy3_{2d}) \times Ix_{2d}/Ir_{2d}$.

Notice that $Mz'_{2d}$ replicates the z-output current of the analog siMAC by mirroring $Mz_{2d}$'s current, wherein the $Mz_{2d}$-$Mz'_{2d}$ current mirror can be cascaded for improved accuracy and higher output impedance. The bias voltage $V_{2d}$ can be zero or a positive or a negative voltage (to lower the operating voltage supply head-room) depending on end-application requirements.

In addition to the analog siMAC benefits outlined in this disclosure's introduction section titled DETAILED DESCRIPTION, the disclosed siMAC illustrated in FIG. 2D has the following benefits:

First, utilizing (a main-stream digital CMOS process that contains) the parasitic BJT that is available at no extra manufacturing cost, enables the disclosed analog iMULT to operate with a wider range of input current signals and or for the iMULT (utilized in the siMAC) to receive larger plurality of input current signals.

Second, amplifiers $A1_{2d}$, $A2_{2d}$, and $A3_{2d}$ can be arranged with simple 2 FETs amplifiers. As such, $A1_{2d}$, $A2_{2d}$, and $A3_{2d}$ occupy a small die area.

Third, input currents to the siMAC can be generate with iDACs, which would retain similar benefits to that of the current mode iMULT and siMAC outlined in this disclosure's introduction section titled DETAILED DESCRIPTION. Moreover, utilizing iDAC would enable inputting digital codes into the siMAC to facilitate interface with digital-signal-processing for hybrid analog-digital AI & ML applications, amongst others.

Fourth, the disclosed analog siMAC circuit is arranged in a symmetric, matched, and scaled manner. This trait facilitates devices parameters to track each other over process, temperature, and operating condition variations. Accordingly, the disclosed analog siMAC circuit's temperature coefficient and power supply rejection performance can be enhanced.

Fifth, the disclosed analog siMAC circuit utilizes simple, low cost, and fast summation of the analog iMULT input currents, wherein summation of plurality of analog currents is accomplished by coupling of the analog iMULT input currents, which are generated via the iDACs.

Sixth, utilizing plurality of analog inputs that are summed at an input of iMULT (to arrange an analog siMAC) would attenuate the statistical contribution of such cumulative analog input's random errors (such as random noise, offset, mismatches, linearity, gain, drift, etc.) at the summing node where plurality of analog iMULT's input currents are coupled (which are generated via the iDACs). The statistical contribution of such cumulative analog input's random errors, at the summing node, is the square root of the sum of the squares of such random error terms.

Seventh, operating the CMOSFET portion of the circuit in subthreshold enables the disclosed circuits to operate with ultra-low currents, even lower power supplies, and ultra-low power consumption suitable for mobile applications, especially in AI & ML applications at or near edge and sensors that run on battery and may require numerous ultra-low current and low voltage supply signal conditioning circuits for computation.

Figure 2E:
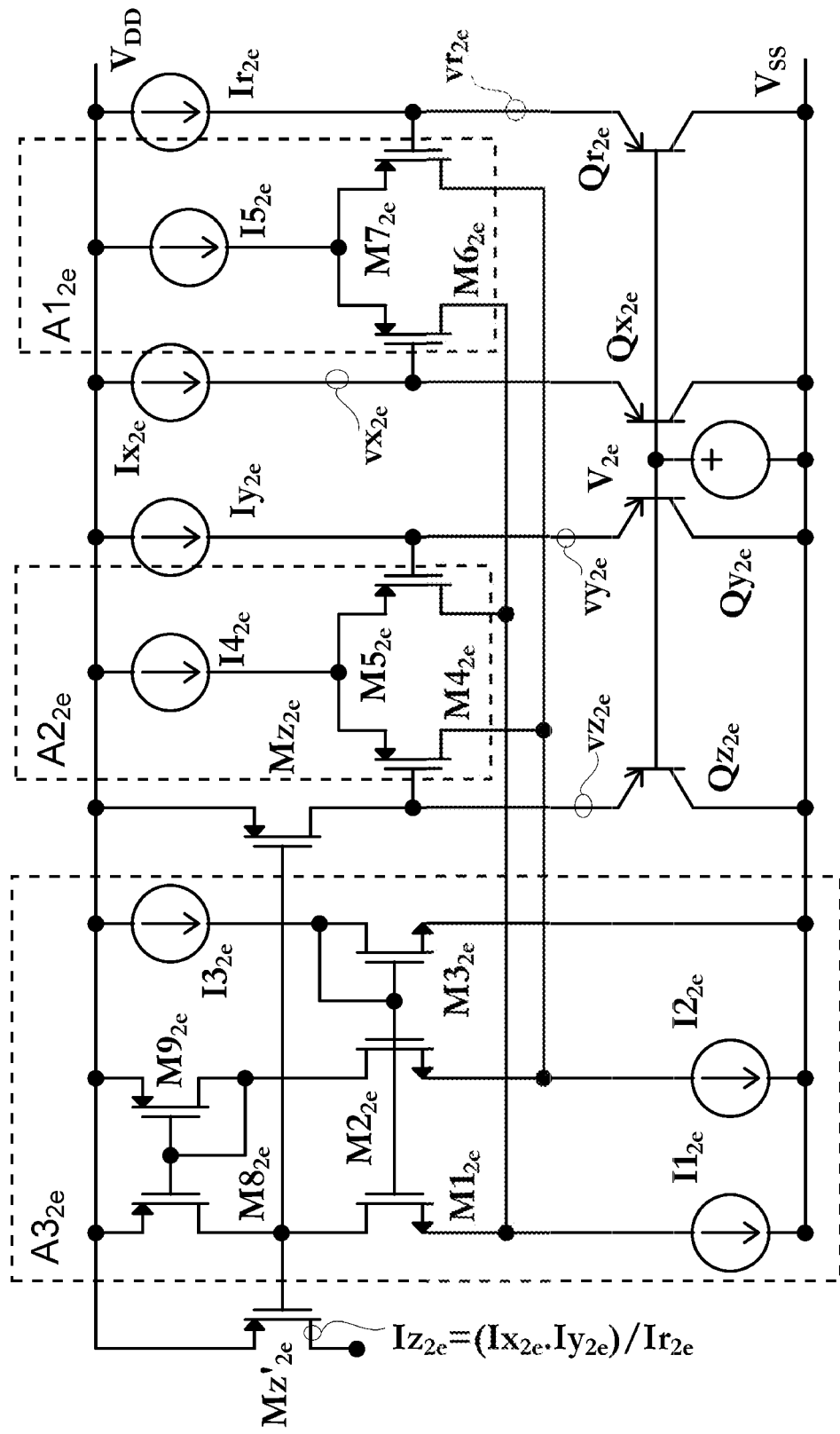
FIG. 2E is a simplified circuit schematic illustrating another analog current-input to current-output multiplication (iMULT) method.

Section 2E—Description of FIG. 2E

FIG. 2E is a simplified circuit schematic illustrating another analog scalar current-input to current-output multiplication (iMULT) method.

The disclosed analog iMULT embodiment illustrated in FIG. 2E utilizes the parasitic substrate vertical BJT that's available on digital CMOS process.

The circuit of FIG. 2E's amplifiers are ground-sensing which improves performance when the disclosed analog iMULT input current signals are near zero.

The circuit of FIG. 2E is comprising of four BJTs that are $Qx_{2e}$, $Qr_{2e}$, $Qz_{2e}$, and $Qy_{2e}$ wherein each BIT has a collector, base, and emitter ports. The emitters ports of $Qx_{2e}$, $Qr_{2e}$, and $Qy_{2e}$ are the current input terminals of the disclosed siMAC, and $Qz_{2e}$'s emitter port carries the output current of the disclosed analog iMUL. The base ports $Qx_{2e}$, $Qr_{2a}$, $Qz_{2d}$, and $Qy_{2d}$ are coupled together and coupled with a voltage source $V_{2e}$. The $Qx_{2e}$'s emitter port is supplied with a x-input currents $Ix_{2e}$. The $Qr_{2e}$'s emitter port is supplied with a r-input reference current ($Ir_{2e}$). The $Qy_{2e}$'s emitter port is supplied with a y-input current ($Iy_{2e}$). The $Qz_{2e}$'s emitter port is supplied with a z-output current ($Iz_{2e}$).

Be mindful that because of the commutative property of multiplication, the Ix and Iy inputs are interchangeable, which is illustrated in the embodiment of FIG. 2E versus FIG. 2D.

In FIG. 2E's amplifier $A2_{2e}$ is comprising of FETs $M4_{2e}$, $M5_{2e}$ and a current source $I4_{2e}$, amplifier $A1_{2e}$ comprising of FETs $M6_{2e}$, $M7_{2e}$ and a current source $I5_{2e}$, and amplifier $A3_{2e}$ is comprising of FETs $M1_{2e}$, $M2_{2e}$, $M3_{2e}$, $M8_{2e}$, $M9_{2e}$ and current sources $I1_{2e}$, $I2_{2e}$, and $I3_{2e}$.

Setting aside non-idealities, note that input-output gain ($g_{2e}$) of $A1_{2e}$ can be designed equal to that of $A2_{2e}$ by programming $A1_{2e}$ and $A2_{2e}$ with identical respective W/L sizes of FETs and respective current biasing, wherein the respective differential output ports of the $A1_{2e}$ and $A2_{2e}$ are coupled together. Accordingly, a summed differential signal (generated by the $A1_{2e}$ and $A2_{2e}$) is fed onto the inputs of amplifier $A3_{2e}$ whose output drives the gate ports of $Mz_{2e}$ and $Mz'_{2e}$.

Programming equal input-output gains of $g'_{2e}$ for $A1_{2e}$ and $A2_{2e}$, the difference between $Qr_{2e}$'s emitter voltage ($vr_{2e}$) and $Qx_{2e}$'s emitter voltage ($vx_{2e}$) is gained by $A1_{2e}$ which generates $g'_{2e} \times (vx_{2e}-vr_{2e})$ as differential signals at its outputs. Concurrently, the difference between $Qz_{2e}$'s emitter voltage ($vz_{2e}$) and $Qy_{2e}$'s emitter voltage ($vy_{2e}$) is gained by $A2_{2e}$ that generates $g'_{2e} \times (vy_{2d}-vz_{2d})$ as differential signals at its outputs. The differential output signals of amplifiers $A1_{2e}$ and $A2_{2e}$ are combined to generates $g''_{2e} \times [(vx_{2e}-vr_{2e})+(vy_{2e}-vz_{2e})]$ differential signals, which are coupled to the inputs of the amplifier $A3_{2e}$ (comprising of $M1_{2e}$, $M2_{2e}$, $M3_{2e}$, $M8_{2e}$, $M9_{2e}$ and current sources $I1_{2e}$, $I2_{2e}$, and $I3_{2e}$). The output port of $A3_{2e}$ drives $Mz_{2e}$'s gate voltage which generates enough $Iz_{2e}$ to regulate $Qz_{2e}$'s emitter port, until the $A3_{2e}$'s inputs are substantially balanced.

As such, $g_{2e} \times [(vy_{2e}-vz_{2e})+(vx_{2e}-vr_{2e})] \approx vz_{2e}$. Thus, $(vy_{2e}+vx_{2e}-vr_{2e}) \approx vz_{2e}(1+1/g_{2e})$. Assuming that $g_{2e} \gg 1$ (which represents a combined signal gain through $A1_{2e}$, $A2_{2e}$, $A3_{2e}$ and $Mz_{2e}$), then $(vy_{2e}-vx_{2e}-vr_{2e}) \approx vz_{2e}$. Substituting for $$vy_{2e} = v_{BE_{Qy_{2e}}}, vz_{2e} = v_{BE_{Qz_{2e}}}, vx_{2e} = v_{BE_{Qx_{2e}}}, \text{ and}$$

$$vr_{2e} = v_{BE_{Qr_{2e}}}$$

results in the following:

$$v_{BE_{Qx_{2e}}} - v_{BE_{Qr_{2e}}} = v_{BE_{Qz_{2e}}} - v_{BE_{Qy_{2e}}} \approx V_t \times \ln\left[\frac{Ix_{2e}}{Ir_{2e}}\right] \approx V_t \times \ln\left[\frac{Iz_{2e}}{Iy_{2e}}\right].$$

Accordingly, the output of iMULT represented by $Iz_{2e} \approx Ix_{2e} \times Iy_{2e}/Ir_{2e}$.

Note that $Mz'_{2e}$ replicates the z-output current of the analog iMULT by mirroring $Mz_{2e}$'s current, wherein the $Mz_{2e}$–$Mz'_{2e}$ current mirror can be cascaded for improved accuracy and higher output impedance. The bias voltage $V_{2e}$ can be zero or a positive or a negative voltage (to lower the operating voltage supply head-room) depending on end-application requirements.

In addition to the analog iMULT benefits outlined in this disclosure's introduction section titled DETAILED DESCRIPTION, the disclosed iMULT illustrated in FIG. 2E has the following benefits:

First, utilizing (a main-stream digital CMOS process that contains) the parasitic BJT that are available at no extra manufacturing cost, enables the disclosed analog iMULT to operate with a wider range of input current signals and or for the iMULT (utilized in an siMAC) to receive larger plurality of input current signals.

Second, amplifiers $A1_{2e}$, $A2_{2e}$ are ground sensing which improves the analog iMULT performance near-zero current input signals.

Third, amplifiers $A1_{2e}$, $A2_{2e}$, and $A3_{2e}$ can be arranged with simple 2 to 4 FETs amplifiers. As such, $A1_{2e}$, $A2_{2e}$, and $A3_{2e}$ occupy a small die area.

Fourth, the disclosed analog iMULT circuit is arranged in a symmetric, matched, and scaled manner. This trait facilitates devices parameters to track each other over process, temperature, and operating condition variations. Accordingly, the disclosed analog iMULT circuit's temperature coefficient and power supply rejection performance can be enhanced.

Fifth, operating the CMOSFET portion of the circuit in subthreshold enables the disclosed circuits to operate with ultra-low currents, even lower power supplies, and ultra-low power consumption suitable for mobile applications, especially in AI & ML applications near or at the edge and sensors that run on battery and may require numerous ultra-low current and low voltage supply signal conditioning circuits for computation.

Figure 3A:
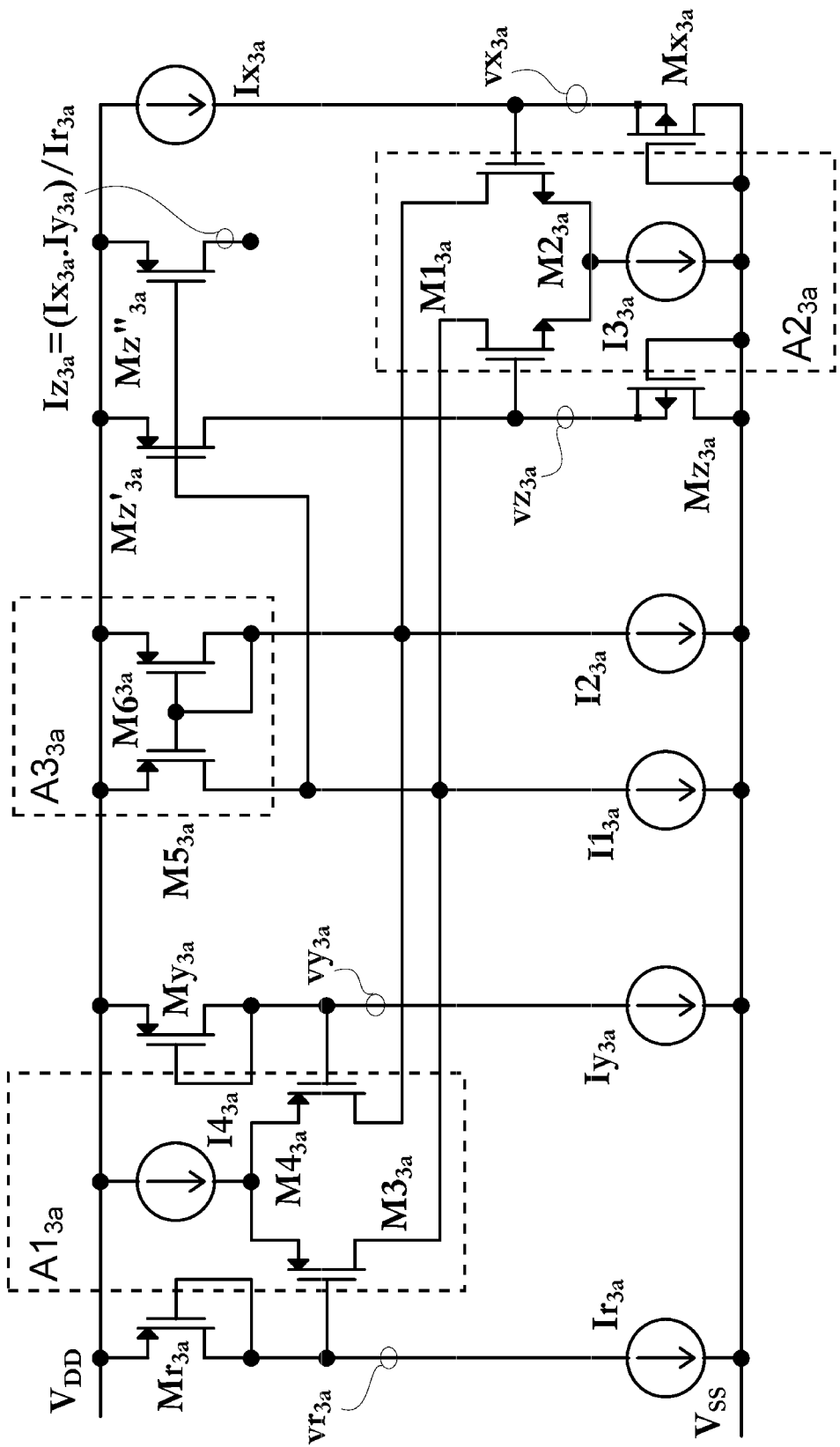
FIG. 3A is a simplified circuit schematic illustrating another analog current-input to current-output multiplier (iMULT) method.

Section 3A—Description of FIG. 3A

FIG. 3A is a simplified circuit schematic illustrating another analog current-input to current-output multiplier (iMULT) method.

The circuit of FIG. 3A utilizes diode-connected PMOSFETs that operate in the subthreshold region, and as such their input-voltage to output-current transfer-function follows a pseudo-exponential profile.

The circuit of FIG. 3A is comprising of four diode-connected subthreshold PMOSFETs that are $Mx_{3a}$, $Mr_{3a}$, $Mz_{3a}$, and $My_{3a}$ wherein each PMOSFET has a drain, gate, and source ports. The drain-gate ports of $Mr_{3a}$ and $My_{3a}$, and the source port of $Mx_{3a}$ are the current input terminals of the disclosed analog iMULT, and $Mz_{3a}$'s source port carries the output current of the disclosed analog iMULT.

The $Mx_{3a}$'s source port is supplied with a x-input currents $Ix_{3a}$. The $Mr_{3a}$'s gate-drain port is supplied with a r-input reference current ($Ir_{3a}$). The $My_{3a}$'s gate-drain port is supplied with a y-input current ($Iy_{3a}$). The $Mz_{3a}$'s source port is supplied with a z-output current ($Iz_{3a}$).

In FIG. 3A's amplifier $A1_{3a}$ is comprising of FETs $M3_{3a}$, $M4_{3a}$ and a current source $I1_{3a}$, amplifier $A2_{3a}$ comprising of FETs $M1_{3a}$, $M2_{3a}$ and a current source $I3_{3a}$, and amplifier $A3_{3a}$ is comprising of FETs $M5_{3a}$ and $M6_{3a}$.

Setting aside non-idealities, keep in mind that input-output gain of $A1_{3a}$ can be designed equal to that of $A2_{3a}$ by programming $A1_{3a}$ and $A2_{3a}$ with identical respective W/L sizes of FETs and respective current biasing, wherein the respective differential output ports of the $A1_{3a}$ and $A2_{3a}$ are coupled together. Accordingly, a summed differential signal (generated by the $A1_{3a}$ and $A2_{3a}$) is fed onto the inputs of amplifier $A3_{3a}$ whose output drives the gate ports of $Mz'_{3a}$ and $Mz''_{3a}$.

Programming equal input-output gains of $g'_{3a}$ for $A1_{3a}$ and $A2_{3a}$, the difference between $Mr_{3a}$'s gate-drain port voltage ($vr_{3a}$) and $My_{3a}$'s gate-drain port voltage ($vy_{3a}$) is gained by $A1_{3a}$ which generates $g'_{3a} \times (vy_{3a} - vr_{3a})$ as differential signals at its outputs. Concurrently, the difference between $Mz_{3a}$'s source port voltage ($vz_{3a}$) and $Mx_{3a}$'s source port voltage ($vx_{3a}$) is gained by $A2_{3a}$ that generates $g'_{3a} \times (vx_{3a} \ vz_{3a})$ as differential signals at its outputs. The differential output signals of amplifiers $A1_{3a}$ and $A2_{3a}$ are combined to generates $g''_{3a} \times [(vy_{3a} - vr_{3a}) + (vx_{3a} - vz_{3a})]$ differential signals, which are coupled to the inputs of the amplifier $A3_{3a}$ (comprising of $M5_{3a}$, $M6_{3a}$). The output port of $A3_{3a}$ drives $Mz'_{3a}$'s gate voltage which generates enough $Iz_{3a}$ to regulate $Mz_{3a}$'s source port, until the $A3_{3a}$'s inputs are substantially balanced.

As such, $g_{3a} + [(vx_{3a} - vz_{3a}) + (vy_{3a} - vr_{3a})] \approx vz_{3a}$. Thus, $(vy_{3a} + vx_{3a} - vr_{3a}) \approx vz_{3a} (1 + 1/g_{3a})$. Assuming that $g_{3a} \gg 1$ (which represents a combined signal gain through $A1_{3a}$, $A2_{3a}$, $A3_{3a}$ and $Mz'_{3a}$), then $(vy_{3a} + vx_{3a} - vr_{3a}) \approx vz_{3a}$. Substituting for $$vy_{3a} = v_{BE_{Qy_{3a}}}, vz_{3a} = v_{BE_{Qz_{3a}}}, vx_{3a} = v_{BE_{Qx_{3a}}}, \text{ and}$$

$$vr_{3a} = v_{BE_{Qr_{3a}}}$$

results in the following:

$$v_{BE_{Qx_{3a}}} - v_{BE_{Qr_{3a}}} = v_{BE_{Qz_{3a}}} - v_{BE_{Qy_{3a}}} \approx V_t \times \ln\left[\frac{Ix_{3a}}{Ir_{3a}}\right] \approx V_t \times \ln\left[\frac{Iz_{3a}}{Iy_{3a}}\right].$$

Accordingly, the output of iMULT represented by $Iz_{3a} \approx Ix_{3a} \times Iy_{3a}/Ir_{3a}$.

Notice that $Mz''_{3a}$ replicates the z-output current of the analog iMULT by mirroring $Mz'_{3a}$'s current, wherein the $Mz''_{3a}$–$Mz'_{3a}$ current mirror can be cascaded for improved accuracy and higher output impedance.

In addition to the analog iMULT benefits outlined in this disclosure's introduction section titled DETAILED DESCRIPTION, the disclosed iMULT illustrated in FIG. 3A has the following benefits:

First, operating the CMOSFETs in subthreshold enables the disclosed analog iMULT circuits to operate with ultra-low currents, even lower power supplies, and ultra-low power consumption suitable for mobile applications, especially in AI & ML applications near or at the edge or sensor that run on battery and may require numerous ultra-low current and low voltage supply analog iMULT circuits for computation.

Second, amplifiers $A1_{3a}$, $A2_{3a}$, and $A3_{3a}$ can be arranged with simple 2 to 3 FETs amplifiers. As such, $A1_{3a}$, $A2_{3a}$, and $A3_{3a}$ occupy a small die area.

Third, the disclosed analog iMULT circuit is arranged in a symmetric, matched, and scaled manner. This trait facilitates devices parameters to track each other over process, temperature, and operating condition variations. Accordingly, the disclosed analog iMULT circuit's temperature coefficient and power supply rejection performance can be enhanced.

Fourth, given its' complementary configuration, the disclosed iMULT's output current has the flexibility of being sourced or sunk. The $Iz_{3b}$ and $Ir_{3b}$ can be swapped (utilizing respective PMOSFETs or NMOSFETs for $Mz''_{3b}$–$Mz'_{3b}$) to arrange the iMULT's output to sink or source current with flexibility.

Figure 3B:
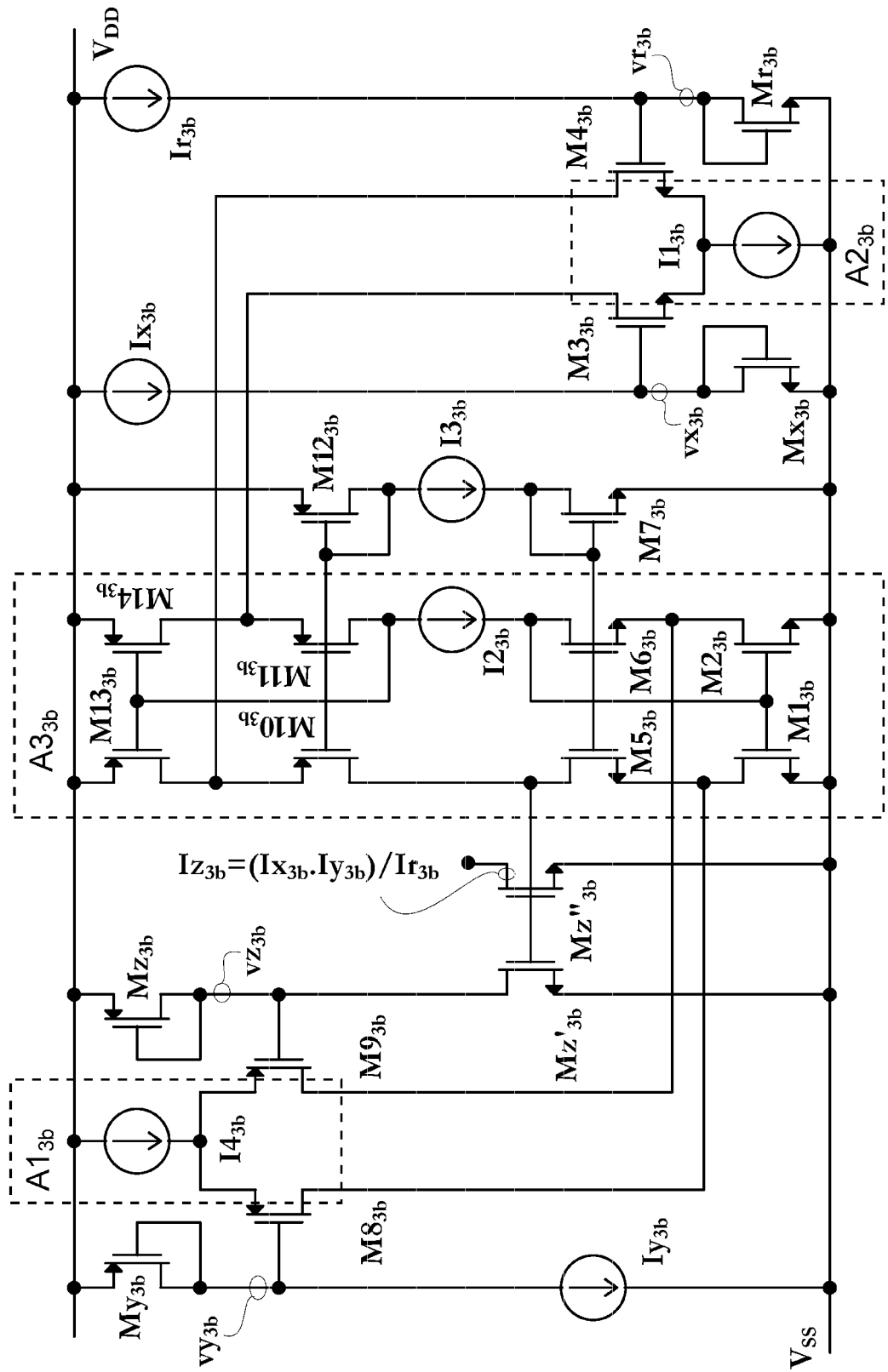
FIG. 3B is a simplified circuit schematic illustrating another analog current-input to current-output multiplier (iMULT) method.

Section 3B—Description of FIG. 3B

FIG. 3B is a simplified circuit schematic illustrating another analog current-input to current-output multiplier (iMULT) method.

The circuit of FIG. 3B utilizes diode-connected CMOSFETs that operate in the subthreshold region, and as such their input-voltage to output-current transfer-function follows a pseudo-exponential profile.

The circuit of FIG. 3B is comprising of four diode-connected subthreshold CMOSFETs that are $Mx_{3b}$, $Mr_{3b}$, $Mz_{3b}$, and $My_{3b}$ wherein each CMOSFET has a drain, gate, and source ports. The drain-gate ports of $Mx_{3b}$, $Mr_{3b}$, and $My_{3b}$ are the current input terminals of the disclosed analog iMULT, and $Mz_{3b}$'s drain-gate port carries the output current of the disclosed analog iMULT.

The $Mx_{3b}$'s drain-gate port is supplied with a x-input currents $Ix_{3b}$. The $Mr_{3b}$'s gate-drain port is supplied with a r-input reference current ($Ir_{3b}$). The $My_{3b}$'s gate-drain port is supplied with a y-input current ($Iy_{3b}$). The $Mz_{3b}$'s drain-gate port is supplied with a z-output current ($Iz_{3b}$).

In FIG. 3B's amplifier $A1_{3b}$ is comprising of FETs $M8_{3b}$, $M9_{3b}$ and a current source $I4_{3b}$, amplifier $A2_{3b}$ comprising of FETs $M3_{3b}$, $M4_{3b}$ and a current source $I1_{3b}$, and amplifier $A3_{3b}$ is comprising of FETs $M1_{3b}$, $M2_{3b}$, $M5_{3b}$, $M6_{3b}$, $M10_{3b}$, $M11_{3b}$, $M13_{3b}$, and $M14_{3b}$, which is a folded-cascode-transconductance-amplifier (FCTA), plus a current source $I2_{3b}$. Note also that FETs $M7_{3b}$ and $M12_{3b}$ and current source $I3_{3b}$ bias the FCTA's cascoded current mirrors, that can be shared with other (plurality of) iMULTs on the same chip.

Setting aside non-idealities, be mindful that input-output gain of $A1_{3b}$ can be designed equal to that of $A2_{3b}$ by programming $A1_{3b}$ and $A2_{3b}$ with identical respective W/L sizes of FETs and respective current biasing, wherein the respective differential output ports of the $A1_{3b}$ and $A2_{3b}$ are coupled together. Accordingly, a summed differential signal (generated by the $A1_{3b}$ and $A2_{3b}$) is fed onto the inputs of amplifier $A3_{3b}$ whose output drives the gate ports of $Mz'_{3b}$ and $Mz''_{3b}$.

Programming equal input-output gains of $g'_{3b}$ for $A1_{3b}$ and $A2_{3b}$, the difference between $Mz_{3b}$'s gate-drain port voltage ($vz_{3b}$) and $My_{3b}$'s gate-drain port voltage ($vy_{3b}$) is gained by $A1_{3b}$ which generates $g'_{3b} \times (vy_{3b} - vz_{3b})$ as differential signals at its outputs. Concurrently, the difference between $Mr_{3a}$'s gate-drain port voltage ($vr_{3b}$) and $Mx_{3b}$'s gate-drain port voltage ($vx_{3b}$) is gained by $A2_{3b}$ that generates $g'_{3b} \times (vx_{3b} - vr_{3b})$ as differential signals at its outputs. The differential output signals of amplifiers $A1_{3b}$ and $A2_{3b}$ are combined to generates $g''_{3b} \times [(vy_{3b} - vz_{3b}) + (vx_{3b} \, vr_{3b})]$ as differential signals, which are coupled to the inputs of the amplifier $A3_{3b}$. The output port of $A3_{3b}$ drives $Mz'_{3b}$'s gate voltage which generates enough $Iz_{3b}$ to regulate $Mz_{3b}$'s source port, until the $A3_{3b}$'s inputs are substantially balanced.

As such, $g_{3b} \times [(vy_{3b} - vz_{3b}) + (vx_{3b} - vr_{3b})] \approx vz_{3b}$. Thus, $(vy_{3b} + vx_{3b} - vr_{3b}) \approx vx_{3b} (1 + 1/g_{3b})$. Assuming that $g_{3b} \gg 1$ (which represents a combined signal gain through $A1_{3b}$, $A2_{3b}$, $A3_{3b}$ and $Mz'_{3b}$), then $(vy_{3b} + vx_{3b} \, vr_{3b}) \approx vz_{3b}$. Substituting for $$vy_{3b} = v_{BE_{Qy_{3b}}}, vz_{3b} = v_{BE_{Qz_{3b}}}, vx_{3b} = v_{BE_{Qx_{3b}}}, \text{ and}$$

$$vr_{3b} = v_{BE_{Qr_{3b}}}$$

results in the following:

$$v_{BE_{Qx_{3b}}} - v_{BE_{Qr_{3b}}} = v_{BE_{Qz_{3b}}} - v_{BE_{Qy_{3b}}} \approx V_t \times \ln\left[\frac{Ix_{3b}}{Ir_{3b}}\right] \approx V_t \times \ln\left[\frac{Iz_{3b}}{Iy_{3b}}\right].$$

Accordingly, the output of iMULT represented by $Iz_{3b} \approx Ix_{3b} \times Iy_{3b}/Ir_{3b}$.

Note that $Mz''_{3b}$ replicates the z-output current of the analog iMULT by mirroring $Mz'_{3b}$'s current, wherein the $Mz''_{3b}$–$Mz'_{3b}$ current mirror can be cascaded for improved accuracy and higher output impedance.

In addition to the analog iMULT benefits outlined in this disclosure's introduction section titled DETAILED DESCRIPTION, the disclosed iMULT illustrated in FIG. 3B has the following benefits:

First, operating the CMOSFETs in subthreshold enables the disclosed analog iMULT circuits to operate with ultra-low currents, lower power supplies, and ultra-low power consumption suitable for mobile applications, especially in AI & ML applications near or at the edge or sensors that run on battery and may require numerous ultra-low current and low voltage supply analog iMULT circuits for computation.

Second, amplifiers $A1_{3b}$, $A2_{3b}$, and $A3_{3b}$ can be arranged with simple 2 to 8 FETs amplifiers. As such, $A1_{3b}$, $A2_{3b}$, and $A3_{3b}$ occupy a small die area.

Third, the disclosed analog iMULT circuit is arranged in a symmetric, matched, and scaled manner. This trait facilitates devices parameters to track each other over process, temperature, and operating condition variations. Accordingly, the disclosed analog iMULT circuit's temperature coefficient and power supply rejection performance can be enhanced.

Fourth, given its' complementary configuration, the disclosed iMULT's output current has the flexibility of being sourced or sunk. The $Iz_{3b}$ and $Ir_{3b}$ can be swapped (utilizing the respective PMOSFETs or NMOSFETs for $Mz''_{3b}$–$Mz'_{3b}$) to arrange the iMULT's output to sink or source current with flexibility.

Figure 4A:
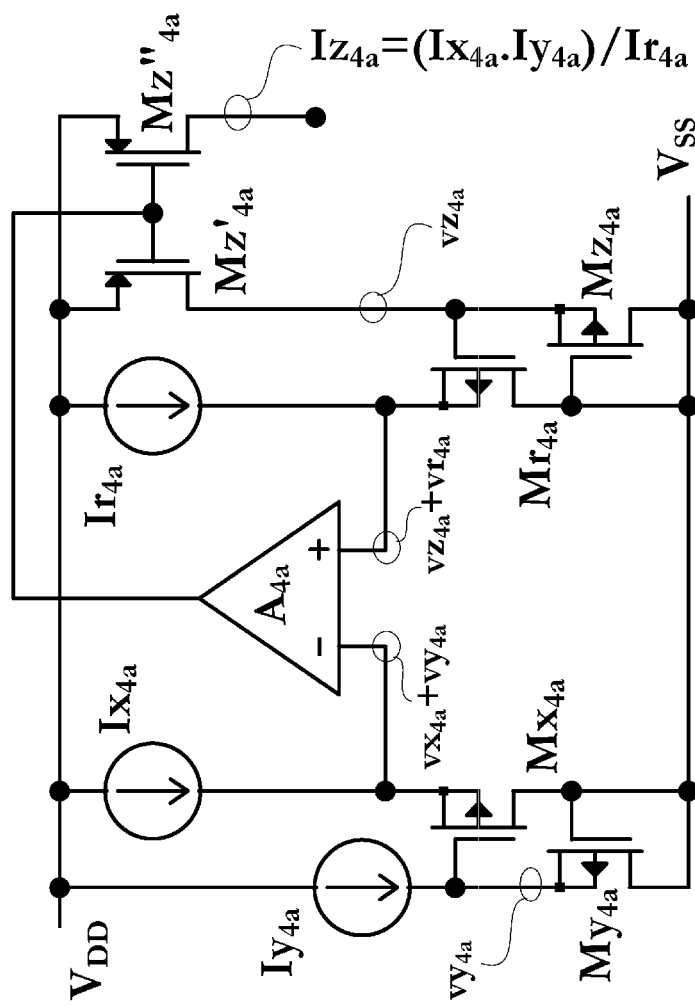
FIG. 4A is a simplified circuit schematic illustrating another analog current-input to current-output multiplier (iMULT) method.

Section 4A—Description of FIG. 4A

FIG. 4A is a simplified circuit schematic illustrating another analog current-input to current-output multiplier (iMULT) method.

The circuit of FIG. 4A utilizes source-follower PMOS-FETs that operate in the subthreshold region, and as such their input-voltage to output-current transfer-function follows a pseudo-exponential profile.

The circuit of FIG. 4A is comprising of four subthreshold PMOSFETs that are $My_{4a}$, $Mx_{4a}$, $Mz_{4a}$, and $Mr_{4a}$ wherein each PMOSFET has a drain, gate, and source ports. The source ports of $My_{4a}$, $Mx_{4a}$, and $Mr_{4a}$ are the current input terminals of the disclosed analog iMULT, and $Mz_{4a}$'s source port carries the output current of the disclosed analog iMULT.

The $My_{4a}$'s source port is supplied with a y-input currents $Iy_{4a}$, while its gate and drain ports are coupled with $V_{SS}$ (but they can be coupled to a bias voltage, $V_{4a}$). The $Mx_{4a}$'s source port is supplied with a x-input current ($Ix_{4a}$). The $Mr_{4a}$'s source port is supplied with a r-input reference current ($Ir_{4a}$). The $Mz_{4a}$'s source port is supplied with a z-output current ($Iz_{3b}$), while its gate and drain ports are coupled with $V_{SS}$ (but they can also be coupled to a bias voltage, $V_{4a}$). The $My_{4a}$'s source port is also coupled to $Mx_{4a}$'s gate port, wherein $Mx_{4a}$'s drain port is coupled with $V_{SS}$. The $Mz_{4a}$'s source port is also coupled to $Mr_{4a}$'s gate port, wherein $Mr_{4a}$'s drain port is coupled with $V_{SS}$.

In the analog iMULT embodiment illustrated in FIG. 4A, as noted the $My_{4a}$'s source port is coupled with $Mx_{4a}$'s gate port, wherein the voltage at $Mx_{4a}$'s source port is ($vy_{4a}$+$vx_{4a}$). Similarly, as noted the $Mz_{4a}$'s source port is coupled with $Mr_{4a}$'s gate port, wherein the voltage at $Mr_{4a}$'s source port is ($vz_{4a}$+$vr_{4a}$). An amplifier $A_{4a}$'s output signal drives the gate port of $Mz'_{4a}$ which regulates $vz_{4a}$ (the $Mz_{4a}$'s source port signal) until the amplifier $A_{4a}$'s inputs (which are coupled with $Mx_{4a}$ and $Mr_{4a}$ source ports) are substantially equalized.

Accordingly, for the loop comprising of $My_{4a}$, $Mx_{4a}$, $A_{4a}$, $Mr_{4a}$, and $Mz_{4a}$ by the operation of the Kirchhoff Voltage Law (KVL):

$$v_{GS_{My_{4a}}} + v_{GS_{Mx_{4a}}} - v_{GS_{Mr_{4a}}} - v_{GS_{Mz_{4a}}} \approx 0$$

or $$v_{GS_{Mx_{4a}}} - v_{GS_{Mr_{4a}}} \approx v_{GS_{Mz_{4a}}} - v_{GS_{My_{4a}}}.$$

Therefore, $$n \times V_t \times \ln\left[\frac{Ix_{4a}}{Ir_{4a}}\right] \approx n \times V_t \times \ln\left[\frac{Iz_{4a}}{Iy_{4a}}\right],$$

and $Iz_{2a} \approx (Ix_{4a} \times Iy_{4a})/Ir_{4a}$ which is the current output representation of the analog iMULT as a function of its input currents and reference current.

In addition to the analog iMULT benefits outlined in this disclosure's introduction section titled DETAILED DESCRIPTION, the disclosed iMULT illustrated in FIG. 4A has the following benefits:

First, operating the CMOSFETs in subthreshold enables the disclosed analog iMULT circuit to operate with ultra-low currents, even lower power supplies, and ultra-low power consumption suitable for mobile applications, especially in AI & ML applications near or at the edge or sensors that run on battery and may require numerous ultra-low current and low voltage supply analog iMULT circuits for computation.

Second, $A_{4a}$ can be a 4 FET which makes a total of 9 FET count in the disclosed analog iMULT circuits, which is small and low cost.

Third, the disclosed analog iMULT circuit is arranged in a symmetric, matched, and scaled manner. This trait facilitates devices parameters to track each other over process, temperature, and operating condition variations. Accordingly, the disclosed analog iMULT. circuit's temperature coefficient and power supply rejection performance can be enhanced.

Fourth, PMOSFETs are lower noise in subthreshold (compared with NMOSFETs) which helps improve the noise performance of the disclosed analog iMULT.

Figure 4B:
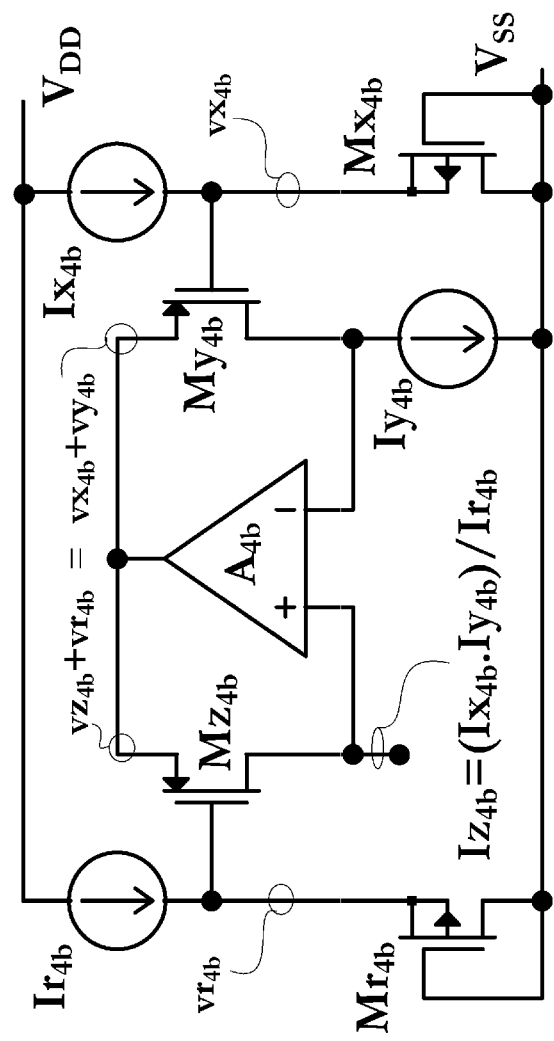
FIG. 4B is a simplified circuit schematic illustrating another analog current-input to current-output multiplier (iMULT) method.

Section 4B—Description of FIG. 4B

FIG. 4B is a simplified circuit schematic illustrating another analog current-input to current-output multiplier (iMULT) method.

The circuit of FIG. 4B utilizes diode connected and source-follower PMOSFETs that operate in the subthreshold region, and as such their input-voltage to output-current transfer-function follows a pseudo-exponential profile.

The circuit of FIG. 4B is comprising of four subthreshold PMOSFETs that are $My_{4b}$, $Mx_{4b}$, $Mr_{4b}$, and $Mz_{4b}$ wherein each PMOSFET has a drain, gate, and source ports. The $Mr_{4b}$, and $Mx_{4b}$ are diode connected whose source ports receive two of the disclosed analog iMULT input current signals, and whose drain-gate ports are coupled to $V_{SS}$. The gate ports of $Mr_{4b}$, and $Mx_{4b}$ can be coupled with a voltage source ($V1_{4b}$ not shown on FIG. 4B), instead of being diode connected and coupled to $V_{SS}$. The $My_{4b}$ drain port receives one of the disclosed analog iMULT input current signals, and $Mz_{4b}$ drain port generates the disclosed analog iMULT output current signals. The $My_{4b}$ gate port is coupled with the $Mx_{4b}$ source port. The $Mz_{4b}$ gate port is coupled with the $Mr_{4b}$ source port. The $My_{4b}$ source port is coupled with the $Mz_{4b}$ source port.

The $Mr_{4b}$'s source port is supplied with a r-input reference currents ($Ir_{4b}$). The $Mx_{4b}$'s source port is supplied with a x-input current ($Ix_{4b}$). The $My_{4a}$'s drain port is supplied with a y-input current ($Iy_{4b}$). The $Mz_{4b}$'s source port is supplied with a z-output current ($Iz_{3b}$) that flows out through $Mz_{4b}$'s drain port. Amplifier $A_{4b}$ supply the source ports of $Mz_{4b}$ and $My_{4b}$ with enough current until $A_{4b}$ input ports are substantially equalized. The negative input port of $A_{4b}$ is coupled with the $My_{4b}$'s drain port where $Iy_{4b}$ is received. In effect $A_{4b}$ supplies enough current to the source ports of $My_{4b}$ and $Mz_{4b}$ until the sum of $v_{GS}$s of $Mx_{4b}$ and $My_{4b}$ is substantially equalized with the sum of $v_{GS}$s of $Mr_{4b}$ and $Mz_{4b}$, wherein $My_{4b}$ operates at $Iy_{4b}$.

Note that the positive input port of $A_{4b}$ can be coupled to a bias voltage source ($V2_{4b}$ not shown on FIG. 4B). Alternatively, the positive input port of $A_{4b}$ can be coupled to the $Mz_{4b}$'s drain port such that the drain-to-source terminal voltages of $Mz_{4b}$ and $My_{4b}$ match and track for improved static and dynamic performance of the disclosed analog iMULT.

For the loop comprising of $Mr_{4b}$, $Mz_{4b}$, $A_{4b}$, $My_{4b}$, and $Mx_{4b}$ by the operation of the Kirchhoff Voltage Law (KVL):

$$v_{GS_{Mr_{4b}}} + v_{GS_{Mz_{4b}}} - v_{GS_{My_{4b}}} - v_{GS_{Mx_{4b}}} \approx 0 \text{ or}$$

$$v_{GS_{Mx_{4b}}} + v_{GS_{My_{4b}}} \approx v_{GS_{Mz_{4b}}} + v_{GS_{Mr_{4b}}}.$$

Therefore, $n \times V_t \times \ln (Ix_{4b} \times Iy_{4b}) \approx n \times V_t \times \ln (Iz_{4b} \times Ir_{4b})$, and $Iz_{4b} \approx (Ix_{4b} \times Iy_{4b})/Ir_{4b}$ which is the current output representation of the analog iMULT as a function of its input currents and reference current.

In addition to the analog iMULT benefits outlined in this disclosure's introduction section titled DETAILED DESCRIPTION, the disclosed iMULT illustrated in FIG. 4B has the following benefits:

First, operating the CMOSFETs in subthreshold enables the disclosed analog iMULT circuit to operate with ultra-low currents, even lower power supplies, and ultra-low power consumption suitable for mobile applications, especially in AI & ML applications at or near edge or sensors that run on battery and may require numerous ultra-low current and low voltage supply analog iMULT circuits for computation.

Second, $A_{4b}$ can be a one FET and a one current source (with enough current to supply the full-scale $Iz_{4b}$ and $Iy_{4b}$ currents) which makes a total of 6 FET count in the disclosed analog iMULT circuits, which is small and low cost.

Third, the disclosed analog iMULT circuit is arranged in a symmetric, matched, and scaled manner. This trait facilitates devices parameters to track each other over process, temperature, and operating condition variations. Accordingly, the disclosed analog iMULT. circuit's temperature coefficient and power supply rejection performance can be enhanced.

Fourth, PMOSFETs are lower noise in subthreshold (compared with NMOSFETs) which helps improve the noise performance of the disclosed analog iMULT.

Fifth, two of the current inputs of the disclosed analog iMULT are supplied from the $V_{DD}$, while the third input and the output of the disclosed analog iMULT are supplied from $V_{SS}$, which can be beneficial for end-applications that require complementary input-output current source-sink flexibility.

Figure 4C:
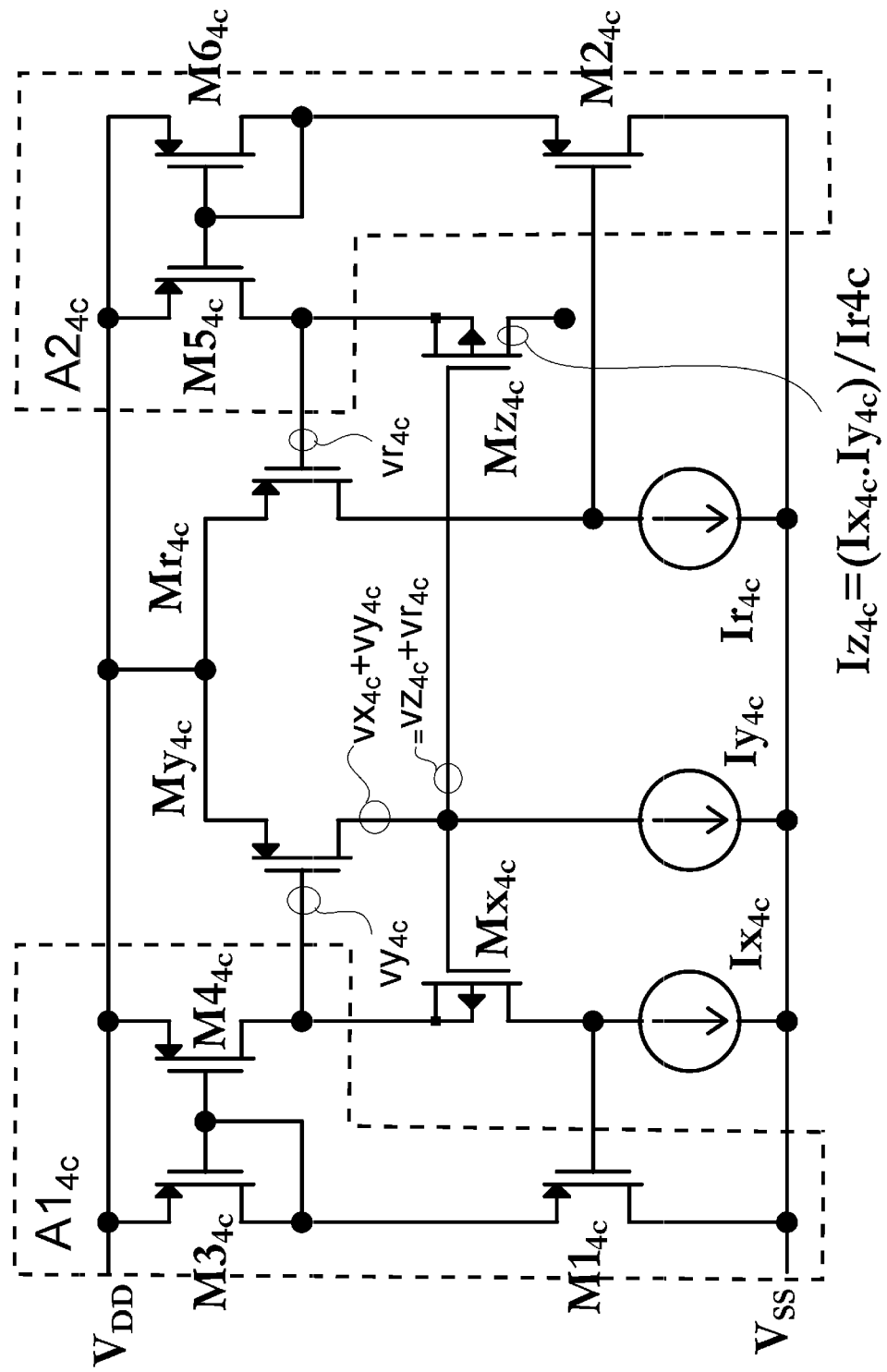
FIG. 4C is a simplified circuit schematic illustrating another analog current-input to current-output multiplier (iMULT) method.

Section 4C—Description of FIG. 4C

FIG. 4C is a simplified circuit schematic illustrating another analog current-input to current-output multiplier (iMULT) method.

The circuit of FIG. 4C utilizes PMOSFETs that operate in the subthreshold region, and as such their input-voltage to output-current transfer-function follows a pseudo-exponential profile.

The circuit of FIG. 4C is comprising of four subthreshold PMOSFETs that are $My_{4c}$, $Mx_{4c}$, $Mr_{4c}$, and $Mz_{4c}$ wherein each PMOSFET has a drain, gate, and source ports. The $Mr_{4c}$'s drain port is supplied with a r-input reference currents ($Ir_{4c}$). The $Mr_{4c}$'s drain port is supplied with a x-input current ($Ix_{4c}$). The $My_{4c}$'s drain port is supplied with a y-input current ($Iy_{4c}$). The $Mz_{4c}$'s drain port generates a z-output current ($Iz_{4c}$). The source ports of $My_{4c}$ and $Mr_{4c}$ are coupled together and coupled to $V_{DD}$. The $My_{4c}$'s gate is coupled with $Mx_{4c}$'s source, and $My_{4c}$'s drain is coupled with $Mx_{4c}$'s gate. The $Mr_{4c}$'s gate is coupled with $Mz_{4c}$'s source, and $Mz_{4c}$'s gate is coupled with $My_{4c}$'s drain and $Mx_{4c}$'s gate. Amplifier $A1_{4c}$ (comprising of $M1_{4c}$, $M3_{4c}$, and $M4_{4c}$) generates enough current through $M4_{4c}$'s drain port, which feeds $Mx_{4c}$'s source port, until $Mx_{4c}$'s drain current is substantially equalized to $Ix_{4c}$. Similarly, amplifier $A2_{4c}$ (comprising of $M2_{4c}$, $M5_{4c}$, and $M6_{4c}$) generates enough current through $M5_{4c}$'s drain port, which feeds $Mz_{4c}$'s source port, until the sum of $v_{GS}$s of $Mx_{4c}$ and $My_{4c}$ is substantially equalized with the sum of $v_{GS}$s of $Mr_{4c}$ and $Mz_{4c}$, wherein $Mr_{4c}$ operates at the current $Ir_{4c}$.

For the loop comprising of $Mz_{4c}$, $Mr_{4c}$, $My_{4c}$, and $Mx_{4c}$ by the operation of the Kirchhoff Voltage Law (KVL):

$$v_{GS_{My_{4c}}} + v_{GS_{Mx_{4c}}} - v_{GS_{Mz_{4c}}} - v_{GS_{Mr_{4c}}} \approx 0 \text{ or}$$

$$v_{GS_{Mx_{4c}}} + v_{GS_{My_{4c}}} \approx v_{GS_{Mz_{4c}}} + v_{GS_{Mr_{4c}}}.$$

Therefore, $n \times V_t \times \ln (Ix_{4c} \times Iy_{4c}) \approx n \times V_t \times \ln (Iz_{4c} \times Ir_{4c})$, and $Iz_{4c} \approx (Ix_{4c} \times Iy_{4c})/Ir_{4c}$ which is the current output representation of the analog iMULT as a function of its input currents and reference current.

In addition to the analog iMULT benefits outlined in this disclosure's introduction section titled DETAILED DESCRIPTION, the disclosed iMULT illustrated in FIG. 4C has the following benefits:

First, operating the CMOSFETs in subthreshold enables the disclosed analog iMULT circuit to operate with ultra-low currents, even lower power supplies, and ultra-low power consumption suitable for mobile applications, especially in AI & ML applications at or near edge or sensors that run on battery and may require numerous ultra-low current and low voltage supply analog iMULT circuits for computation.

Second, $A1_4$, and $A2_4$, are 3 FET amplifiers which makes a total of 10 FET counts in the disclosed analog iMULT circuits, which is small and low cost.

Third, the disclosed analog iMULT circuit is arranged in a symmetric, matched, and scaled manner. This trait facilitates devices parameters to track each other over process, temperature, and operating condition variations. Accordingly, the disclosed analog iMULT. circuit's temperature coefficient and power supply rejection performance can be enhanced.

Fourth, PMOSFETs are lower noise in subthreshold (compared with NMOSFETs) which helps improve the noise performance of the disclosed analog iMULT.

Fifth, all inputs and the output currents of the disclosed analog iMULT are supplied from the same power supply, which can be beneficial for end-applications that require such an input-output arrangement.

Figure 5A:
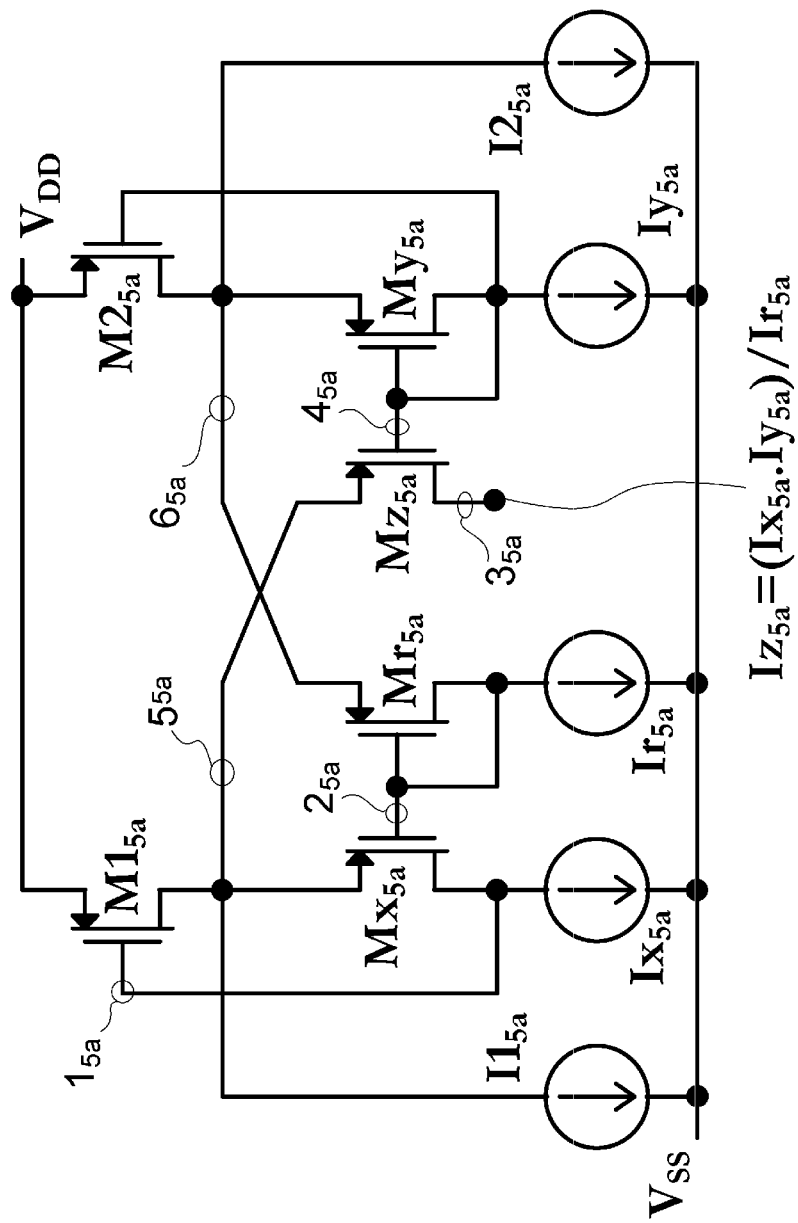
FIG. 5A is a simplified circuit schematic illustrating another analog current-input to current-output multiplier (iMULT) method.

Section 5A—Description of FIG. 5A

FIG. 5A is a simplified circuit schematic illustrating another analog current-input to current-output multiplier (iMULT) method.

The circuit of FIG. 5A utilizes PMOSFETs that operate in the subthreshold region, and as such their input-voltage to output-current transfer-function follows a pseudo-exponential profile.

The circuit of FIG. 5A is comprising of four subthreshold PMOSFETs that are $My_{5a}$, $Mx_{5a}$, $Mr_{5a}$, and $Mz_{5a}$ wherein each PMOSFET has a drain, gate, and source ports. The $Mr_{5a}$, and $My_{5a}$ are diode connected with their respective gate and drain ports coupled together. The $Mr_{5a}$'s gate-drain port at node $2_{5a}$ is supplied with a r-input reference currents ($Ir_{5a}$). The $Mx_{5a}$'s drain port at node $1_{5a}$ is supplied with a x-input current ($Ix_{5a}$). Note utilizing $I1_{5a}$ and $I2_{5a}$ are optional. They can operate at substantially lower currents (than, for example, the $Ir_{5a}$ level) to keep the disclosed analog iMULT more on when running close to zero-scale currents.

The $My_{5a}$'s gate-drain port at node $4_{5a}$ is supplied with a y-input current ($Iy_{5a}$). The $Mz_{5a}$'s drain port at node $3_{5a}$ generates a z-output current ($Iz_{5a}$). The source ports of $My_{5a}$ and $Mr_{5a}$ are coupled together at node $6_{5a}$ and coupled with the drain port of $M1_{5a}$. The source ports of $Mx_{5a}$ and $Mz_{5a}$ are coupled together at node $5_{5a}$ and coupled with the drain port of $M2_{5a}$. Node $4_{5a}$ is also connected to $M2_{5a}$'s gate port, and node $1_{5a}$ is also connected to $M1_{5a}$'s gate port. Source ports of $M2_{5a}$ and $M2_{5a}$ are coupled to $V_{DD}$. The drain port of $Mx_{5a}$ drives the gate of $M1_{5a}$ until $M1_{5a}$ generates enough current so that the difference between the $v_{GS}$s of $Mx_{5a}$ and $Mr_{5a}$ is substantially equalized with the difference between $v_{GS}$s of $My_{5a}$ and $Mz_{5a}$, wherein $Mx_{5a}$ operates at the current $Ix_{5a}$.

For the loop comprising of $Mz_{5a}$, $Mr_{5a}$, $My_{5a}$ and $Mx_{5a}$ by the operation of the Kirchhoff Voltage Law (KVL):

$$v_{GS_{Mx_{5a}}} - v_{GS_{Mr_{5a}}} + v_{GS_{My_{5a}}} - v_{GS_{Mz_{5a}}} \approx 0 \text{ or}$$

$$v_{GS_{Mx_{5a}}} + v_{GS_{My_{5a}}} \approx v_{GS_{Mz_{5a}}} + v_{GS_{Mr_{5a}}}.$$

Therefore, $n \times V_t \times \ln (Ix_{5a} \times Iy_{5a}) \approx n \times V_t \times \ln (Iz_{5a} \times Ir_{5a})$, and $Iz_{5a} \approx (Ix_{5a} \times Iy_{5a})/Ir_{5a}$ which is the current output representation of the analog iMULT as a function of its input currents and reference current.

In addition to the analog iMULT benefits outlined in this disclosure's introduction section titled DETAILED DESCRIPTION, the disclosed iMULT illustrated in FIG. 5A has the following benefits:

First, operating the CMOSFETs in subthreshold enables the disclosed analog iMULT circuit to operate with ultra-low currents, even lower power supplies, and ultra-low power consumption suitable for mobile applications, especially in AI & ML applications at or near edge or sensors that run on battery and may require numerous ultra-low current and low voltage supply analog iMULT circuits for computation.

Second, total of 6 FET counts is used in the disclosed analog iMULT circuits, which is small and low cost.

Third, the disclosed analog iMULT circuit is arranged in a symmetric, matched, and scaled manner. This trait facilitates devices parameters to track each other over process, temperature, and operating condition variations. Accordingly, the disclosed analog iMULT. circuit's temperature coefficient and power supply rejection performance can be enhanced.

Fourth, the disclosed analog iMULT circuit only utilizes PMOSFETs that are lower noise in subthreshold (compared with NMOSFETs) which helps improve the noise performance of the disclosed analog iMULT.

Fifth, all inputs and the output currents of the disclosed analog iMULT are supplied from the same power supply, which can be beneficial for end-applications that require such an input-output arrangement.

Figure 5B:
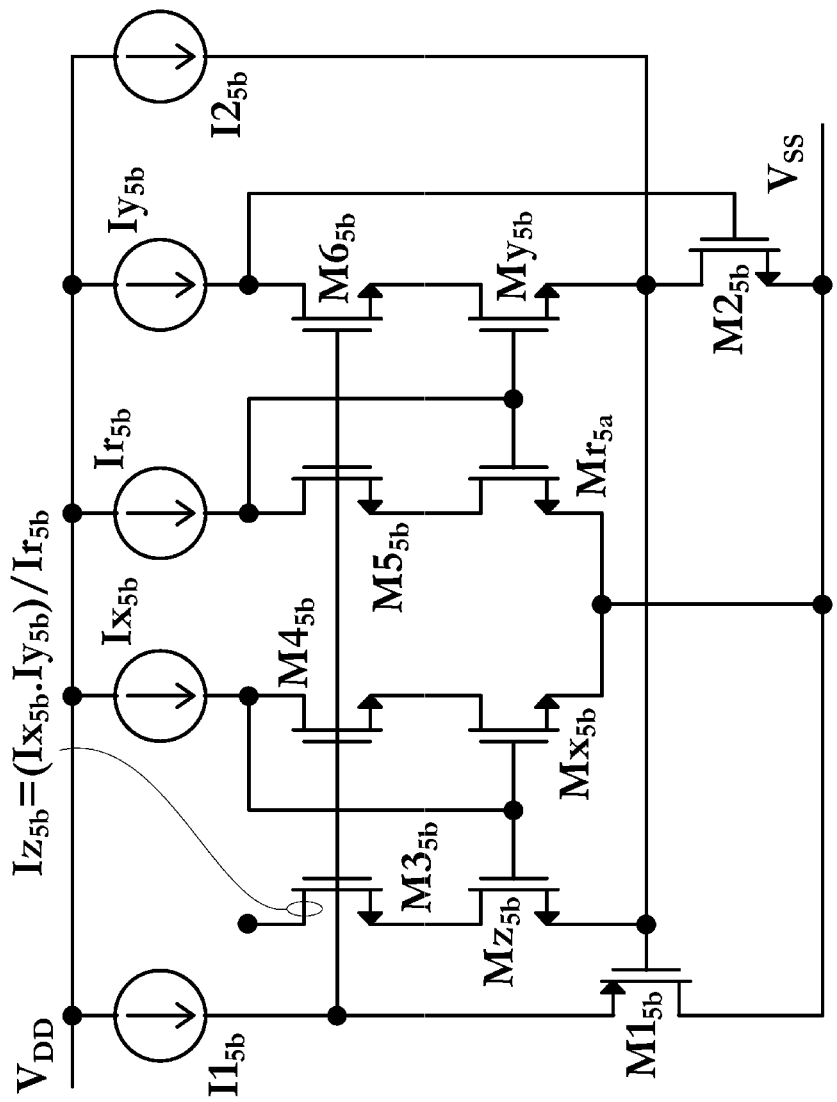
FIG. 5B is a simplified circuit schematic illustrating another analog current-input to current-output multiplier (iMULT) method.

Section 5B—Description of FIG. 5B

FIG. 5B is a simplified circuit schematic illustrating another analog current-input to current-output multiplier (iMULT) method.

The circuit of FIG. 5B utilizes NMOSFETs that operate in the subthreshold region, and as such their input-voltage to output-current transfer-function follows a pseudo-exponential profile.

The circuit of FIG. 5B is comprising of four subthreshold NMOSFETs that are $My_{5b}$, $Mx_{5b}$, $Mr_{5b}$, and $Mz_{5b}$ wherein each NMOSFET has a drain, gate, and source ports. The $Mr_{5b}$, and $Mx_{5b}$ are effectively diode connected with their gate and drain ports coupled together (through their cascoded FETs). The source ports of $Mr_{5b}$, and $Mx_{5b}$ are coupled to $V_{SS}$. The source ports of $Mz_{5b}$ and $My_{5b}$ are coupled together and coupled to drain port of $M2_{5b}$. Also keep in mind that $My_{5b}$, $Mx_{5b}$, $Mr_{5b}$, and $Mz_{5b}$ are cascaded FETs (by $M6_{5b}$, $M4_{5b}$, $M5_{5b}$, and $M3_{5b}$, respectively) to increase their output impedance. The cascaded FETs are biased by a voltage source (comprising of $M1_{5b}$ and current source $I1_{5b}$), which is biased from source ports of $Mz_{5b}$ and $My_{5b}$ that are coupled to drain port of $M2_{5b}$. The $M2_{5b}$ gate is coupled with $Iy_{5b}$ and its source is coupled to $V_{SS}$. Also, note that utilizing $I2_{5b}$ is optional, which can operate at substantially lower currents (than, for example, the $Ir_{5b}$ level) to keep the disclosed analog iMULT more on close to zero-scale current.

The $Mr_{5b}$'s gate-drain port is supplied with a r-input reference currents ($Ir_{5b}$). The $Mx_{5b}$'s gate-drain port is supplied with a x-input current ($Ix_{5b}$). The $My_{5b}$'s drain port is supplied with a y-input current ($Iy_{5b}$). The $Mz_{5b}$'s drain port generates a z-output current ($Iz_{5b}$). The drain port of $M6_{5b}$ (carrying the same current as $My_{5b}$ that is $Iy_{5b}$) drives the gate of $M2_{5b}$ until $M2_{5b}$ generates enough current (for $Mz_{5b}$ and $My_{5b}$) so that the difference between the $v_{GS}$s of $Mx_{5b}$ and $Mz_{5b}$ is substantially equalized with the difference between $v_{GS}$s of $My_{5b}$ and $Mz_{5b}$, wherein $My_{5b}$ operates at the current $Iy_{5b}$.

For the loop comprising of $Mz_{5b}$, $Mx_{5b}$, $Mr_{5b}$, and $My_{5b}$ by the operation of the Kirchhoff Voltage Law (KVL):

$$v_{GS_{Mz_{5b}}} - v_{GS_{Mx_{5b}}} + v_{GS_{Mr_{5b}}} - v_{GS_{My_{5b}}} \approx 0 \text{ or}$$

$$v_{GS_{Mx_{5b}}} + v_{GS_{My_{5b}}} \approx v_{GS_{Mz_{5b}}} + v_{GS_{Mr_{5b}}}.$$

Therefore, $n \times V_t \times \ln (Ix_{5b} \times Iy_{5b}) \approx n \times V_t \times \ln (Iz_{5b} \times Ir_{5b})$, and $Iz_{5b} \approx (Ix_{5b} \times Iy_{5b})/Ir_{5b}$ which is the current output representation of the analog iMULT as a function of its input currents and reference current.

In addition to the analog iMULT benefits outlined in this disclosure's introduction section titled DETAILED DESCRIPTION, the disclosed iMULT illustrated in FIG. 5B has the following benefits:

First, operating the CMOSFETs in subthreshold enables the disclosed analog iMULT circuit to operate with ultra-low currents, even lower power supplies, and ultra-low power consumption suitable for mobile applications, especially in AI & ML applications at or near the edge or sensors that run on battery and may require numerous ultra-low current and low voltage supply analog iMULT circuits for computation.

Second, excluding the cascaded FETs, a total of 7 FET counts is used in the disclosed analog iMULT circuits, which is small and low cost.

Third, the disclosed analog iMULT circuit is arranged in a symmetric, matched, and scaled manner. This trait facilitates devices parameters to track each other over process, temperature, and operating condition variations. Accordingly, the disclosed analog iMULT. circuit's temperature coefficient and power supply rejection performance can be enhanced.

Fourth, all inputs and the output currents of the disclosed analog iMULT are supplied from the same power supply, which can be beneficial for end-applications that require such an arrangement.

Fifth, NMSOFETs have higher transconductance and can be sized smaller and they can be arranged on top of $V_{SS}$ that can be the same as the ground potential (that can generally be shielded from noise), which can be beneficial for end-applications that require such an arrangement.

Figure 5C:
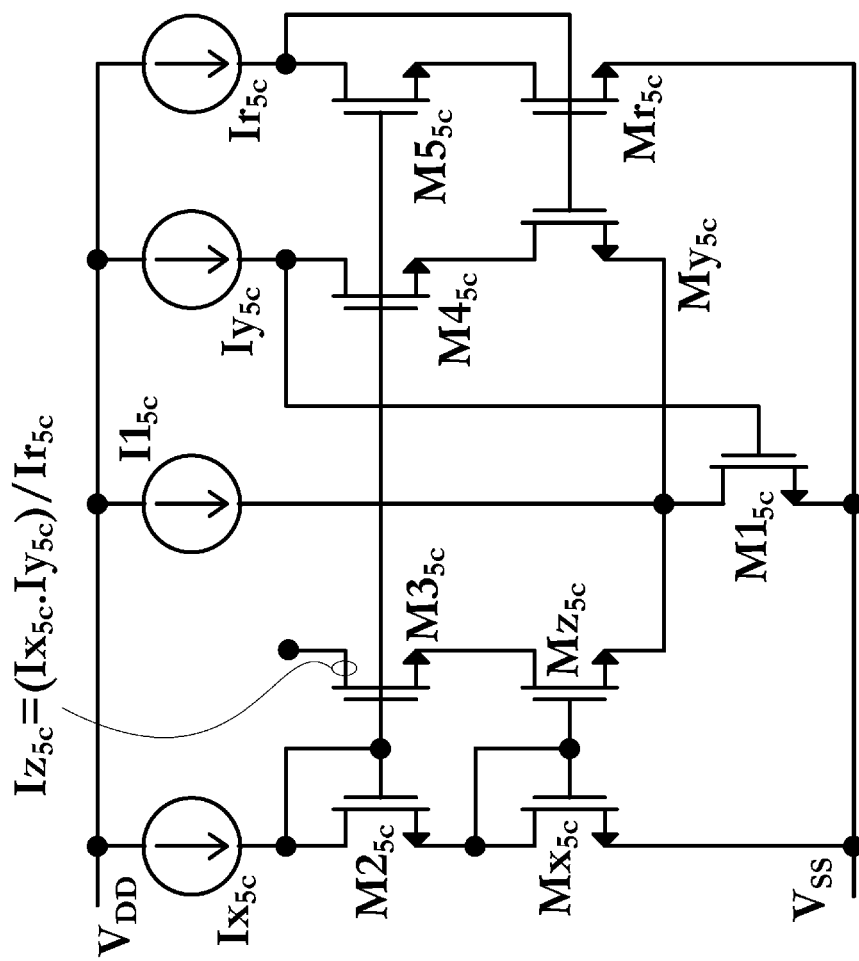
FIG. 5C is a simplified circuit schematic illustrating another analog current-input to current-output multiplier (iMULT) method.

Section 5C—Description of FIG. 5C

FIG. 5C is a simplified circuit schematic illustrating another analog current-input to current-output multiplier (iMULT) method.

The circuit of FIG. 5C utilizes NMOSFETs that operate in the subthreshold region, and as such their input-voltage to output-current transfer-function follows a pseudo-exponential profile.

The circuit of FIG. 5C is comprising of four subthreshold NMOSFETs that are $My_{5c}$, $Mx_{5c}$, $Mr_{5c}$, and $Mz_{5c}$ wherein each NMOSFET has a drain, gate, and source ports. The $Mr_{5c}$, and $Mx_{5c}$ are effectively diode connected with their gate and drain ports coupled together (through their cascoded FETs). The source ports of $Mr_{5c}$, and $Mx_{5c}$ are coupled to $V_{SS}$. The source ports of $Mz_{5c}$ and $My_{5c}$ are coupled together and coupled to drain port of $M1_{5c}$. The gate port of $M1_{5c}$ is coupled to drain port of $M4_{5c}$ and its source port is couple to $V_{SS}$. Also note that $My_{5c}$, $Mx_{5c}$, $Mr_{5c}$, and $Mz_{5c}$ are cascaded FETs (by $M4_{5c}$, $M2_{5c}$, $M5_{5c}$, and $M3_{5c}$, respectively) to increase their output impedance. The cascaded FETs are biased by a voltage source (comprising of diode-connected $M2_{5c}$ that is biased via current $Ix_{5c}$), which is biased on top of diode-connected $Mx_{5c}$. Also, keep in mind that utilizing $I1_{5c}$ is optional, which can operate at substantially lower currents (than, for example, the $Ir_{5c}$ level) to keep the disclosed analog iMULT more on close to zero-scale current.

The $Mr_{5c}$'s gate-drain port is supplied with a r-input reference currents ($Ir_{5c}$). The $Mx_{5c}$'s gate-drain port is supplied with a x-input current ($Ix_{5c}$). The $My_{5c}$'s drain port is supplied with a y-input current ($Iy_{5c}$). The $Mz_{5c}$'s drain port generates a z-output current ($Iz_{5c}$). The drain port of $M4_{5c}$ (carrying the same current as $My_{5c}$ that is $Iy_{5c}$) drives the gate of $M1_{5c}$ until $M1_{5c}$ generates enough current (for $Mz_{5c}$ and $My_{5c}$) so that the difference between the $v_{GS}$s of $Mx_{5c}$ and $Mz_{5c}$ is substantially equalized with the difference between $v_{GS}$s of $My_{5c}$ and $Mz_{5c}$, wherein $My_{5c}$ operates at the current $Iy_{5c}$.

For the loop comprising of $Mz_{5c}$, $Mx_{5c}$, $Mr_{5c}$, and $My_{5c}$ by the operation of the Kirchhoff Voltage Law (KVL):

$$v_{GS_{Mz5c}} - v_{GS_{Mx5c}} + v_{GS_{Mr5c}} - v_{GS_{My5c}} \approx 0 \text{ or}$$

$$v_{GS_{Mx5c}} + v_{GS_{My5c}} \approx v_{GS_{Mz5c}} + v_{GS_{Mr5c}}.$$

Therefore, $n \times V_t \times \ln(Ix_{5c} \times Iy_{5c})$ $n \times V_t \times \ln(Iz_{5c} \times Ir_{5c})$, and $Iz_{5c}$ $(Ix_{5c} \times Iy_{5c})/Ir_{5c}$ which is the current output representation of the analog iMULT as a function of its input currents and reference current.

In addition to the analog iMULT benefits outlined in this disclosure's introduction section titled DETAILED DESCRIPTION, the disclosed iMULT illustrated in FIG. 5C has the following benefits:

First, operating the CMOSFETs in subthreshold enables the disclosed analog iMULT circuit to operate with ultra-low currents, even lower power supplies, and ultra-low power consumption suitable for mobile applications, especially in AI & ML applications at or near the edge or sensors that run on battery and may require numerous ultra-low current and low voltage supply analog iMULT circuits for computation.

Second, excluding the cascaded FETs, a total of 7 FET counts is used in the disclosed analog iMULT circuits, which is small and low cost.

Third, the disclosed analog iMULT circuit is arranged in a symmetric, matched, and scaled manner. This trait facilitates devices parameters to track each other over process, temperature, and operating condition variations. Accordingly, the disclosed analog iMULT. circuit's temperature coefficient and power supply rejection performance can be enhanced.

Fourth, all inputs and the output currents of the disclosed analog iMULT are supplied from the same power supply, which can be beneficial for end-applications that require such an arrangement.

Fifth, NMSOFETs have higher transconductance and can be sized smaller and they can be arranged on top of $V_{SS}$ that can be the same as the ground potential (that can generally be shielded from noise), which can be beneficial for end-applications that require such an arrangement.

Figure 5D:
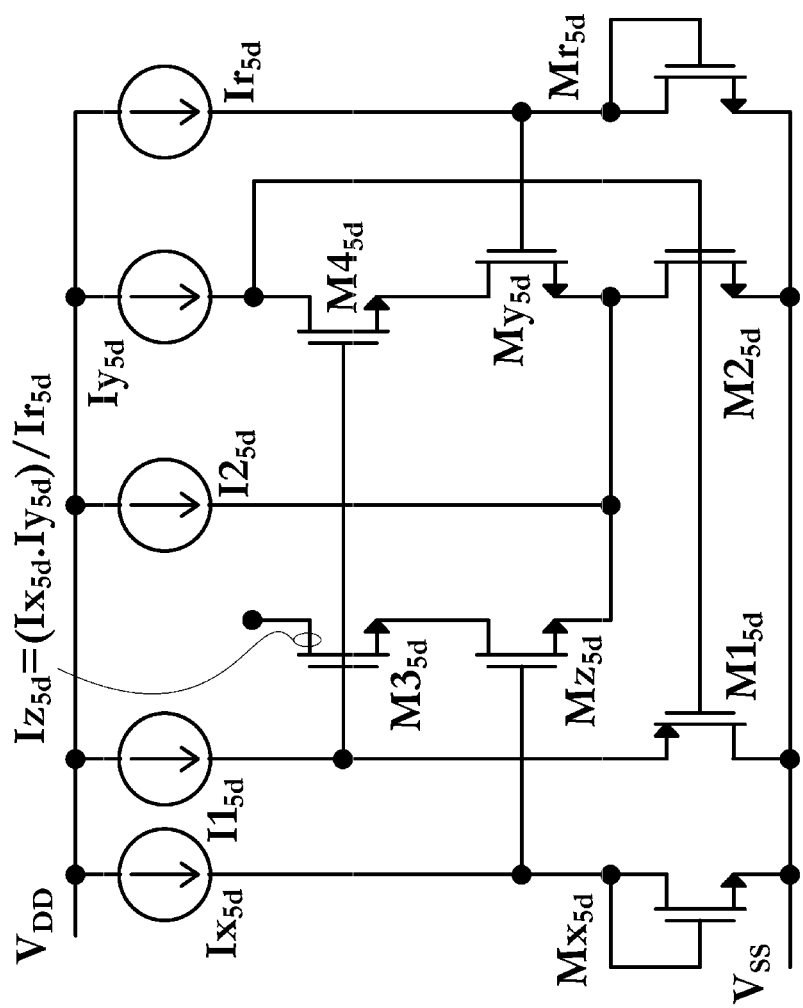
FIG. 5D is a simplified circuit schematic illustrating another analog current-input to current-output multiplier (iMULT) method.

Section 5D—Description of FIG. 5D

FIG. 5D is a simplified circuit schematic illustrating another analog current-input to current-output multiplier (iMULT) method.

The circuit of FIG. 5D utilizes NMOSFETs that operate in the subthreshold region, and as such their input-voltage to output-current transfer-function follows a pseudo-exponential profile.

The circuit of FIG. 5D is comprising of four subthreshold NMOSFETs that are $My_{5d}$, $Mx_{5d}$, $Mr_{5d}$, and $Mz_{5d}$ wherein each NMOSFET has a drain, gate, and source ports. The $Mr_{5d}$, and $Mx_{5d}$ are diode connected with their respective gate and drain ports coupled together. The source ports of $Mr_{5d}$, and $Mx_{5d}$ are coupled to $V_{SS}$. The source ports of $Mz_{5d}$ and $My_{5d}$ are coupled together and coupled to drain port of $M2_{5d}$. Also note that $My_{5d}$ and $Mz_{5d}$ are cascaded FETs ($M4_{5d}$ and $M3_{5d}$, respectively) to increase their output impedance. The cascaded FETs ($M4_{5d}$ and $M3_{5d}$) are biased by a voltage source (comprising of $M1_{5d}$ and current source $I1_{5d}$), which is biased from source ports of $Mz_{5d}$ and $My_{5d}$. The $M2_{5d}$'s drain port's current regulates the source ports of $Mz_{5d}$ and $My_{5d}$, where $M2_{5d}$'s gate port is coupled with $Iy_{5d}$ input port and its source is coupled to $V_{SS}$. Also, note that utilizing $I2_{5d}$ is optional, which can operate at substantially lower currents (compared to, for example, the $Ir_{5d}$ current level) to keep the disclosed analog iMULT more on close to zero-scale current.

The $Mr_{5d}$'s gate-drain port is supplied with a r-input reference currents ($Ir_{5d}$). The $Mx_{5d}$'s gate-drain port is supplied with a x-input current ($Ix_{5d}$). The $My_{5d}$'s drain port is supplied with a y-input current ($Iy_{5d}$). The $Mz_{5d}$'s drain port generates a z-output current ($Iz_{5d}$). The drain port of $M4_{5d}$ (carrying the same current as $My_{5d}$ that is $Iy_{5d}$) drives the gate of $M2_{5d}$ until $M2_{5d}$ generates enough current (for $Mz_{5d}$ and $My_{5d}$) so that the difference between the $v_{GS}$s of $Mx_{5d}$ and $Mz_{5d}$ is substantially equalized with the difference between $v_{GS}$s of $My_{5d}$ and $Mz_{5d}$, wherein $My_{5d}$ operates at the current $Iy_{5d}$.

For the loop comprising of $Mz_{5d}$, $Mx_{5d}$, $Mr_{5d}$, and $My_{5d}$ by the operation of the Kirchhoff Voltage Law (KVL):

$$v_{GS_{Mz_{5d}}} - v_{GS_{Mx_{5d}}} + v_{GS_{Mr_{5d}}} - v_{GS_{My_{5d}}} \approx 0 \text{ or}$$

$$v_{GS_{Mx_{5d}}} + v_{GS_{My_{5d}}} \approx v_{GS_{Mz_{5d}}} + v_{GS_{Mr_{5d}}}.$$

Therefore, $n \times V_t \times \ln(Ix_{5d} \times Iy_{5d}) \approx n \times V_t \times \ln(Iz_{5d} \times Ir_{5d})$, and $Iz_{5d} \approx (Ix_{5d} \times Iy_{5d})/Ir_{5d}$ which is the current output representation of the analog iMULT as a function of its input currents and reference current.

In addition to the analog iMULT benefits outlined in this disclosure's introduction section titled DETAILED DESCRIPTION, the disclosed iMULT illustrated in FIG. 5D has the following benefits:

First, operating the CMOSFETs in subthreshold enables the disclosed analog iMULT circuit to operate with ultra-low currents, even lower power supplies, and ultra-low power consumption suitable for mobile applications, especially in AI & ML applications at or near the edge or sensors that run on battery and may require numerous ultra-low current and low voltage supply analog iMULT circuits for computation.

Second, excluding the cascaded FETs, a total of 7 FET counts is used in the disclosed analog iMULT circuits, which is small and low cost.

Third, the disclosed analog iMULT circuit is arranged in a symmetric, matched, and scaled manner. This trait facilitates devices parameters to track each other over process, temperature, and operating condition variations. Accordingly, the disclosed analog iMULT. circuit's temperature coefficient and power supply rejection performance can be enhanced.

Fourth, all inputs and the output currents of the disclosed analog iMULT are supplied from the same power supply, which can be beneficial for end-applications that require such an arrangement.

Fifth, NMSOFETs have higher transconductance and can be sized smaller and they can be arranged on top of $V_{SS}$ that can be the same as the ground potential (that is generally kept quite), which can be beneficial for end-applications that require such an arrangement.

Figure 5E:
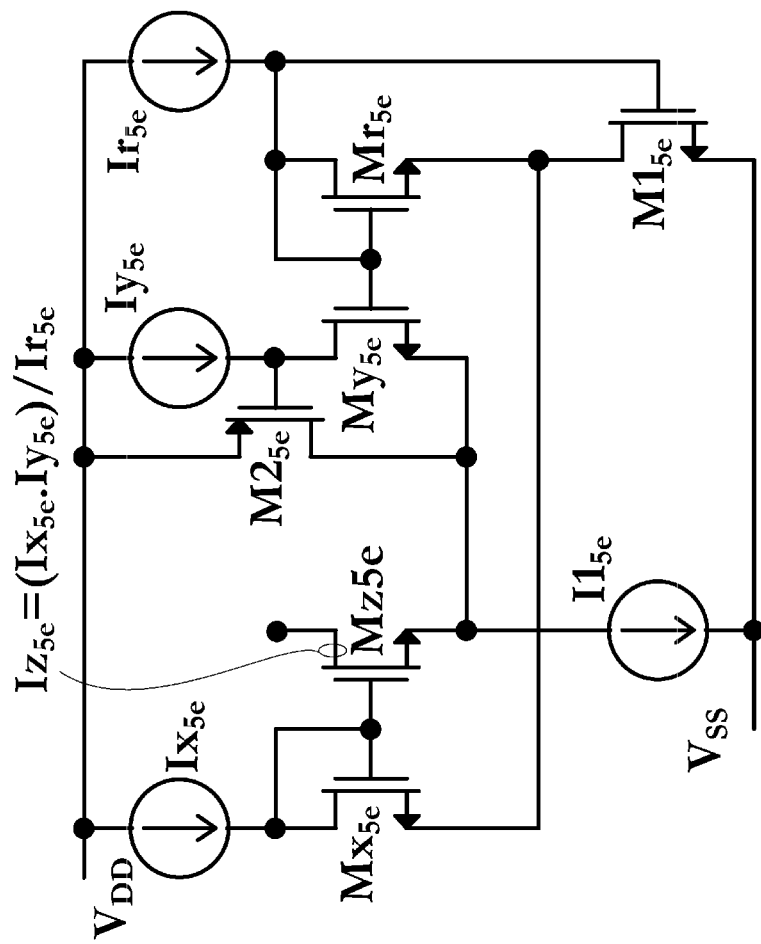
FIG. 5E is a simplified circuit schematic illustrating another analog current-input to current-output multiplier (iMULT) method.

Section 5E—Description of FIG. 5E

FIG. 5E is a simplified circuit schematic illustrating another analog current-input to current-output multiplier (iMULT) method.

The circuit of FIG. 5E utilizes NMOSFETs that operate in the subthreshold region, and as such their input-voltage to output-current transfer-function follows a pseudo-exponential profile.

The circuit of FIG. 5E is comprising of four subthreshold NMOSFETs that are $My_{5e}$, $Mx_{5e}$, $Mr_{5e}$, and $Mz_{5e}$ wherein each NMOSFET has a drain, gate, and source ports. Notice that $My_{5e}$, $Mx_{5e}$, $Mr_{5e}$, and $Mz_{5e}$ can be cascoded by an extra row of FETs to increase their current output impedances. The $Mr_{5e}$, and $Mx_{5e}$ are diode connected with their respective gate and drain ports coupled together. The source ports of $Mr_{5e}$, and $Mx_{5e}$ are coupled together and coupled to $M1_{5e}$'s drain port. The gate of $M1_{5e}$ is coupled to the gate-drain port of $Mr_{5e}$ and source of $M1_{5e}$ is connected to $V_{SS}$. The source ports of $Mz_{5e}$ and $My_{5e}$ are coupled together and coupled to drain port of $M2_{5e}$ and coupled to upper port of $I1_{5e}$, wherein lower port of $I1_{5e}$ is connected to $V_{SS}$. The $M2_{5e}$ gate is coupled with $Iy_{5e}$ input port, $M2_{5e}$ drain is coupled to source ports of $My_{5e}$ and $Mz_{5e}$, and $M2_{5e}$ source port is coupled to $V_{DD}$.

The $Mr_{5e}$'s gate-drain shorted port is supplied with a r-input reference currents ($Ir_{5e}$). The $Mx_{5e}$'s gate-drain port is supplied with a x-input current ($Ix_{5e}$). The $My_{5e}$'s drain port is supplied with a y-input current ($Iy_{5e}$). The $Mz_{5e}$'s drain port generates a z-output current ($Iz_{5e}$). The drain port of $My_{5e}$ (carrying $Iy_{5e}$) drives the gate of $M2_{5e}$ until $M2_{5e}$ regulates the net available current for $Mz_{5e}$ and $My_{5e}$ (at the source ports of $Mz_{5e}$ and $My_{5e}$ coupled with the drain port of $M2_{5e}$) so that the difference between the $v_{GS}$s of $Mx_{5e}$ and $Mz_{5e}$ is substantially equalized with the difference between $v_{GS}$s of $My_{5e}$ and $Mz_{5e}$, wherein $My_{5e}$, operates at the current $Iy_{5e}$. Be mindful that $I1_{5e}$ must have enough current to support the sum of full scale of $Iz_{5e}$ and $Iy_{5e}$ currents. Also, keep in mind that $M2_{5e}$ functions as a simple amplifier that regulates $I1_{5e}$. As such, a functional circuit diagram (describing the role of $M2_{5e}$ and $I1_{5e}$) can be illustrated as an amplifier whose output regulates the gate port of a FET that functions as $I1_{5e}$, wherein the inputs of the amplifier are coupled with the drain port of $My_{5e}$ and an objective DC bias voltage.

For the loop comprising of $Mz_{5e}$, $Mx_{5e}$, $Mr_{5e}$, and $My_{5e}$ by the operation of the Kirchhoff Voltage Law (KVL):

$$v_{GS_{Mz_{5e}}} - v_{GS_{Mx_{5e}}} + v_{GS_{Mr_{5e}}} - v_{GS_{My_{5e}}} \approx 0 \text{ or}$$

$$v_{GS_{Mx_{5e}}} + v_{GS_{My_{5e}}} \approx v_{GS_{Mz_{5e}}} + v_{GS_{Mr_{5e}}}.$$

Therefore, $n \times V_t \times \ln(Ix_{5e} \times Iy_{5e}) \approx n \times V_t \times \ln(Iz_{5e} \times Ir_{5e})$, and $Iz_{5e} \approx (Ix_{5e} \times Iy_{5e})/Ir_{5e}$ which is the current output representation of the analog iMULT as a function of its input currents and reference current.

In addition to the analog iMULT benefits outlined in this disclosure's introduction section titled DETAILED DESCRIPTION, the disclosed iMULT illustrated in FIG. 5E has the following benefits:

First, operating the CMOSFETs in subthreshold enables the disclosed analog iMULT circuit to operate with ultra-low currents, even lower power supplies, and ultra-low power consumption suitable for mobile applications, especially in AI & ML applications at or near edge or sensors that run on battery and may require numerous ultra-low current and low voltage supply analog iMULT circuits for computation.

Second, excluding the cascaded FETs, a total of 7 FET counts is used in the disclosed analog iMULT circuits, which is small and low cost.

Third, the disclosed analog iMULT circuit is arranged in a symmetric, matched, and scaled manner. This trait facilitates devices parameters to track each other over process, temperature, and operating condition variations. Accordingly, the disclosed analog iMULT. circuit's temperature coefficient and power supply rejection performance can be enhanced.

Fourth, all inputs and the output currents of the disclosed analog iMULT are supplied from the same power supply, which can be beneficial for end-applications that require such an arrangement.

Fifth, NMSOFETs have higher transconductance and can be sized smaller and they can be arranged on top of $V_{SS}$ that can be the same as the ground potential (that is generally kept quite), which can be beneficial for end-applications that require such an arrangement.

Sixth, the disclosed analog iMULT has improved dynamic and static performance around near-zero input and output currents.

Figure 5F:
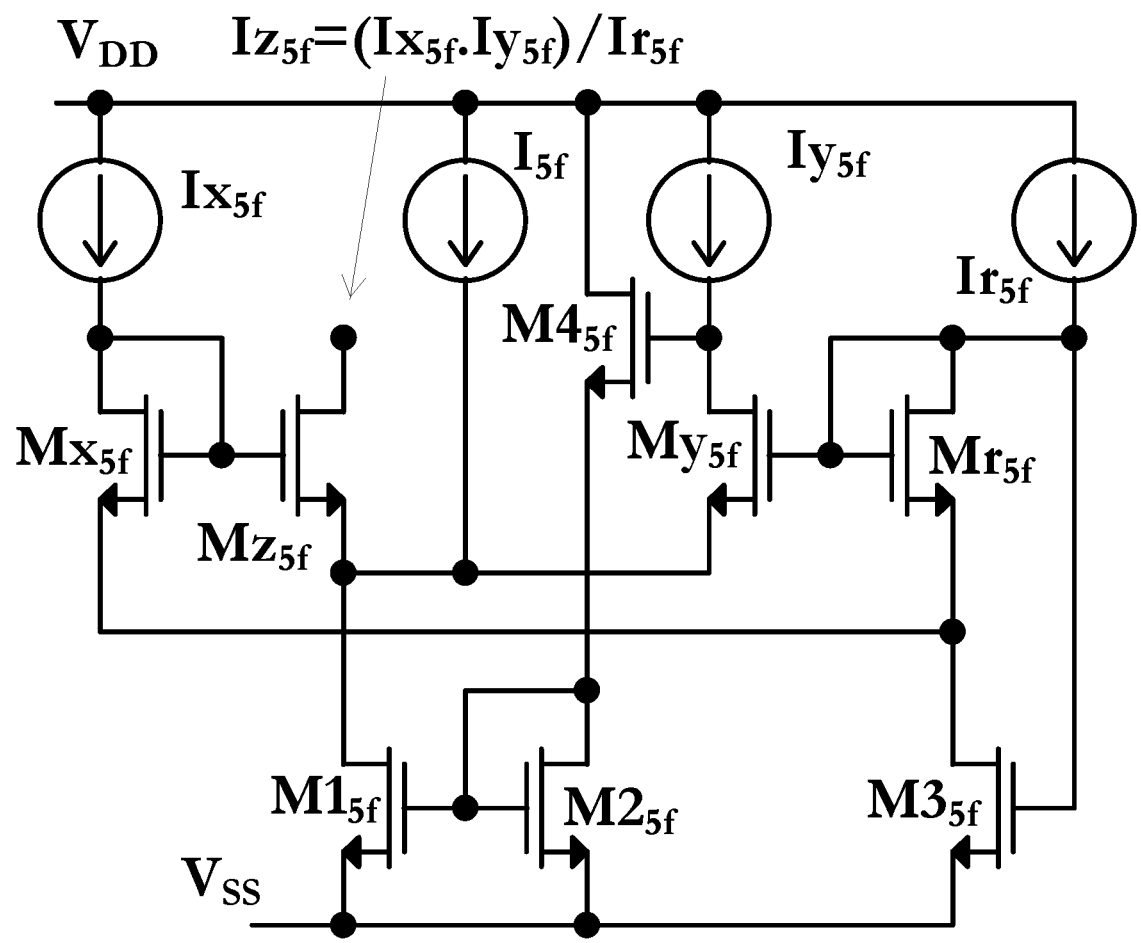
FIG. 5F is a simplified circuit schematic illustrating another analog current-input to current-output multiplier (iMULT) method.

Section 5F—Description of FIG. 5F

FIG. 5F is a simplified circuit schematic illustrating another analog current-input to current-output multiplier (iMULT) method.

The circuit of FIG. 5F utilizes NMOSFETs that operate in the subthreshold region, and as such their input-voltage to output-current transfer-function follows a pseudo-exponential profile.

The circuit of FIG. 5F is comprising of four subthreshold NMOSFETs that are $My_{5f}$, $Mx_{5f}$, $Mr_{5f}$, and $Mz_{5f}$ wherein each NMOSFET has a drain, gate, and source ports. Notice that $My_{5f}$, $Mx_{5f}$, $Mr_{5f}$, and $Mz_{5f}$ can be cascoded by an extra row of FETs to increase their current output impedances. The $Mr_{5f}$, and $Mx_{5f}$ are diode connected with their respective gate and drain ports coupled together. The source ports of $Mr_{5f}$, and $Mx_{5f}$ are coupled together and coupled to $M3_{5f}$'s drain port. The gate of $M3_{5f}$ is coupled to the gate-drain port of $Mr_{5f}$ and source of $M3_{5f}$ is connected to $V_{SS}$. The source ports of $Mz_{5f}$ and $My_{5f}$ are coupled together and coupled to drain port of $M1_{5f}$. The gate port of $M1_{5f}$ is coupled with gate-drain port of diode connected $M2_{5f}$. Source ports of $M1_{5f}$ and $M1_{5f}$ are coupled to $V_{SS}$. The gate-drain port of diode connected $M2_{5f}$ is coupled with source port of $M4_{5f}$. The gate port of $M4_{5f}$ is coupled to the drain port of $M5_{5f}$ where $Iy_{5f}$ is inputted. The gate port of $M4_{5f}$ is coupled to $V_{DD}$. Also, note that utilizing $I_{5f}$ is optional, which can operate at substantially lower currents (than, for example, the $Ir_{5f}$ level) to keep the disclosed analog iMULT more on close to zero-scale current.

The $Mr_{5f}$'s gate-drain port is supplied with a r-input reference currents ($Ir_{5f}$). The $Mx_{5f}$'s gate-drain port is supplied with a x-input current ($Ix_{5f}$). The $My_{5e}$'s drain port is supplied with a y-input current ($Iy_{5f}$). The $Mz_{5f}$'s drain port generates a z-output current ($Iz_{5f}$). The drain port of $My_{5f}$ (carrying $Iy_{5f}$) drives the gate of $M4_{5f}$ which regulates the current through $M2_{5f}$ whose current is mirrored onto $M1_{5f}$ which regulates the net available current for $Mz_{5f}$ and $My_{5f}$ (at the source ports of $Mz_{5f}$ and $My_{5f}$) so that the difference between the $v_{GS}$s of $Mx_{5f}$ and $Mz_{5f}$ is substantially equalized with the difference between $v_{GS}$s of $My_{5f}$ and $Mz_{5f}$, wherein $My_{5f}$ operates at the current $Iy_{5f}$. Be mindful that $I1_{5f}$ must have enough current to support the sum of full scale of $Iz_{5f}$ and $Iy_{5f}$ currents.

For the loop comprising of $Mz_{5f}$, $Mx_{5f}$, $Mr_{5f}$, and $My_{5f}$ by the operation of the Kirchhoff Voltage Law (KVL):

$$v_{GS_{M_{z_{5f}}}} - v_{GS_{M_{x_{5f}}}} + v_{GS_{M_{r_{5f}}}} - v_{GS_{M_{y_{5f}}}} \approx 0 \text{ or}$$

$$v_{GS_{M_{x_{5f}}}} + v_{GS_{M_{y_{5f}}}} \approx v_{GS_{M_{z_{5f}}}} + v_{GS_{M_{r_{5f}}}}.$$

Therefore, $n \times V_t \times \ln(Ix_{5f} \times Iy_{5f})$ $n \times V_t \times \ln(Iz_{5f} \times Ir_{5f})$, and $Iz_{5e} \approx (Ix_{5f} \times Iy_{5f})/Ir_{5f}$ which is the current output representation of the analog iMULT as a function of its input currents and reference current.

In addition to the analog iMULT benefits outlined in this disclosure's introduction section titled DETAILED DESCRIPTION, the disclosed iMULT illustrated in FIG. 5F has the following benefits:

First, operating the CMOSFETs in subthreshold enables the disclosed analog iMULT circuit to operate with ultra-low currents, even lower power supplies, and ultra-low power consumption suitable for mobile applications, especially in AI & ML applications at or near the edge or sensors that run on battery and may require numerous ultra-low current and low voltage supply analog iMULT circuits for computation.

Second, excluding the cascaded FETs, a total of 8 FET counts is used in the disclosed analog iMULT circuits, which is small and low cost.

Third, the disclosed analog iMULT circuit is arranged in a symmetric, matched, and scaled manner. This trait facilitates devices parameters to track each other over process, temperature, and operating condition variations. Accordingly, the disclosed analog iMULT. circuit's temperature coefficient and power supply rejection performance can be enhanced.

Fourth, all inputs and the output currents of the disclosed analog iMULT are supplied from the same power supply, which can be beneficial for end-applications that require such an arrangement.

Fifth, NMSOFETs have higher transconductance and can be sized smaller and they can be arranged on top of $V_{SS}$ that can be the same as the ground potential (that is generally kept quite), which can be beneficial for end-applications that require such an arrangement.

Figure 5G:
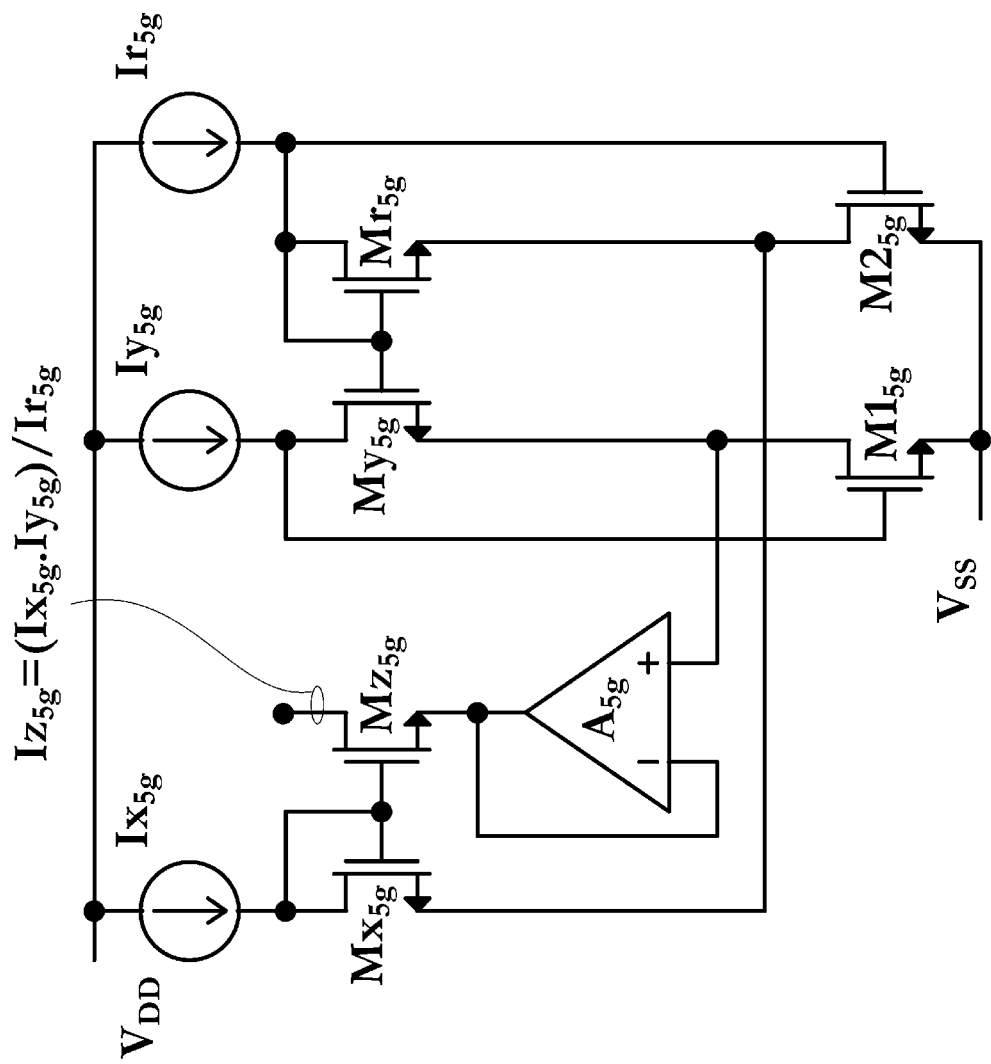
FIG. 5G is a simplified circuit schematic illustrating another analog current-input to current-output multiplier (iMULT) method.

Section 5G—Description of FIG. 5G

FIG. 5G is a simplified circuit schematic illustrating another analog current-input to current-output multiplier (iMULT) method.

The circuit of FIG. 5G utilizes NMOSFETs that operate in the subthreshold region, and as such their input-voltage to output-current transfer-function follows a pseudo-exponential profile.

The circuit of FIG. 5G is comprising of four subthreshold NMOSFETs that are $My_{5g}$, $Mx_{5g}$, $Mr_{5g}$, and $Mz_{5g}$ wherein each NMOSFET has a drain, gate, and source ports. Notice that $My_{5g}$, $Mx_{5g}$, $Mr_{5g}$, and $Mz_{5g}$ can be cascoded by an extra row of FETs to increase their current output impedances. The $Mr_{5g}$, and $Mx_{5g}$ are diode connected with their respective gate and drain ports coupled together. The source ports of $Mr_{5g}$, and $Mx_{5g}$ are coupled together and coupled to $M2_{5g}$'s drain port. The gate of $M2_{5g}$ is coupled to the gate-drain port of $Mr_{5g}$. The source ports of $Mz_{5g}$ is coupled to a buffer output port (i.e., the buffer is a unity gain amplifier $A_{5g}$). The $My_{5g}$'s source port is coupled to drain port of $M1_{5g}$. The $My_{5g}$'s drain port is coupled to the gate port of $M1_{5g}$. Also, the $My_{5g}$'s source port is coupled to the input of the buffer (non-inverting input of amplifier $A_{5g}$). The source ports of $M1_{5g}$ and $M2_{5g}$ are coupled to $V_{SS}$.

The $Mr_{5g}$'s gate-drain port is supplied with a r-input reference currents ($Ir_{5g}$). The $Mx_{5g}$'s gate-drain port is supplied with a x-input current ($Ix_{5g}$). The $My_{5g}$'s drain port is supplied with a y-input current ($Iy_{5g}$). The $Mz_{5g}$'s drain port generates a z-output current ($I2_{5g}$). The drain port of $My_{5g}$ (carrying $Iy_{5g}$) drives the gate of $M1_{5g}$ until $M1_{5g}$ equalizes the drain and source currents of $My_{5g}$ to run at $Iy_{5g}$. The unity gain amplifier $A_{59}$ substantially equalizes the source port voltages of $My_{5g}$ and $Mz_{5g}$. As such, the difference between the $v_{GS}$s of $Mx_{5g}$ and $Mz_{5g}$ is substantially equalized with the difference between $v_{GS}$s of $My_{5g}$ and $Mz_{5g}$, wherein $My_{5g}$ operates at the current $Iy_{5g}$.

For the loop comprising of $Mz_{5g}$, $Mx_{5g}$, $Mr_{5g}$, and $My_{5g}$ by the operation of the Kirchhoff Voltage Law (KVL):

$$v_{GS_{Mz_{5g}}} - v_{GS_{Mx_{5g}}} + v_{GS_{Mr_{5g}}} - v_{GS_{My_{5g}}} \approx 0 \text{ or}$$

$$v_{GS_{Mx_{5g}}} + v_{GS_{My_{5g}}} \approx v_{GS_{Mz_{5g}}} + v_{GS_{Mr_{5g}}}.$$

Therefore, $n \times V_t \times \ln (Ix_{59} \times Iy_{59}) \approx n \times V_t \times \ln (Iz_{5g} \times Ir_{5g})$, and $Iz_{5g} \approx (Ix_{5g} \times Iy_{5g})/Ir_{59}$ which is the current output representation of the analog iMULT as a function of its input currents and reference current.

In addition to the analog iMULT benefits outlined in this disclosure's introduction section titled DETAILED DESCRIPTION, the disclosed iMULT illustrated in FIG. 5G has the following benefits:

First, operating the CMOSFETs in subthreshold enables the disclosed analog iMULT circuit to operate with ultra-low currents, even lower power supplies, and ultra-low power consumption suitable for mobile applications, especially in AI & ML applications at or near the edge or sensors that run on battery and may require numerous ultra-low current and low voltage supply analog iMULT circuits for computation.

Second, excluding the cascaded FETs, a total of 7 FET counts is used in the disclosed analog iMULT circuits, which is small and low cost.

Third, the disclosed analog iMULT circuit is arranged in a symmetric, matched, and scaled manner. This trait facilitates devices parameters to track each other over process, temperature, and operating condition variations. Accordingly, the disclosed analog iMULT. circuit's temperature coefficient and power supply rejection performance can be enhanced.

Fourth, all inputs and the output currents of the disclosed analog iMULT are supplied from the same power supply, which can be beneficial for end-applications that require such an arrangement.

Fifth, NMSOFETs have higher transconductance and can be sized smaller and they can be arranged on top of $V_{SS}$ that can be the same as the ground potential (that is generally kept quite), which can be beneficial for end-applications that require such an arrangement.

Sixth, the disclosed analog iMULT has improved dynamic and static performance around near-zero input and output currents.

Figure 6A:
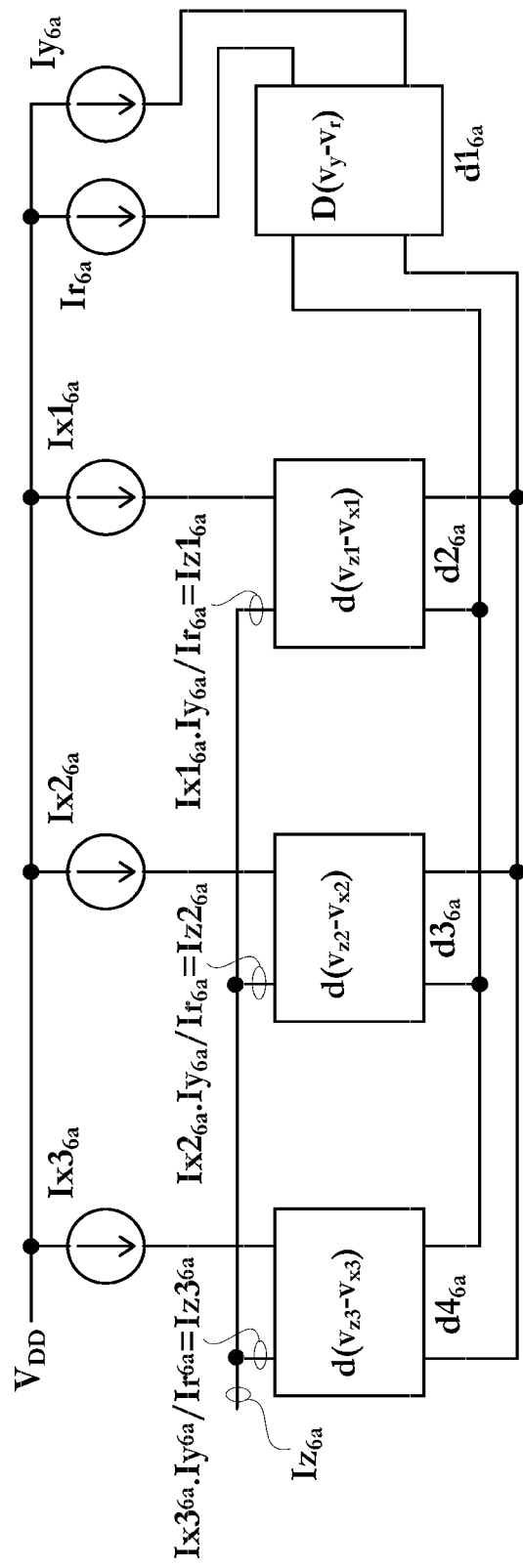
FIG. 6A is a simplified block diagram illustrating another analog current-mode scalar current-input to current-output multiply-accumulate (siMAC) method.

Section 6A—Description of FIG. 6A

FIG. 6A is a simplified block diagram illustrating another analog current-mode scalar current-input to current-output multiply-accumulate (siMAC) method.

The disclosed siMAC method illustrated in FIG. 6A receives a plurality of inputs (e.g., $Ix1_{6a}$, $Ix2_{6a}$, and $Ix3_{6a}$) which are multiplied by a scalar input (e.g., $Iy_{6a}$) and consequently a plurality of outputs $$\left( e.g., Iz1_{6a} = \frac{Ix1_{6a} \times Iy_{6a}}{Ir_{6a}}, Iz2_{6a} = \frac{Ix2_{6a} \times Iy_{6a}}{Ir_{6a}}, \text{ and } Iz3_{6a} = \frac{Ix3_{6a} \times Iy_{6a}}{Ir_{6a}} \right)$$

are generated, which are represented relative to a reference input (e.g., $Ir_{6a}$). Note that plurality is depicted as 3 channels in FIG. 6A for clarity of description and illustration, but there can be sea of channels and in the hundreds, depending on end-application requirements.

Here, a difference voltage between pairs of transistors is generated, wherein the input-voltage to output-current transfer function of the transistors follows an exponential profile, such as MOSFETs (that operate in the subthreshold region) or BJTs. For example in FIG. 6A, utilizing MOSFETs in subthreshold, a scalar current signal $Iy_{6a}$ and a reference current signal $Ir_{6a}$ are inputted to block 1 ($d1_{6a}$), which establishes a $vy_{6a}-vr_{6a}$, wherein $$vy_{6a} = v_{GS_{My_{6a}}}$$

and $$vr_{6a} = v_{GS_{Mr_{6a}}}.$$

As such, $$vy_{6a} - vr_{6a} \approx n \times V_t \times \ln\left[\frac{Iy_{6a}}{Ir_{6a}}\right].$$

Concurrently, the $vy_{6a}$ $vr_{6a}$ voltage signal (from $d1_{6a}$ block) is shared with a plurality of blocks (e.g., $d2_{6a}$, $d3_{6a}$, and $d4_{6a}$). A plurality of voltage loops (where the Kirchhoff Voltage Law or KVL), sharing the $vy_{6a}-vr_{6a}$ voltage signal, operates on $d2_{6a}$, $d3_{6a}$, and $d4_{6a}$ blocks, which would result in the following:

Here, block 2 ($d2_{6a}$) receives an input current signal $Ix1_{6a}$ and generates an output current signal $Iz1_{6a}$, and thereby generates a voltage signal $vz1_{6a}-vx1_{6a}$. By the operation of KVL for the loop (comprising of $vy_{6a}$, $vr_{6a}$, $vx1_{6a}$, $vz1_{6a}$) between blocks $d2_{6a}$ and $d1_{6a}$, the difference voltage signal $vz1_{6a}-vx1_{6a}$ is substantially equalized with the difference voltage signal $vy_{6a}-vr_{6a}$. Let's substitute $$vx1_{6a} = v_{GS_{Mx1_{6a}}}$$

and $$vz1_{6a} = v_{GS_{Mz1_{6a}}}.$$

As such, $$vz1_{6a} - vx1_{6a} \approx n \times V_t \times \ln\left[\frac{Iz1_{6a}}{Ix1_{6a}}\right]$$

is substantially equalized with $$vy_{6a} - vr_{6a} \approx n \times V_t \times \ln\left[\frac{Iy_{6a}}{Ir_{6a}}\right].$$

Hence, $$n \times V_t \times \ln\left[\frac{Iz1_{6a}}{Ix1_{6a}}\right] \approx n \times V_t \times \ln\left[\frac{Iy_{6a}}{Ir_{6a}}\right]$$

and thus the output of the first of plurality of siMAC is represented by $Iz1_{6a} \approx Ix1_{6a} \times Iy_{6a}/Ir_{6a}$.

Additionally, a block 3 ($d3_{6a}$) receives an input current signal $Ix2_{6a}$ and generates an output current signal $Iz2_{6a}$, and it establishes a voltage signal $vz2_{6a}-vx2_{6a}$. By the operation of KVL for the loop (comprising of $vy_{6a}$, $vr_{6a}$, $vx2_{6a}$, $vz2_{6a}$) between blocks $d3_{6a}$ and $d1_{6a}$, the difference voltage signal $vz2_{6a}-vx2_{6a}$ is substantially equalized with the difference voltage signal $vy_{6a}-vr_{6a}$. Again, let's substitute $$vx2_{6a} = v_{GS_{Mx2_{6a}}}$$

and $$vz2_{6a} = v_{GS_{Mz2_{6a}}}$$

As such, $$vz2_{6a} - vx2_{6a} \approx n \times V_t \times \ln\left[\frac{Iz2_{6a}}{Ix2_{6a}}\right]$$

is substantially equalized with $$vy_{6a} - vr_{6a} \approx n \times V_t \times \ln\left[\frac{Iy_{6a}}{Ir_{6a}}\right].$$

Hence, $$n \times V_t \times \ln\left[\frac{Iz2_{6a}}{Ix2_{6a}}\right] \approx n \times V_t \times \ln\left[\frac{Iy_{6a}}{Ir_{6a}}\right]$$

and thus the output of the second of plurality of siMAC is represented by $Iz2_{6a} \beta Ix2_{6a} \times Iy_{6a}/Ir_{6a}$.

Moreover and Similarly, block 4 ($d4_{6a}$) receives an input current signal $Ix3_{6a}$ and generates an output current signal $Iz3_{6a}$, and it generates a voltage signal $vz3_{6a}-vx3_{6a}$. By the operation of KVL for the loop (comprising of $vy_{6a}$, $vr_{6a}$, $vx3_{6a}$, $vz_{6a}$) between blocks $d4_{6a}$ and $d1_{6a}$, the difference voltage signal $vz3_{6a}-vx3_{6a}$ is substantially equalized with the difference voltage signal $vy_{6a}-vr_{6a}$. Again, let's substitute $$vx3_{6a} = v_{GS_{Mx3_{6a}}}$$

and $$vz3_{6a} = v_{GS_{Mz3_{6a}}}.$$

As such, $$vz3_{6a} - vx3_{6a} \approx n \times V_t \times \ln\left[\frac{Iz3_{6a}}{Ix3_{6a}}\right]$$

is substantially equalized with $$vy_{6a} - vr_{6a} \approx n \times V_t \times \ln\left[\frac{Iy_{6a}}{Ir_{6a}}\right].$$

Hence, $$n \times V_t \times \ln\left[\frac{Iz3_{6a}}{Ix3_{6a}}\right] \approx n \times V_t \times \ln\left[\frac{Iy_{6a}}{Ir_{6a}}\right]$$

and thus the output of the third of plurality of siMAC is represented by $Iz3_{6a} \approx Ix3_{6a} \times Iy_{6a}/Ir_{6a}$.

Summation (accumulation) in current mode simply requires coupling plurality of current outputs. As such, a scalar multiply-accumulate function can be performed, utilizing the disclosed siMAC method of FIG. 6A, by coupling a plurality of Iz outputs, wherein $Iz_{6a}=Iz1_{6a}+Iz2_{6a}+Iz3_{6a} \approx (IX1_{6a}+Ix2_{6a}+Ix3_{6a}) \times Iy_{6a}/Ir_{6a}$.

Naturally for end applications that require access to plurality of scaled individual Iz outputs, each individual and scaled Iz can be pinned-out independently. (e.g., in FIG. 6A: $Iz1_{6a} \approx Ix1_{6a} \times Iy_{6a}/Ir_{6a}$; $Iz2_{6a} \approx Ix2_{6a} \times Iy_{6a}/Ir_{6a}$; and $Iz1_{6a} \approx Ix1_{6a} \times Iy_{6a}/Ir_{6a}$).

Again, keep in mind that depending on end-application requirements, a substantially larger number of channels (than 3-channels illustrated in FIG. 6A) can be accommodated by utilizing the disclosed siMAC method of FIG. 6A, which will result in substantial die size saving, better matching between channels, lower noise, and lower power consumption saving. The benefits of the disclosed siMAC method, utilized in an embodiment circuit such as that of FIG. 6B illustration, is described in the next section.

Figure 6B:
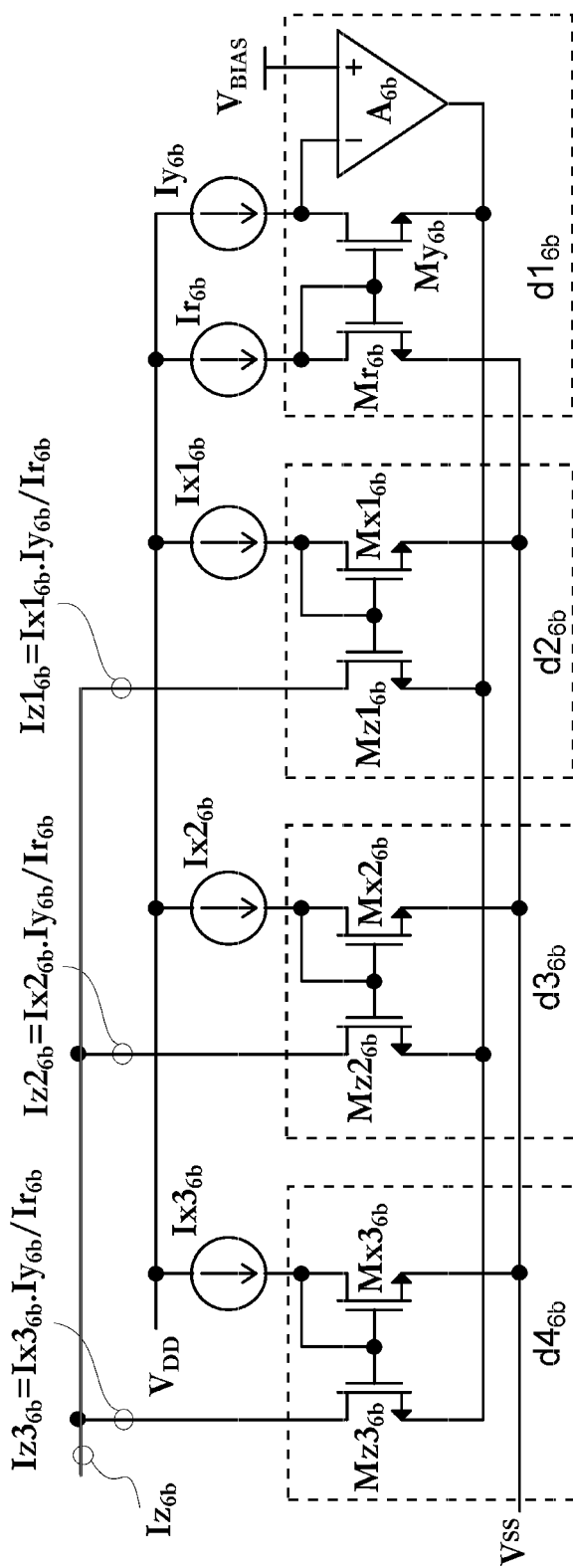
FIG. 6B is a simplified circuit schematic illustrating an analog current-mode scalar current-input to current-output multiply-accumulate (siMAC) circuit utilizing the siMAC method described and illustrated in section 6A and FIG. 6A, respectively.
Figure 6C:
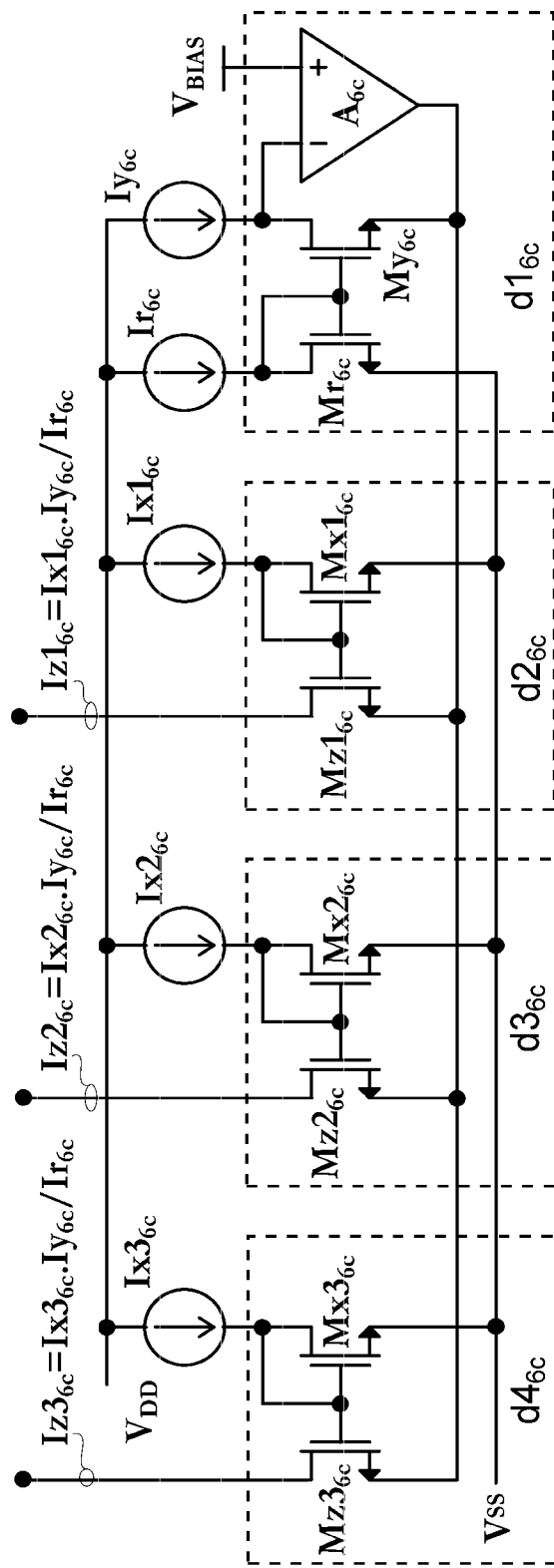
FIG. 6C is a simplified circuit schematic illustrating an analog current-mode scalar plural current-input to plural current-output multiplier (siMULT) circuit utilizing the siMAC method described and illustrated in section 6A and FIG. 6A, respectively.

Sections 6B & 6C— Descriptions of FIG. 6B & FIG. 6C

FIG. 6B is a simplified circuit schematic illustrating an analog current-mode scalar current-input to current-output multiply-accumulate (siMAC) circuit utilizing the siMAC method described and illustrated in 6A and FIG. 6A, respectively.

FIG. 6C is similar to FIG. 6B. FIG. 6C is a simplified circuit schematic illustrating an analog current-mode scalar plural current-input to plural current-output multiplier (siMULT) circuit utilizing the siMAC method described and illustrated in section 6A and FIG. 6A, respectively. In this section 6B, primarily FIG. 6B is described which is applicable to FIG. 6C as well.

The circuit of FIG. 6B utilizes NMOSFETs that operate in the subthreshold region, and as such their input-voltage to output-current transfer-function follows a pseudo-exponential profile.

Block $d1_{6b}$ is comprising of $My_{6b}$ and diode-connected $Mr_{6b}$ (with its gate and drain ports coupled together). The $Mr_{6b}$'s shorted gate-drain port is supplied with a r-input reference currents ($Ir_{6b}$). The $My_{6b}$'s drain port is supplied with a y-input current ($Iy_{6b}$). The $My_{6b}$'s drain port is also coupled with the inverting input of amplifier $A_{6b}$ whose non-inverting input is biased at $V_{BIAS}$ and $A_{6b}$'s output is coupled to $My_{6b}$'s source port. Accordingly, a difference voltage between the source ports of $My_{6b}$ and $Mr_{6b}$ is made available by block $d1_{6b}$, wherein this difference voltage is shown as $vy_{6b}-vr_{6b}$ with $$vy_{6b} = v_{GS_{My_{6b}}}$$

and $$vr_{6b} = v_{GS_{Mr_{6b}}}.$$

Thus, $$vy_{6b} - vr_{6b} \approx n \times V_r \times \ln\left[\frac{Iy_{6b}}{Ir_{6b}}\right],$$

which is available to plurality of (channels) blocks such as $d2_{6b}$, $d3_{6b}$, and $d4_{6b}$.

Block $d2_{6b}$ is comprising of diode-connected $Mx1_{6b}$ (with its gate and drain ports coupled together) and $Mz1_{6b}$. The $Mx1_{6b}$'s gate-drain port is supplied with a x1-input current ($Ix1_{6b}$). The $Mz1_{6b}$'s drain port generates a z1-input current ($Iz1_{6b}$). Accordingly, a difference voltage between the source ports of $Mz1_{6b}$ and $Mx1_{6b}$ in block $d1_{6b}$, can be shown as $vz1_{6b} - vx1_{6b}$ with $$vz1_{6b} = v_{GS_{Mz1_{6b}}}$$

and $$vx1_{6b} = v_{GS_{Mx1_{6b}}}.$$

Thus, $$vz1_{6b} - vx1_{6b} \approx n \times V_t \times \ln\left[\frac{Iz1_{6b}}{Ix1_{6b}}\right],$$

which can be substantially equalized to $$vy_{6b} - vr_{6b} \approx n \times V_t \times \ln\left[\frac{Iy_{6b}}{Ir_{6b}}\right]$$

as follows: The output of $A_{6b}$ provides enough current for source ports of $Mz1_{6b}$ and $My_{6b}$ to substantially equalize its inputs (wherein the drain port $My_{6b}$ gets biased at $V_{BIAS}$ while $My_{6b}$ receives $Iy_{6b}$). Concurrently, the difference between the $v_{GS}$ of $Mz1_{6b}$ and $Mx1_{6b}$ is substantially equalized with the difference between $v_{GS}$ of $My_{6b}$ and $Mr_{6b}$ for the following reason: In blocks $d1_{6b}$ and $d2_{6b}$, by the operation of the Kirchhoff Voltage Law (KVL) on the voltage loop comprising of $Mz1_{6b}$, $Mx1_{6b}$, $Mr_{6b}$, and $My_{6b}$, the following relationship must holds:

$$v_{GS_{Mz1_{6b}}} - v_{GS_{Mx1_{6b}}} + v_{GS_{Mr_{6b}}} - v_{GS_{My_{6b}}} \approx 0 \text{ or}$$

$$v_{GS_{Mx1_{6b}}} + v_{GS_{My_{6b}}} \approx v_{GS_{Mz1_{6b}}} + v_{GS_{Mr_{6b}}}.$$

Therefore, $n \times V_t \times \ln(Ix1_{6b} \times Iy_{6b}) \approx n \times V_t \times \ln(Iz1_{6b} \times Ir_{6b})$, and $Iz1_{6b} \approx (Ix1_{6b} \times Iy_{6b})/Ir_{6b}$ which is the current output representation of the first analog current output in siMAC, that is a function of its input currents and a reference current.

Block $d3_{6b}$ is comprising of diode-connected $Mx2_{6b}$ (with its gate and drain ports coupled together) and $Mz2_{6b}$. The $Mx2_{6b}$'s gate-drain port is supplied with a x2-input currents ($Ix2_{6b}$). The $Mz2_{6b}$'s drain port generates a z2-input current ($Iz2_{6b}$).

Similarly, the output of $A_{6b}$ in block $d1_{6b}$ provides enough current for source ports of $Mz2_{6b}$ and $My_{6b}$ to equalize its inputs (wherein the drain port $My_{6b}$ gets biased at $V_{BIAS}$ while $My_{6b}$ receives $Iy_{6b}$). Concurrently, the difference between the $v_{GS}$ of $Mz2_{6b}$ and $Mx2_{6b}$ is substantially equalized with the difference between $v_{GS}$ of $My_{6b}$ and $Mr_{6b}$ for the following reason: In blocks $d1_{6b}$ and $d3_{6b}$, by the operation of the Kirchhoff Voltage Law (KVL) on the voltage loop comprising of $Mz2_{6b}$, $Mx2_{6b}$, $Mr_{6b}$, and $My_{6b}$, the following relationship must holds:

$$v_{GS_{Mz2_{6b}}} - v_{GS_{Mx2_{6b}}} + v_{GS_{Mr_{6b}}} - v_{GS_{My_{6b}}} \approx 0 \text{ or}$$

$$v_{GS_{Mx2_{6b}}} + v_{GS_{My_{6b}}} \approx v_{GS_{Mz2_{6b}}} + v_{GS_{Mr_{6b}}}.$$

Therefore, $n \times V_t \times \ln(Ix2_{6b} \times Iy_{6b}) \approx n \times V_t \times \ln(I2_{6b} \times Ir_{6b})$, and $Iz2_{6b} \approx (Ix2_{6b} \times Iy_{6b})/Ir_{6b}$ which is the current output representation of the second analog current output in siMAC, that is a function of its input currents and a reference current.

Block $d4_{6b}$ is comprising of diode-connected $Mx3_{6b}$ (with its gate and drain ports coupled together) and $Mz3_{6b}$. The $Mx3_{6b}$'s gate-drain port is supplied with a x3-input currents ($Ix3_{6b}$). The $Mz3_{6b}$'s drain port generates a z3-input current ($Iz3_{6b}$).

Likewise, the output of $A_{6b}$ in block $d1_{6b}$ provides enough current for source ports of $Mz3_{6b}$ and $My_{6b}$ to equalize its inputs (wherein the drain port $My_{6b}$ gets biased at $V_{BIAS}$ while $My_{6b}$ receives $Iy_{6b}$). Concurrently, the difference between the $v_{GS}$ of $Mz3_{6b}$ and $Mx3_{6b}$ is substantially equalized with the difference between $v_{GS}$ of $My_{6b}$ and $Mr_{6b}$ for the following reason: In blocks $d1_{6b}$ and $d4_{6b}$, by the operation of the Kirchhoff Voltage Law (KVL) on the voltage loop comprising of $Mz3_{6b}$, $Mx3_{6b}$, $Mr_{6b}$, and $My_{6b}$, the following relationship must holds:

$$v_{GS_{Mz3_{6b}}} - v_{GS_{Mx3_{6b}}} + v_{GS_{Mr_{6b}}} - v_{GS_{My_{6b}}} \approx 0 \text{ or}$$

$$v_{GS_{Mx3_{6b}}} + v_{GS_{My_{6b}}} \approx v_{GS_{Mz3_{6b}}} + v_{GS_{Mr_{6b}}}.$$

Therefore, $n \times V_t \times \ln(Ix3_{6b} \times Iy_{6b}) \approx n \times V_t \times \ln(Iz3_{6b} \times Ir_{6b})$, and $Iz3_{6b} \approx (Ix3_{6b} \times Iy_{6b})/Ir_{6b}$ which is the current output representation of the third analog current output in siMAC, that is a function of its input currents and a reference current.

As stated earlier, summation (accumulation) in current mode simply requires coupling plurality of outputs. As such, a scalar multiply-accumulate function can be performed, by disclosed siMAC method of FIG. 6B, by coupling a plurality of Iz outputs, wherein $Iz_{6b} = Iz1_{6b} + Iz2_{6b}$ $Iz3_{6b} \approx (Ix1_{6b} + Ix2_{6b} + Ix3_{6b}) \times Iy_{6b}/Ir_{6b}$.

For end applications that require access to plurality of individual Iz outputs, each individual Iz can be pinned-out independently. (illustration of siMULT in FIG. 6C: $Iz1_{6b} \approx Ix1_{6b} \times Iy_{6b}/Ir_{6b}$; $Iz2_{6b} \approx Ix2_{6b} \times Iy_{6b}/Ir_{6b}$; and $Iz1_{6b} \approx Ix1_{6b} \times Iy_{6b}/Ir_{6b}$)

In addition to the analog siMAC benefits outlined in this disclosure's introduction section titled DETAILED DESCRIPTION, the disclosed analog siMACs illustrated in FIG. 6B and FIG. 6C have the following benefits:

First, sharing the circuit for two inputs amongst plurality of multiplication channels, save meaningful amount of area. In effect, for every additional multiplier utilized in the siMAC (excluding any cascaded FETs), it would take an additional 2 FETs per multiplier which is small and low cost.

Second, sharing the circuit for two inputs amongst plurality of multiplication channels, save on current consumption. In effect, for every additional multiplier utilized in the siMAC (excluding any cascaded FETs), it would consume an additional current consumption attributed to 2 FETs, which can be low currents, especially considering operating the FETs in the subthreshold region.

Third, by sharing the same circuit for two of the inputs that is shared amongst plurality of multiplications, it would improve the multiplication matching between channels and lowers noise.

Fourth, operating in subthreshold enables the disclosed circuits to operate with ultra-low currents, even lower power supplies, and ultra-low power consumption suitable for mobile applications, especially in AI & ML applications at or near the edge or sensors that run on battery and may require numerous ultra-low current and low voltage supply signal conditioning circuits for computation.

Fifth, the disclosed analog siMAC circuit is arranged in a symmetric, matched, and scaled manner. This trait facilitates devices parameters to track each other over process, temperature, and operating condition variations. Accordingly, the disclosed analog siMAC circuit's temperature coefficient and power supply rejection performance can be enhanced.

Sixth, the disclosed analog siMAC circuit utilizes simple, low cost, and fast summation of the analog iMULT output currents, wherein summation of plurality of analog currents is accomplished by coupling of the analog iMULT output currents.

Seventh, utilizing plurality of analog currents that are summed at the output of siMAC would attenuate the statistical contribution of such cumulative analog random errors (such as random noise, offset, mismatches, linearity, gain, drift, etc.) at the summing node where plurality of analog iMULT's output currents are coupled. The statistical contribution of such cumulative analog output random errors, at the summing node, is the square root of the sum of the squares of such random error terms.

Eighth, all inputs and the output currents of the disclosed analog siMAC are supplied from the same power supply, which can be beneficial for end-applications that require such an arrangement.

Ninth, the embodiment of FIG. 6B utilizes only NMSOFET for the multiplication function. NMOSFETs have higher transconductance and can be sized smaller and they can be arranged on top of $V_{SS}$ that can be the same as the ground potential (that is generally kept quite), which can be beneficial for end-applications that require such an arrangement. It would be obvious to one skilled in the art to utilize a complementary PMOSFET version of the embodiment of FIG. 6B.

Tenth, the NMOSFETs utilized in the plurality of multipliers can be cascaded with a row of plurality of FETs to increase current source output impedance and improve the multiplication performance. (e.g., power supply rejection)

Eleventh, in illustration of FIG. 6B, the amplifier $A_{6b}$ can be just a single NMOSFET with its source port coupled to $V_{SS}$, gate port couple to the drain port of $My_{6b}$, and drain port coupled to source ports of $Mz3_{6b}$, $Mz2_{6b}$, $Mz1_{6b}$, and $My_{6b}$. As such, the size of the disclosed analog siMAC can be reduced further.

Twelfth, all the NMOSFETs, utilized in the disclosed analog siMAC, can have their body ports coupled with $V_{SS}$. A such, all the NMOSFETs can be placed on the same substrate or p-well (depending on the digital CMOS manufacturing process) which reduces chip area and lowers chip cost further.

Thirteenth, all the current inputs of the disclosed analog siMAC can be supplied via current-mode digital-to-analog-converters (iDAC)s, and the current-mode output(s) can be fed onto current-mode analog-to-digital-converters (iADC)s. This flexibility enables interfacing the disclosed analog siMAC with digital-signal processing and facilitate hybrid (analog plus digital) computation for some AI & ML applications.

Fourteenth, analog iMULT here can operate at higher speeds because they operate in current-mode, which is inherently fast.

Fifteenth, current signal processing, that occurs within the nodes of analog iMULT and analog iMAC circuits in current mode, have small voltage swings (while retaining their speed and dynamic range benefits) which also enables operating the current-mode with lower power supply voltages.

Sixteenth, the power supply voltage here can be as low as $V_{GS}$, $V_{DS}$ which also reduces power consumption.

Seventeenth, iMULT here can be arranged to generate non-linear outputs such as in square input-output transfer function or inverse input-output transfer functions. For example, by applying the same input to the two inputs of a multiplier, a square of the input can be generated at the output of the multiplier.

Eighteenth, the disclosed scalar analog iMULT circuit not requiring any capacitors nor any resistors, which reduces die size and die cost, and facilitates fabricating analog iMULT and analog iMAC circuits in standard digital CMOS manufacturing that is low cost, main-stream, readily available, suitable for high-volume mass production applications, and proven for being rugged and having high quality.

Nineteenth, the disclosed analog iMULT circuit are free of clock, suitable for asynchronous (clock free) computation. As such, there is no clock related noise on power supplies and there is no dynamic power consumption due to a digital logic.

Twentieth, while digital computation is generally accurate but it may be excessively power hungry. Current-mode analog and mixed-signal computation that is disclosed here leverage the trade off in analog signal processing between low power and analog accuracy in form of signal degradation, but not total failures. This trait can provide the AI & ML end-application with approximate results to work with instead of experiencing failed results.

Twenty first, utilizing plurality of analog inputs that are summed at an plurality of inputs or outputs of iMULTs (to arrange an analog siMAC) would attenuate the statistical contribution of such cumulative analog random errors (such as random noise, offset, mismatches, linearity, gain, drift, etc.) at the summing nodes where plurality of analog iMULT currents are coupled (which are generated via the iDACs). The statistical contribution of such cumulative analog random errors, at the summing node, is the square root of the sum of the squares of such random error terms.

Twenty second, voltage mode multiplier's full-scale input and output voltage signal swings are restricted by power supply voltage levels. However, so long as operational transistor headroom is complied with, the disclosed analog current-mode iMULT and siMAC input and output current signals can span between zero and full scale, generally independent of the power supply voltage level.

Twenty third, the all analog multiplier disclosed here enables memory-less computing. Asynchronous and clock free computation requires no memory, which eliminates the delay and dynamic power consumption associated with memory read-write cycles in digital signal processing.

What is claimed:

1. A multiplication (iMULT) method in an integrated circuit, the iMULT method comprising:
    operating four transistors x-T, r-T, y-T, and z-T, wherein each transistor is a substrate parasitic Bipolar Junction Transistor (T) available in a Complementary Metal Oxide Semiconductor (CMOS), wherein each of a plurality of the Ts has a collector, base, and emitter port, and wherein the T's collector port is a CMOS substrate coupled to a power supply;
    supplying the x-T's emitter port with a x-input current (Ix);
    supplying the r-T's emitter port with a r-input current (Ir);
    supplying the y-T's emitter port with a y-input current (Iy);
    generating a z-output current (Iz) through the z-T's emitter port;
    coupling together a voltage source ($V_1$), and the base ports of the x-T and r-T;
    coupling the base ports of the z-T and y-T together at a first node;
    regulating the first node voltage to substantially equalize the emitter port voltages of the r-T and the y-T; and
    regulating the Iz to substantially equalize the emitter port voltages of the x-T and z-T, wherein Iz is substantially equal to Ix×Iy/Ir.

2. The multiplication (iMULT) method in an integrated circuit of claim 1, the iMULT method further comprising:
    generating at least one of the Ix, Iy, and Ir utilizing at least one current-mode digital-to-analog-converter (iDAC).

3. A multiplication (iMULT) method in an integrated circuit, the iMULT method comprising:
    operating four transistors x-T, r-T, y-T, and z-T transistors, wherein each transistor is a substrate parasitic Bipolar Junction Transistor (T) available in a Complementary Metal Oxide Semiconductor (CMOS), wherein each of a plurality of the Ts has a collector, base, and emitter port, and wherein the T's collector port is a CMOS substrate coupled to a power supply;
    supplying the x-T's emitter port with a x-input current (Ix);
    supplying the r-T's emitter port with a r-input current (Ir);
    supplying the y-T's emitter port with a y-input current (Iy);
    generating a z-output current (Iz) through the z-T's emitter port;
    coupling together a voltage source ($V_1$), and the base ports of the y-T and r-T;
    regulating the base port of the x-T to substantially equalize the emitter port voltages of the r-T and x-T;
    regulating the base port voltage of the z-T to substantially equalize the emitter port voltages of the y-T and z-T; and
    regulating the Iz to substantially equalize the base port voltages of the x-T and z-T, wherein Iz is substantially equal to Ix×Iy/Ir.

4. The multiplication (iMULT) method in an integrated circuit of claim 3, the iMULT method further comprising:
    generating at least one of the Ix, Iy, and Ir utilizing at least one current-mode digital-to-analog-converter (iDAC).

5. A multiplication (iMULT) method in an integrated circuit, the iMULT method comprising:
    operating four transistors x-T, r-T, y-T, and z-T transistors, wherein each transistor is a substrate parasitic Bipolar Junction Transistor (T) available in a Complementary Metal Oxide Semiconductor (CMOS), wherein each of a plurality of the Ts has a collector, base, and emitter port, and wherein the T's collector port is a CMOS substrate coupled to a power supply;
    supplying the x-T's emitter port with a x-input current (Ix);
    supplying the r-T's emitter port with a r-input current (Ir);
    supplying the y-T's emitter port with a y-input current (Iy);
    generating a z-output current (Iz) through the z-T's emitter port;
    coupling together a voltage source ($V_1$) and the base ports of the x-T, y-T, r-T, and z-T;
    amplifying the voltage difference between the x-T and r-T emitter ports by a factor G to generate a differential output signal (xr);
    amplifying the voltage difference between the z-T and y-T emitter ports by a factor G1 to generate a differential output signal (yz), wherein the factor G1 is substantially equal to the factor G;
    summing the xr and yz differential output signals to generate a combined differential signal; and
    regulating the Iz to substantially balance the combined differential signal, wherein Iz is substantially equal to Ix×Iy/Ir.

6. The multiplication (iMULT) method in an integrated circuit of claim 5, the iMULT method further comprising:
    summing a plurality of input currents, wherein the plurality of input currents are coupled together at the emitter port of the x-T to generate the Ix.

7. The multiplication (iMULT) method in an integrated circuit of claim 6, the iMULT method further comprising:
    generating at least one of the plurality of input currents, Iy, and Ir, utilizing at least one current-mode digital-to-analog-converter (iDAC).

8. A multiplication (iMULT) method in an integrated circuit, the iMULT method comprising:
    operating four transistors x-T, r-T, y-T, and z-T transistors, wherein each transistor is a substrate parasitic Bipolar Junction Transistor (T) available in a Complementary Metal Oxide Semiconductor (CMOS), wherein each of a plurality of Ts has a collector, base, and emitter port, and wherein the T's collector port is a CMOS substrate coupled to a power supply;
    supplying the x-T's emitter port with a x-input current (Ix);
    supplying the r-T's emitter port with a r-input current (Ir);
    supplying the y-T's emitter port with a y-input current (Iy);
    generating a z-output current (Iz) through the z-T's emitter port;
    coupling a voltage source ($V_1$) to the base ports x-T, y-T, r-T, and z-T;
    amplifying the voltage difference between the x-T and z-T emitter ports by a factor G to generate an output signal (xz);
    amplifying the voltage difference between the y-T and r-T emitter ports by a factor G1 to generate an output signal (yr), wherein the factor G1 is substantially equal to the factor G; and regulating the Iz is to substantially balance the xz-gained signal to the yr-gained signal, wherein Iz is substantially equal to Ix×Iy/Ir.

9. The multiplication (iMULT) method in an integrated circuit of claim 8, the iMULT method further comprising:
  summing a plurality of input currents, wherein the plurality of input currents are coupled together at the emitter of x-T to generate the Ix.

10. The multiplication iMULT method in an integrated circuit of claim 9, the iMULT method further comprising:
  generating at least one of the plurality of input currents, Iy, and Ir, utilizing at least one current-mode digital-to-analog-converter (iDAC).

* * * * *